United States Patent [19]

Kawana et al.

[11] Patent Number: 5,891,509
[45] Date of Patent: *Apr. 6, 1999

[54] METHOD OF APPLYING A COATING MATERIAL TO A PLATE WITH CONVEYING ROLLERS CLAMPING SIDE EDGES OF THE PLATE

[75] Inventors: Eishiro Kawana, Kawasaki; Hitoshi Usuda; Kenji Mimura, both of Tokyo, all of Japan

[73] Assignees: Fujitsu Limited, Kawasaki; Almex Inc., Tokyo, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 905,714

[22] Filed: Aug. 4, 1997

Related U.S. Application Data

[63] Continuation of Ser. No. 552,258, Nov. 2, 1995, abandoned.

[30] Foreign Application Priority Data

Mar. 13, 1995 [JP] Japan ..................... 7-052941
Sep. 6, 1995 [JP] Japan ..................... 7-229422

[51] Int. Cl.⁶ ............................................ B05D 1/28
[52] U.S. Cl. .................. 427/10; 427/9; 427/210; 427/211; 118/211; 118/227
[58] Field of Search ............... 427/9, 211, 210, 427/96, 428, 287, 286, 10; 118/211, 227, 226, 228, 249, 250; 198/624; 271/272, 274

[56] References Cited

U.S. PATENT DOCUMENTS

| | | | |
|---|---|---|---|
| 4,493,857 | 1/1985 | Knigge et al. | 427/96 |
| 4,957,770 | 9/1990 | Howarth | 427/9 |
| 5,409,733 | 4/1995 | Boger et al. | 427/420 |
| 5,516,545 | 5/1996 | Sandock | 427/420 |

FOREIGN PATENT DOCUMENTS

| | | | |
|---|---|---|---|
| 3816614 A1 | 11/1989 | Germany . | |
| 53-75466 | 7/1978 | Japan . | |
| 60-48811 | 3/1985 | Japan . | |
| 63-154504 | 6/1988 | Japan | 198/624 |
| 4-80989 | 3/1992 | Japan . | |
| 4-206678 | 7/1992 | Japan . | |
| 5-40855 | 2/1993 | Japan . | |
| 5-55633 | 3/1993 | Japan . | |
| 5-75234 | 3/1993 | Japan . | |
| 6-211328 | 8/1994 | Japan . | |

Primary Examiner—Katherine A. Bareford
Attorney, Agent, or Firm—Armstrong, Westerman, Hattori, McLeland & Naughton

[57] ABSTRACT

A method of applying a coating material to two surfaces of a plate includes the steps of applying the coating material to the two surfaces simultaneously such that holding areas in the absence of the coating material are provided on the two surfaces in proximity of side ends of the plate with respect to a travel direction of the plate, and conveying the plate by holding the holding areas.

3 Claims, 43 Drawing Sheets

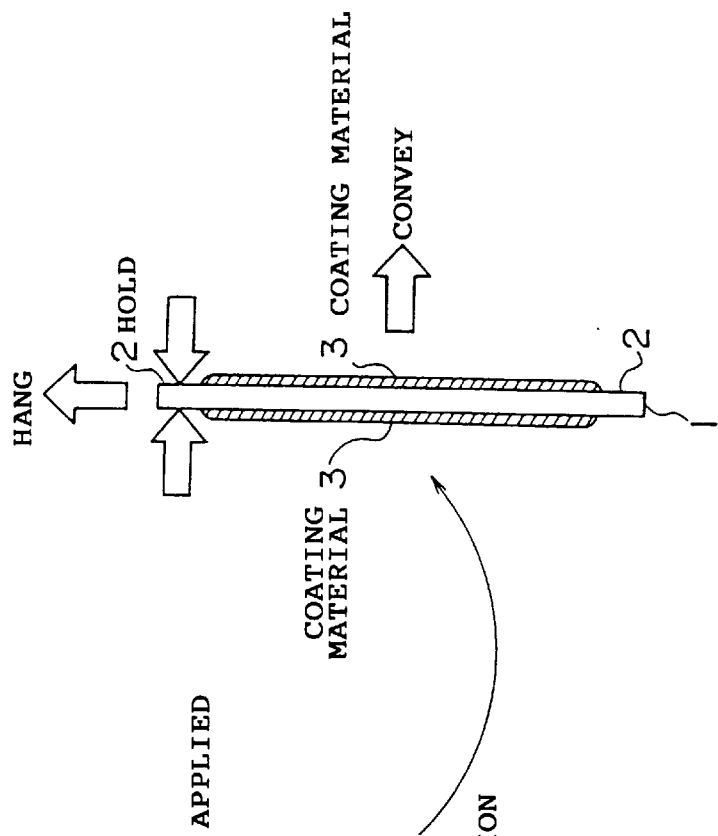
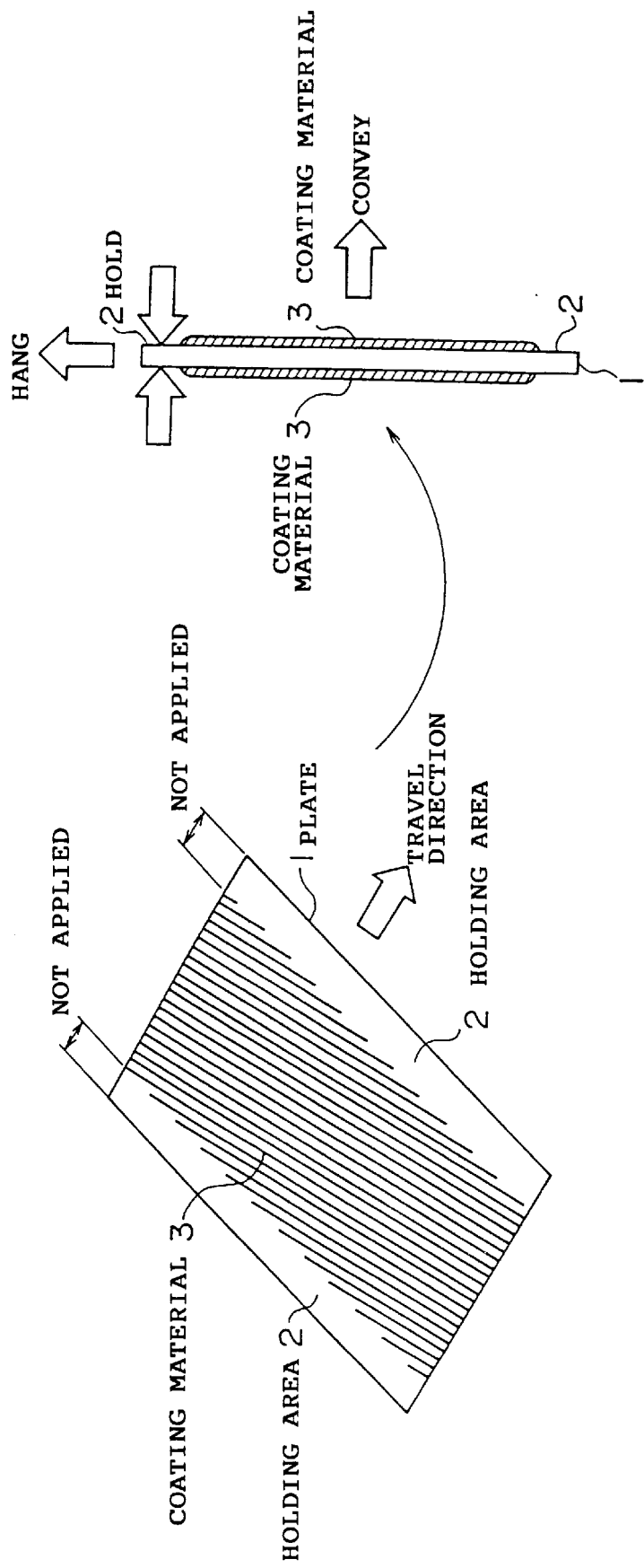

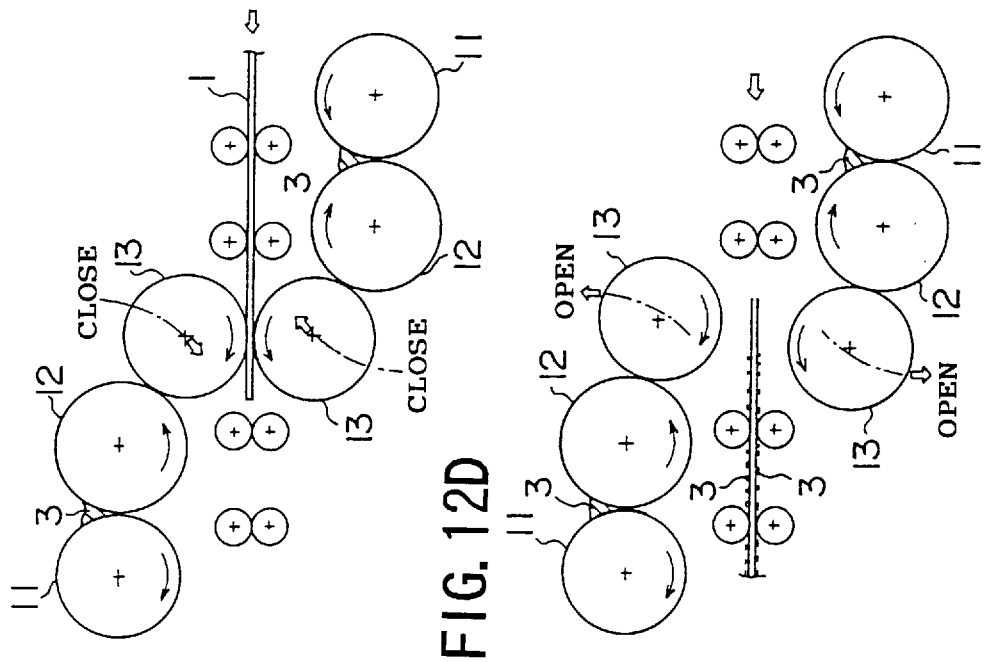
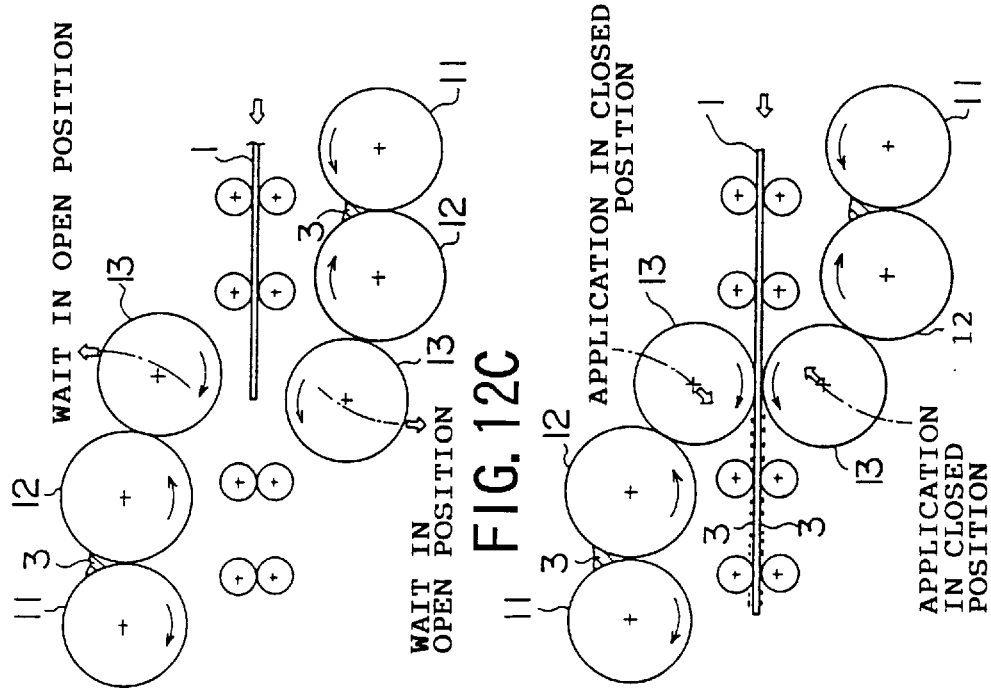

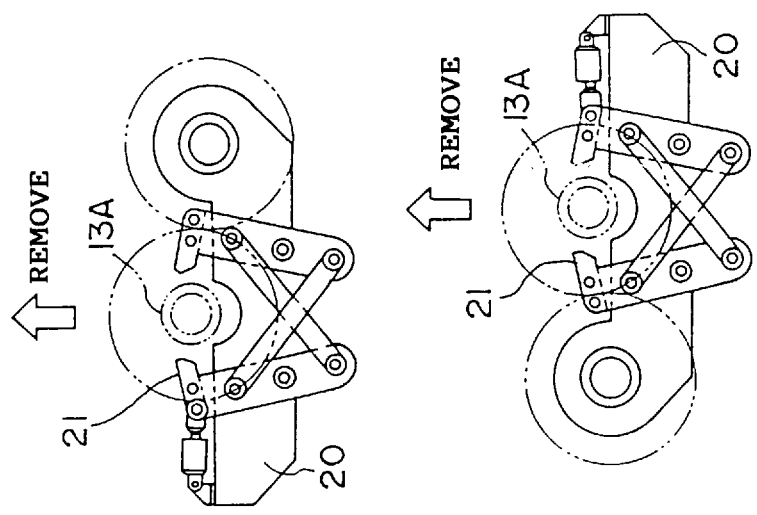
FIG. 14C  FIG. 14B
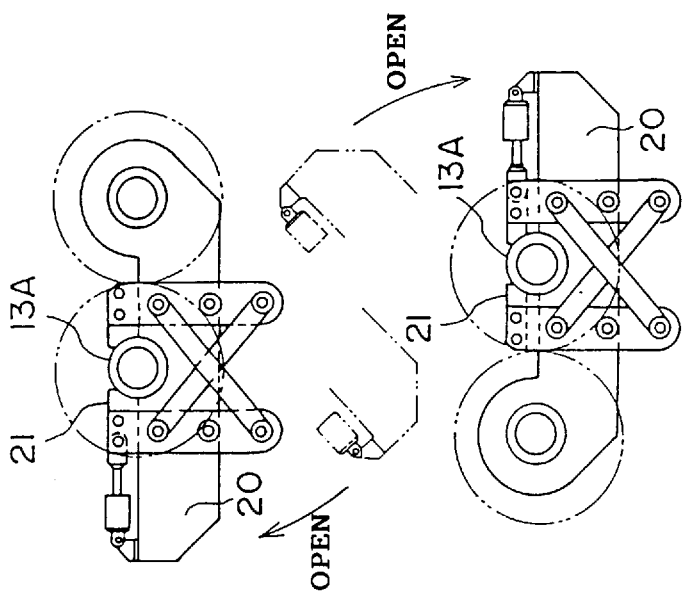
FIG. 14A
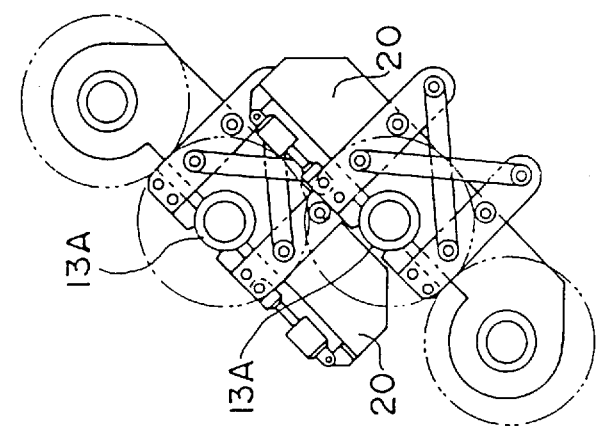

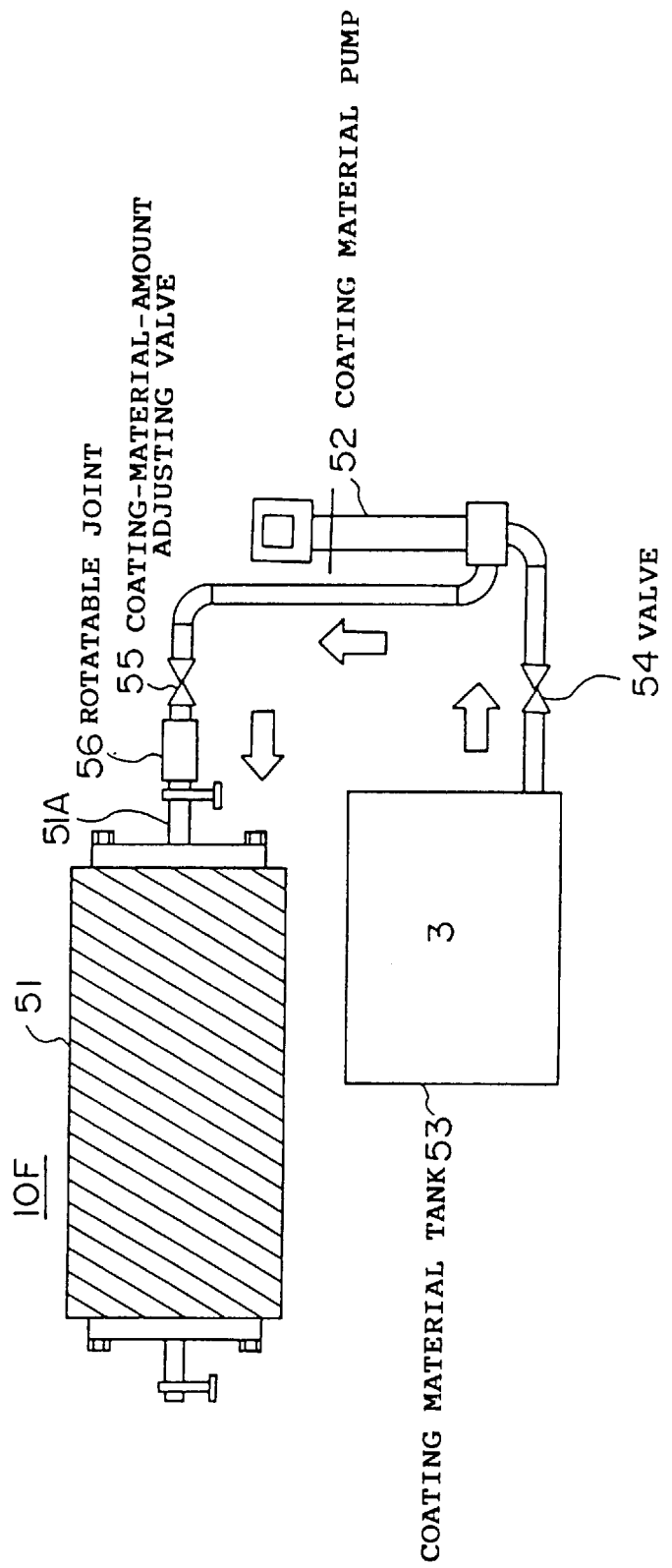

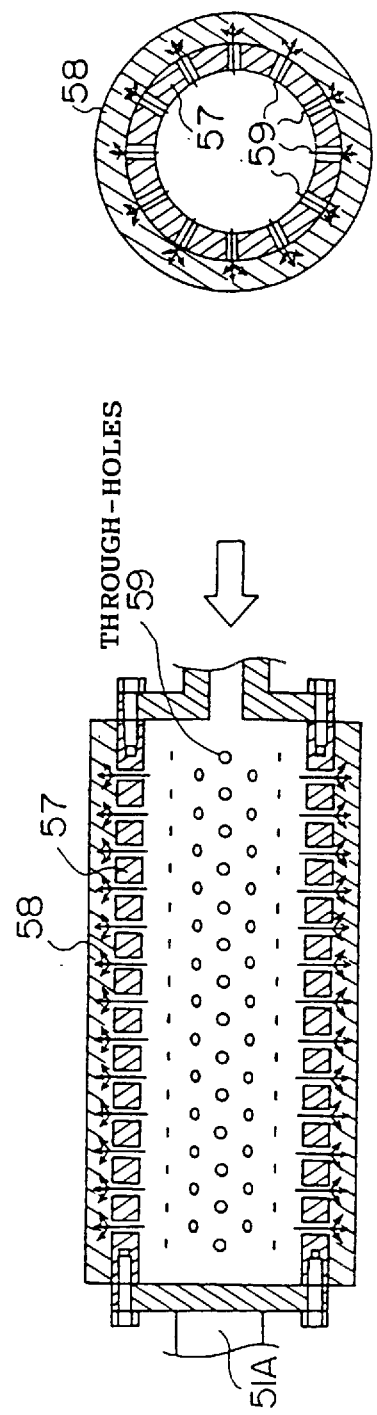

THICKNESS = LA − LB

FIG. 23A
FIG. 23B
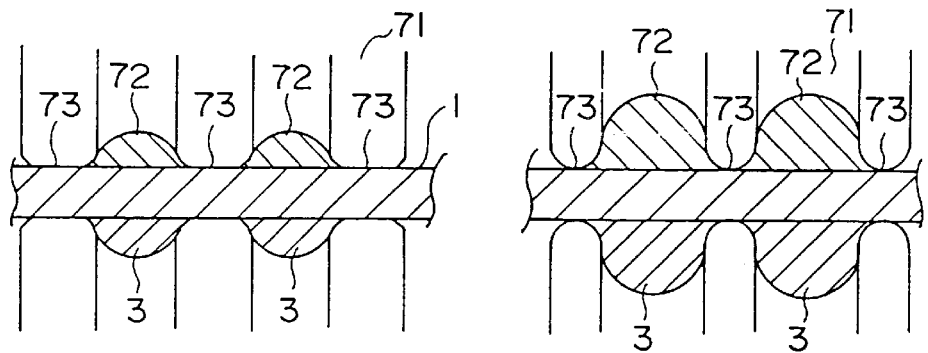
FIG. 24
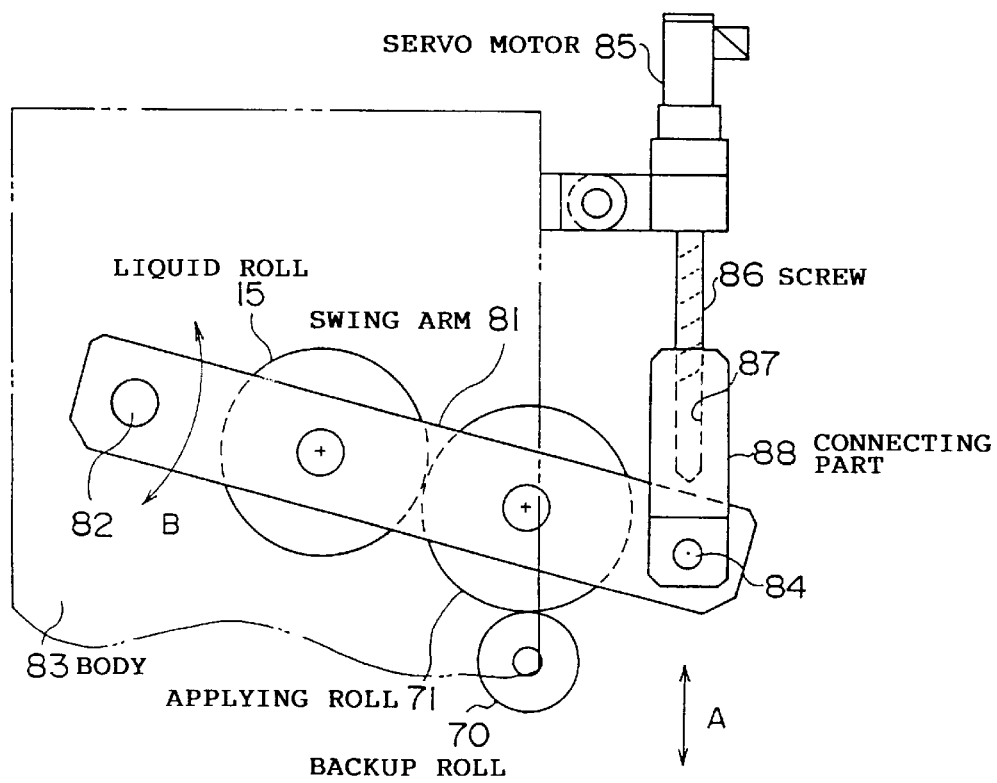

FIG. 29A
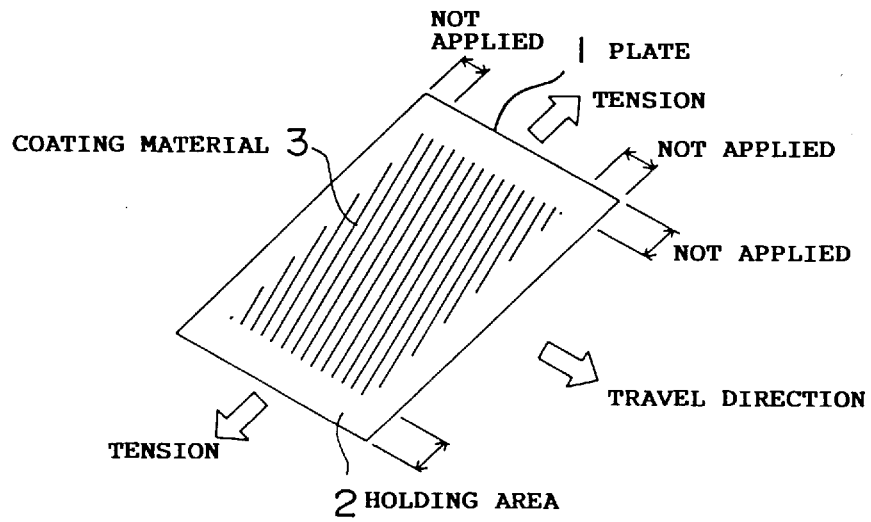
FIG. 29B
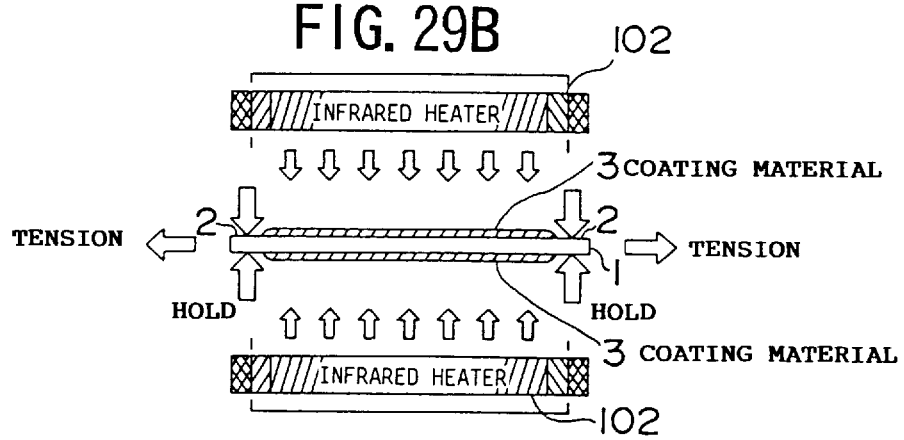
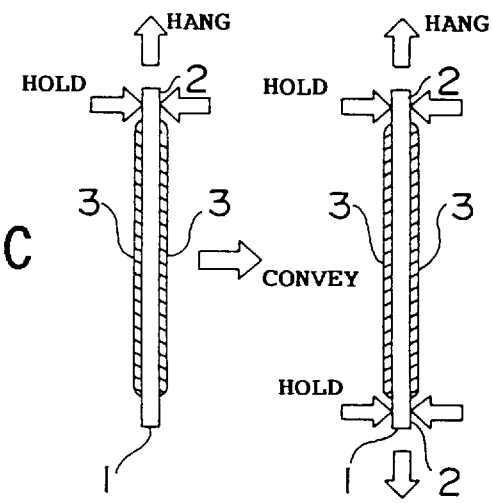
FIG. 29C      FIG. 29D

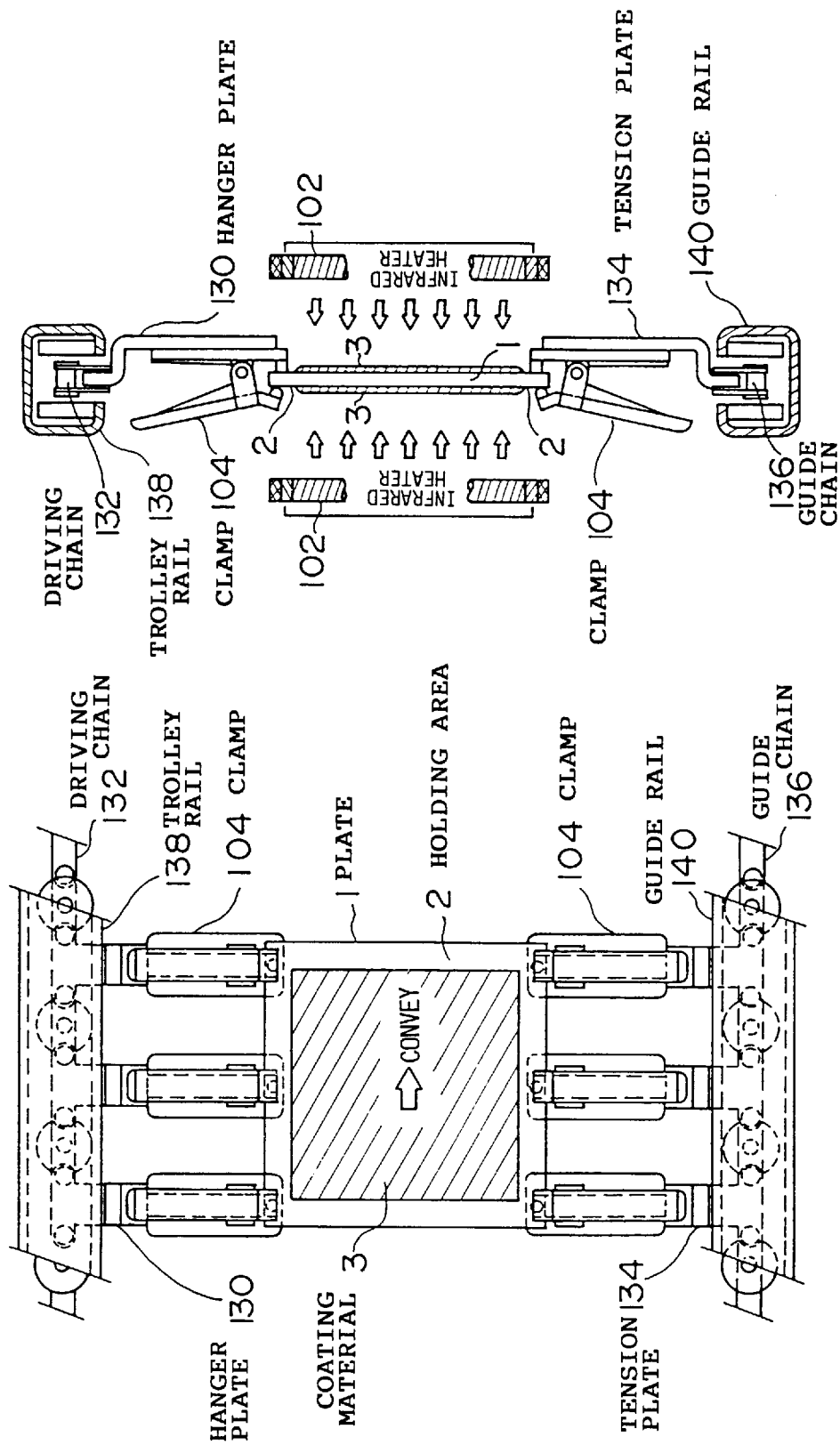

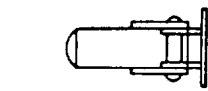
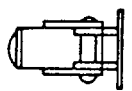
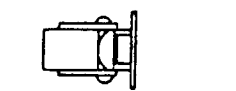
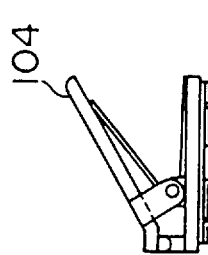
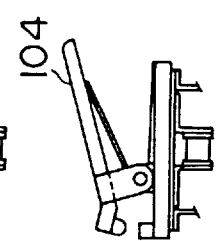
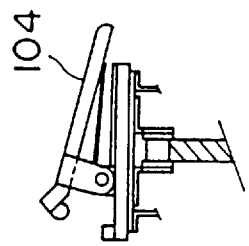
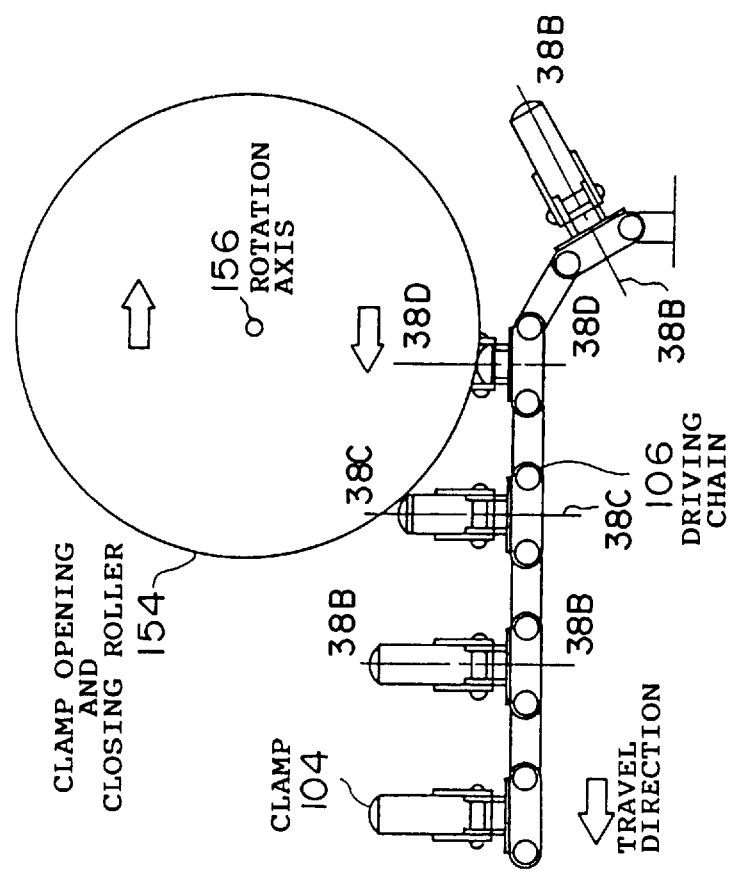

METHOD OF APPLYING A COATING MATERIAL TO A PLATE WITH CONVEYING ROLLERS CLAMPING SIDE EDGES OF THE PLATE

This application is a continuation application of Ser. No. 08/552,258 filed Nov. 2, 1995, now abandoned.

BACKGROUND OF THE INVENTION

1. Field of the Invention

The present invention generally relates to devices and methods for applying and/or drying a coating material, and particularly relates to a device and a method for applying a coating material to and/or drying a coating material on printed-circuit boards or plates of sheet-metal work.

2. Description of the Related Art

An increasing demand for low-cost printed-circuit boards which are miniaturized in multiple thin layers and high-density wiring patterns calls for methods which can form low-cost and high-quality circuits with high precision.

In the field of sheet-metal work, also, methods which can achieve high precision while incurring low costs are demanded. Thus, a chemical milling method which can form complex patterns at fast speed has been increasingly used.

A method of putting dry films on printed-circuit boards to form circuits incurs high costs. Also, a device for putting the dry films on the printed-circuit boards must be stopped when replenishing the dry films, thereby disturbing a flow of a manufacturing line. On the other hand, a method of applying liquid photosensitizer to printed-circuit boards incurs relatively low costs, and there is no need to stop a device when replenishing the photosensitizer. Thus, it is preferable to use the liquid photosensitizer for printed-circuit boards.

In order to produce printed-circuit boards with high precision, a photosensitizer which is highly sensitive and yet stable is required. When a highly sensitive photosensitizer is used, however, applying he photosensitizer to each surface of a printed-circuit board consecutively results in a photosensitizer on one surface being exposed to more heat in a drying process than a photosensitizer on the other surface. Thus, a difference in a sensitivity of the photosensitizer will develop between the two surfaces. Because of this, it is preferable to apply photosensitizer to both surfaces simultaneously, which is also preferable for a process-time reduction. Also, installing one device for applying and drying a coating material for both surfaces requires less investment than installing two devices for only one surface and connecting the two devices in a series. Thus, it is preferable to use a device for applying a coating material to both surfaces simultaneously.

When various types of printed-circuit boards are manufactured in a small quantity, a direct-drawing method is often used, instead of using a number of master films corresponding to these various types. The direct-drawing method uses a laser beam directly controlled by a CAD (computer-aided design) system. The direct-drawing method is suited to manufacturing of products of various types, and can speed up the entire production process. The direct-drawing method uses a high-sensitivity photosensitizer so that an applying process must be conducted in a darkroom.

In the chemical milling method used for a low-cost and high-precision metal-sheet work, a coating material (photosensitizer) is required to be applied to both surfaces simultaneously as in the case of the printed-circuit boards.

In the related art, a method employing rolls is used to apply photosensitizers to both surfaces. In this method, a photosensitizer is provided on a cylindrical roll having a surface of a resin type, and the cylindrical roll is rolled on a surface of a place to apply the photosensitizer to the plate.

In the method using the rolls of the related art, however, a coating material is applied to the entirety of both plate surfaces, thus providing no space to hold the plate when the coated plate is conveyed. Thus, human hands are required which are pushed against side edges of a plate to hold and carry the plate to a drying machine. In this method, however, an automation of the manufacturing process cannot be achieved, thus resulting in an inefficiency. When plates are conveyed by holding edges of the plates through a V-shape fixture, a conveyer, or the like, a coating material is bound to attach to these conveying devices. When a coating material is accumulated on surfaces of these conveying devices, the accumulated coating material might damage the coated surface of the plates. Also, such accumulation may result in a malfunction of the applying device or the drying device.

In the method using the rolls of the related art, a solution concentration of a coating material is increased when the coating material needs to be applied thicker. However, a thicker coating material is more likely to develop cracks. Also, when a thick coating material on both surfaces of a plate is dried, the coating material on either surface may be affected by gravity to develop draping of the coating material. Thus, applying a thick coating material makes it difficult to obtain a coated surface of a good condition.

Also, related-art devices using the rolls have a structure such that rolls for applying a coating material are difficult to be exchanged. When these rolls need to be exchanged because of defects or wearing, a manufacturing line must be stopped for a long time. When these rolls are cleaned by rolling them, chances of having an accident such as getting hands caught in the rolls cannot be eliminated.

Also, as the related-art devices for applying a coating material do not have light shields, a room where the devices are installed should be turned into a darkroom. This leads to an increase in investment, and makes it difficult to move the facility.

Also, when a solder resist is applied or a build-up method is used, it is necessary to apply an insulating resin or a photosensitizer to an irregular surface of a previously formed circuit. The related-art devices which use rolls having a relatively hard surface made of a vinyl type, a polyurethane type, or the like are suited to an application of a coating material to a flat plate, but are not suited to an application of a coating material to an irregular surface. When a hard surface of rolls of the related-art devices is used, an applied coating material becomes thin on peaks of the surface, and becomes thick in valleys of the surface.

Stabilization of the sensitivity of a photosensitizer requires the control of the thickness of a coating material. In the related-art devices, the control of the concentration of a coating material is conducted by adjusting a pressure of the rolls pushed against the plates or by adjusting the amount of a solution and a photosensitizer based on the measurement of the thickness of an applied coating material after it is dried. As noted before, an applied coating material becomes thicker as the concentration of the coating material becomes higher. In these devices, however, a continuous control of the thickness cannot be achieved so that it is difficult to obtain a constant thickness.

With regard to a drying process of a coating material, the problems are as follows. Related-art methods of drying a coating material applied to both surfaces of plates include a method of drying the coating material while conveying the plates by using the V-shape fixture, and a method of drying the coating material while conveying the plates by hanging the plates with clamps. The method of drying a coating material while conveying plates by using the V-shape fixture cannot eliminate a possibility that the plates bend to touch the V-shape fixture when thin plates are used. Here, thin plates are often used for forming circuits of inner layers.

In the method of drying the coating material by hanging the plates, the plates bend due to a difference in thermal expansion coefficients between the plate and the coating material. When bending is developed, a distance between the plates and a heat source is changed so as to bring about an irregularity in the dryness of the coating material. Also, a process of correcting the bending is required at a later stage. In this method, when plates of a regular shape and size are used, these plates can be set to an operating position for hanging the plates automatically. However, when plates of an irregular shape and size are used, human hands are required to set the plates to the operating position.

Accordingly, there is a need for a method and a device for applying a coating material which can apply the coating material to both surfaces of plates except for a holding area provided on the surfaces so as to enable the plates to be easily conveyed.

Also, there is a need for a method and a device for applying a coating material which can apply the coating material in a constant thickness through a continuous control of the thickness.

Furthermore, there is a need for a method and a device for drying a coating material which do not bring about the bending of plates.

SUMMARY OF THE INVENTION

Accordingly, it is a general object of the present invention to provide a method and a device for applying or drying a coating material which can satisfy the needs described above.

It is another and more specific object of the present invention to provide a method and a device for applying a coating material which can apply the coating material to both surfaces of plates except for a holding area provided on the surfaces so as to enable the plates to be easily conveyed.

In order to achieve the above objects according to the present invention, a method of applying a coating material to two surfaces of a plate includes the steps of applying the coating material to the two surfaces simultaneously such that holding areas in the absence of the coating material are provided on the two surfaces in proximity of side ends of the plate with respect to a travel direction of the plate, and conveying the plate by holding the holding areas.

The above objects can also be achieved by a device for applying a coating material to two surfaces of a plate. The device includes an applying unit for applying the coating material to the two surfaces simultaneously such that holding areas in the absence of the coating material are provided on the two surfaces in proximity of side ends of the plate with respect to a travel direction of the plate, and a conveying unit for conveying the plate by holding the holding areas.

In the method and the device described above, the holding area used for holding the plate is provided on the surfaces of the plate, so that it is possible to convey the plate by holding the holding area without touching the coating material.

It is yet another object of the present invention to provide a method and a device for applying a coating material which can apply the coating material in a constant thickness through a continuous control of the thickness.

In order to achieve the above object according to the present invention, the method described above further includes the steps of continuously measuring a thickness of the coating material applied to the plate, and adjusting an amount of the coating material applied to the plate according to the thickness.

The above object can also be achieved by the device described above further including a measuring unit for continuously measuring a thickness of the coating material applied to the plate, and an adjusting unit for adjusting an amount of the coating material applied to the plate according to the thickness.

In the method and the device described above, the thickness of the coating material is measured, and the amount of the coating material applied to the plate is controlled based on the measured thickness. Thus, the thickness of the coating material on the plate is automatically controlled in a continuous manner, so that a desired thickness is stably obtained.

It is still another object of the present invention to provide a method and a device for drying a coating material which do not bring about the bending of plates.

In order to achieve the above object according to the present invention, a method of drying a coating material applied to two surfaces of a plate includes the steps of conveying the plate in a travel direction while applying a tension in a direction perpendicular to the travel direction by holding holding areas in proximity of side ends of the plate with respect to the travel direction, the holding area being provided on the two surfaces of the plate, and drying the coating material applied to the two surfaces of the plate from sides of the two surfaces.

The above objects can also be achieved by a device of drying a coating material applied to two surfaces of a plate. The device includes a conveying unit for conveying the plate in a travel direction while applying a tension in a direction perpendicular to the travel direction by holding holding areas in proximity of side ends of the plate with respect to the travel direction, the holding area being provided on the two surfaces of the plate, and a drying unit for drying the coating material applied to the two surfaces of the plate from sides of the two surfaces.

In the method and the device described above, the plate with coating material applied to both surfaces thereof is stretched from opposite ends thereof. This tension prevents the plate from being bent by a difference in the thermal expansion coefficients between the plate and the coating material when the coating material is dried from both surfaces of the plate.

Other objects and further features of the present invention will be apparent from the following detailed description when read in conjunction with the accompanying drawings.

BRIEF DESCRIPTION OF THE DRAWINGS

FIGS. 2A and 2B are illustrative drawings showing the first principle of the present invention;

FIGS. 12A, 12B, 12C and 12D are illustrative drawings for explaining a mechanism by which applying rolls of the two-surface applying device of FIG. 11 move up and down according to the travel of a plate;

FIGS. 14A, 14B and 14C are illustrative drawing for explaining a mechanism by which applying rolls of a two-surface applying device of FIG. 13 are removed;

FIG. 17 is an illustrative drawing showing a seventh embodiment of a two-surface applying device for applying the coating material to both surfaces of a plate according to the first principle;

FIGS. 18A and 18B are illustrative drawings showing a structure of an applying roller of the two-surface applying device of FIG. 17;

FIGS. 23A and 23B are partially enlarged cross-sectional views of the applying roll and the plate taken along a line A–A' of FIG. 22;

FIG. 24 is an illustrative drawing showing a mechanism of holding the applying roll which can adjust the pressure applied by the applying roll;

FIGS. 29A, 29B, 29C and 29D are illustrative drawings showing the second principle of the present invention;

FIGS. 36A and 36B are illustrative drawings showing a seventh embodiment of a two-surface drying device for drying the coating material applied on both surfaces of a plate according to the second principle;

FIGS. 38A, 38B, 38C and 38D are illustrative drawings showing a ninth embodiment of a two-surface drying device for drying the coating material applied on both surfaces of a plate according to the second principle;

DESCRIPTION OF THE PREFERRED EMBODIMENTS

In the following, principles and embodiments of the present invention will be described with reference to the accompanying drawings.

FIGS. 1 through 4 are illustrative drawings showing a first principle of a method and a device for applying a coating material to both surfaces of plates.

Figure 1A:
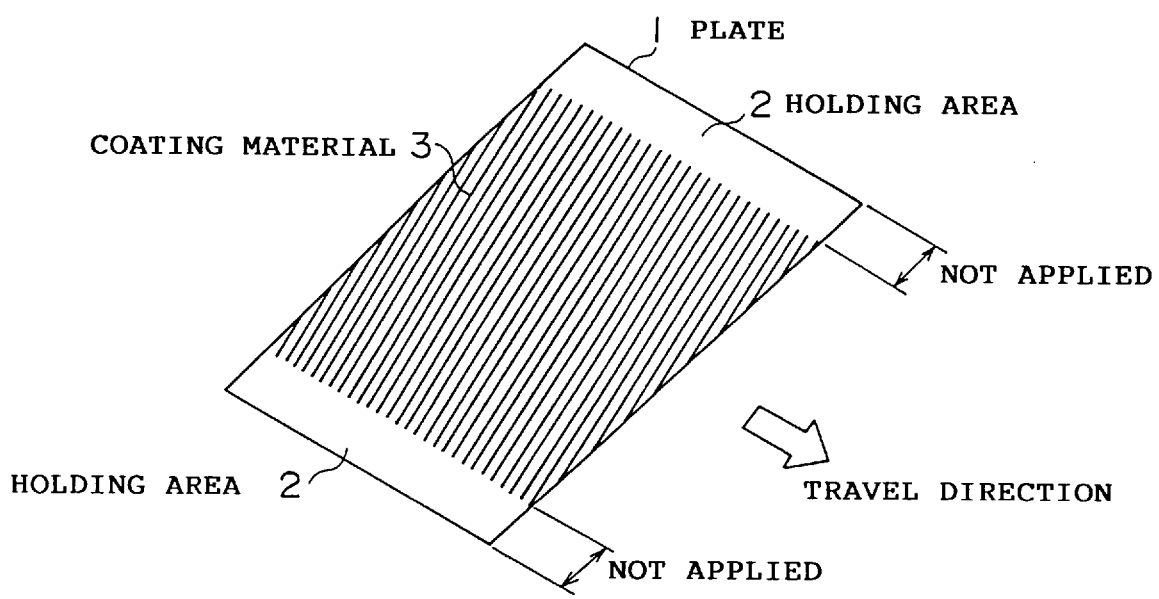
FIGS. 1A and 1B are illustrative drawings showing a first principle of the present invention for applying a coating material to both surfaces of a plate.
Figure 1B:
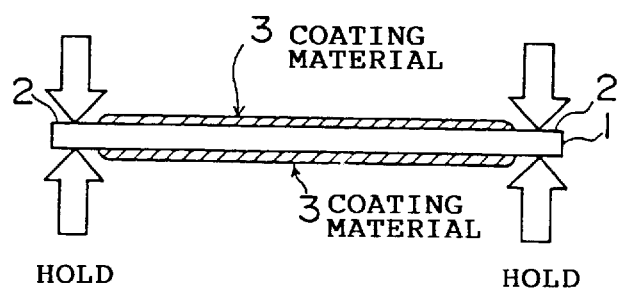

As shown in FIG. 1A, applying means, which will be described later, applies a coating material 3 to both surfaces of a plate 1 while leaving a holding area 2 in proximity of side edges with respect to a travel direction of the plate 1 without the coating material 3. Then, as shown in FIG. 1B, conveying means, which will be described later, holds the plate 1 by the holding area 2 and conveys the plate 1. While the plate 1 is carried, the coating material 3 on the surfaces of the plate 1 can be dried from the upper direction and the lower direction.

In another configuration shown in FIG. 2A, another applying means, which will be described later, applies the coating material 3 to both surfaces of the plate 1 while leaving the holding area 2 in proximity of front and back edges with respect to a travel direction of the plate 1 without the coating material 3. Then, as shown in FIG. 2B, another conveying means, which will be described later, hangs the plate 1 by holding the holding area 2 and conveys the plate 1. While the plate 1 is carried, the coating material 3 on the surfaces of the plate 1 can be dried from the right and the left.

Figure 3B:
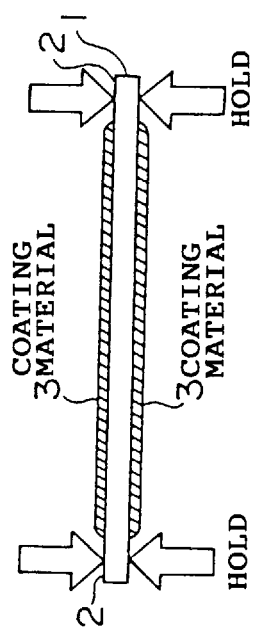
FIGS. 3A, 3B and 3C are illustrative drawings showing the first principle of the present invention.
Figure 3C:
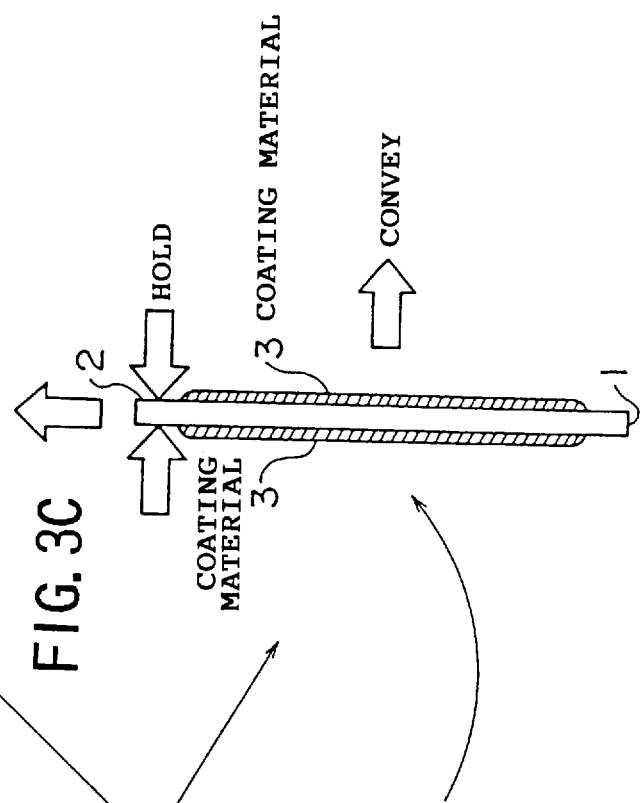
Figure 3A:
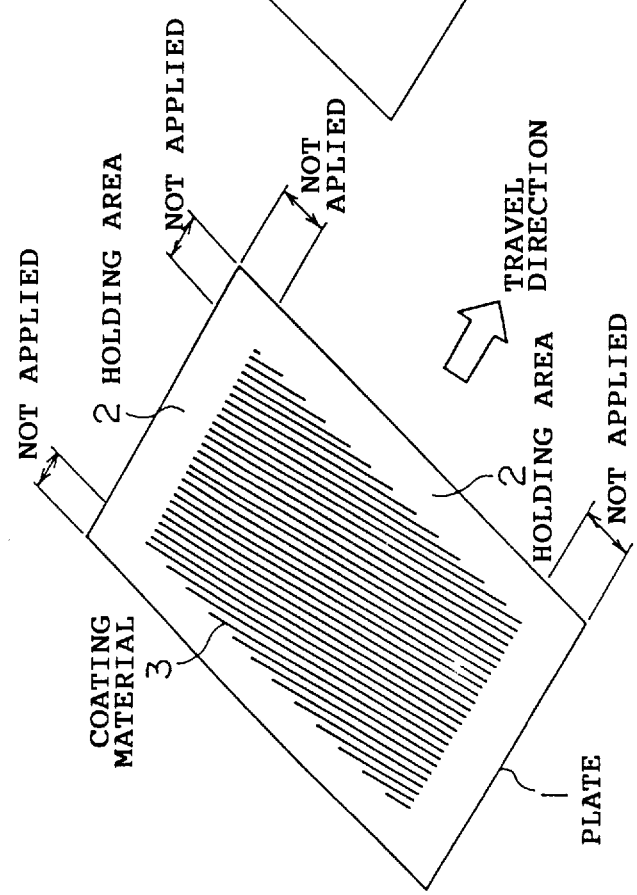

In yet another configuration shown in FIG. 3A, yet another applying means, which will be described later, applies the coating material 3 to both surfaces of the plate 1 while leaving the holding area 2 in proximity of a perimeter of the plate 1 without the coating material 3. Then, as shown in FIG. 3B, yet another conveying means, which will be described later, holds the plate 1 by the holding area 2 or hangs the plate 1 by holding the holding area 2 to convey the plate 1. While the plate 1 is carried, the coating material 3 on the surfaces of the plate 1 can be dried.

According to the first principle described above, the holding area 2 used for holding the plate 1 is provided on the surfaces of the plate 1, so that it is possible to convey the plate 1 by holding the holding area 2 without touching the coating material 3. Thus, coated surfaces of a good condition are obtained, and a machine can be used for conveying the plate 1. Therefore, an automation of the manufacturing line can be achieved to enhance the productivity.

Figure 4A:
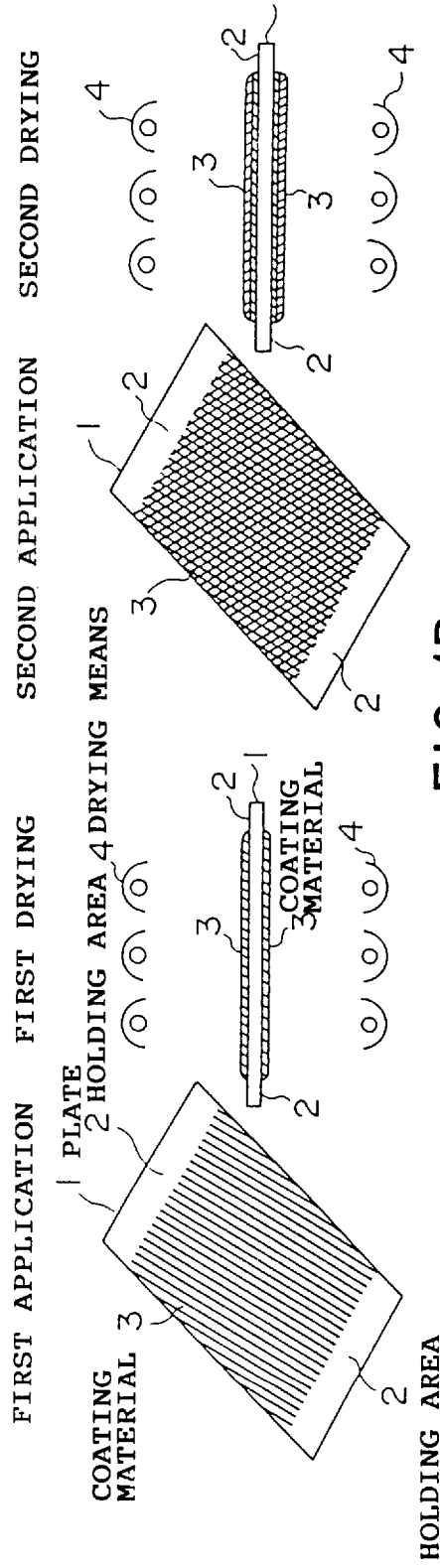
FIGS. 4A and 4B are illustrative drawings showing the first principle of the present invention.
Figure 4B:
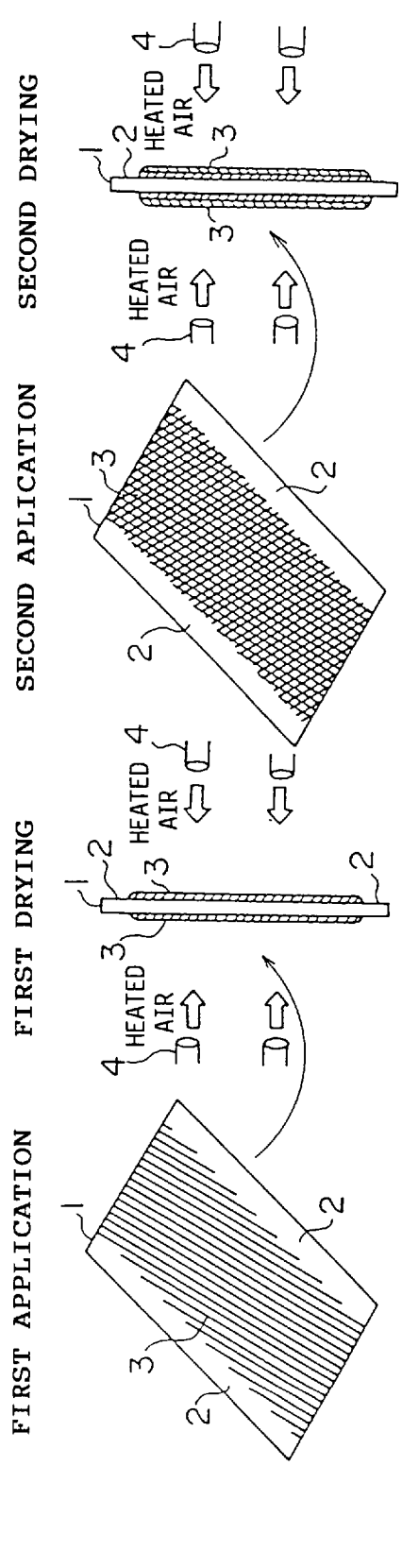

FIGS. 4A and 4B are illustrative drawings for explaining a method of thickly applying the coating material 3 to both surfaces of the plate 1 according to the first principle of the present invention.

As shown in FIG. 4A and FIG. 4B, an application of the coating material 3 shown in FIG. 1A and FIG. 2A, respectively, is repeated more than one time after drying each time the coating material 3 by drying means 4 (far-infrared heater, warm-air-blow nozzle, etc.). During this procedure, the coating material 3 is applied before a previously applied coating material 3 becomes completely solid. By doing so, a solution of a newly applied coating material 3 dissolves a surface of the previously applied coating material 3, so that the familiarity between these two coating materials 3 is enhanced.

According to this method, the coating material 3 is applied before the previously applied coating material 3 becomes completely solid, so that breaking off between layers of the coating material 3, cracks, and draping are avoided in the thickened coating material 3.

FIG. 5 through FIG. 8 are illustrative drawings showing a first embodiment of a device for applying the coating material 3 to both surfaces of the plate 1 according to the first principle of the present invention.

Figure 5:
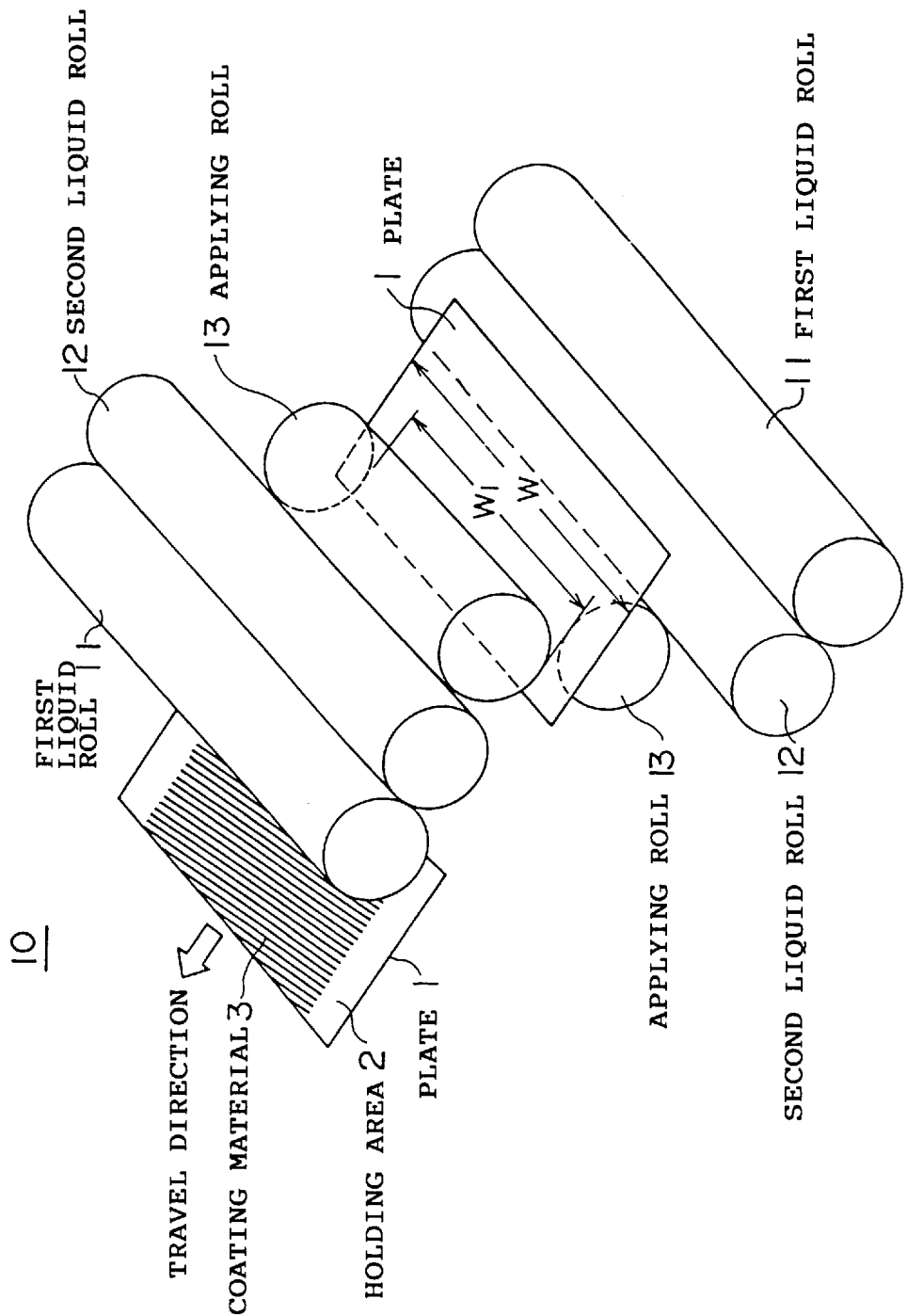
FIG. 5 is an isometric view of a two-surface applying device according to a first embodiment of the first principle.

FIG. 5 is an isometric view of a two-surface applying device 10. In the figure, the two-surface applying device 10 includes first liquid rolls 11, second liquid rolls 12, and applying rolls 13. A set of the first liquid roll 11, the second liquid roll 12, and the applying roll 13 is provided over the plate 1 (printed-circuit board or the like) and under the plate 1, respectively. The first liquid roll 11 and the second liquid roll 12 paste the coating material 3 to the entire surface of the applying roll 13. The applying roll 13 has a width W1 which is narrower than a width W of the plate 1. Thus, when the applying rolls 13 provided over and under the plate 1 are rotated on the two surfaces of the plate 1, the coating material 3 is applied to the two surfaces of the plate 1 while leaving the holding area 2 in proximity of the side edges of the plate 1 with respect to a travel direction thereof without the coating material 3.

Figure 6:
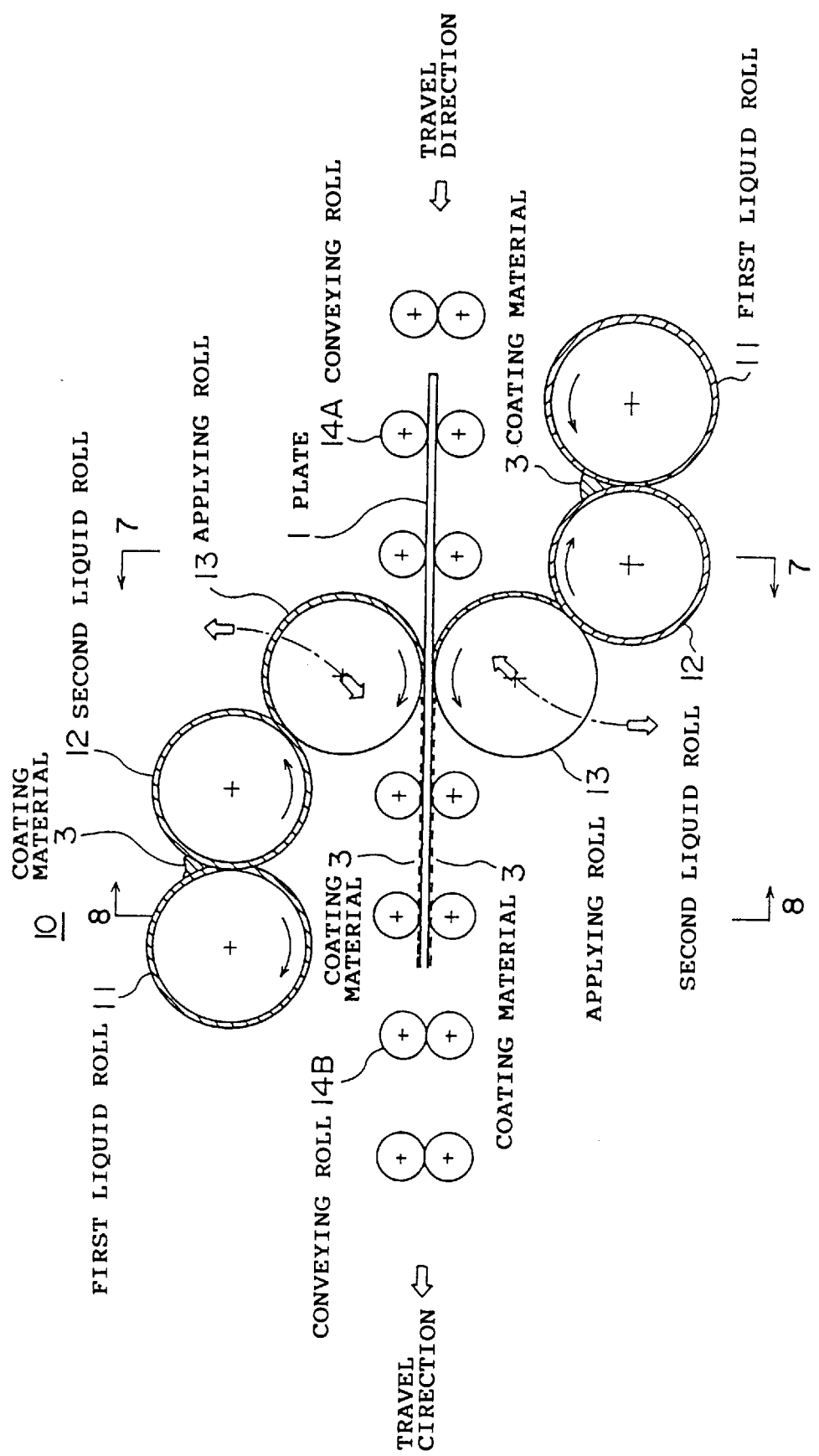
FIG. 6 is a cross-sectional view of the two-surface applying device of FIG. 5 taken along a plane perpendicular to an axis of rolls.

FIG. 6 is a cross-sectional view of the two-surface applying device 10 taken along a plane perpendicular to an axis of the rolls. As shown in FIG. 6, the coating material 3 is provided between the first liquid roll 11 and the second liquid roll 12 for both sets over and under the plate 1, and the rolls 11 and 12 are rotated in directions shown by arrows. Thus, the coating material 3 is conveyed from the second liquid roll 12 to the applying roll 13, and, then, from the applying roll 13 to the plate 1. The two-surface applying device 10 further includes conveying rolls 14A and 14B for conveying the plate 1. The conveying rolls 14A provided on a side for inserting the plate 1 are rolls having a width about the same as that of the plate 1. Thus, the conveying rolls 14A hold the plate 1 by contacting the entire surfaces of the plate 1. On the other hand, the conveying rolls 14B provided on a side for ejecting the plate 1 have a shape such that they can hold only the holding area 2 of the plate 1.

Figure 7:
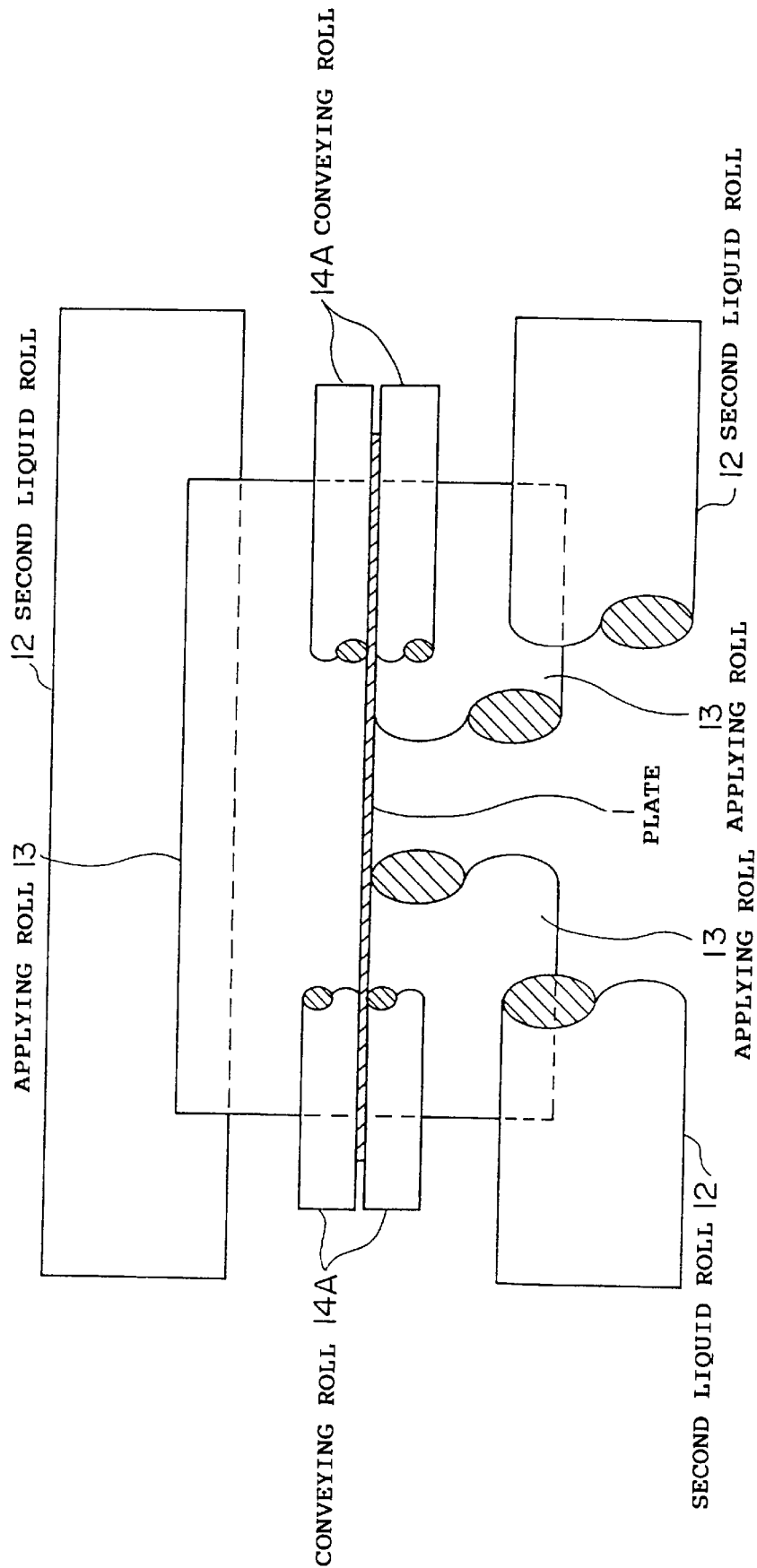
FIG. 7 is a cross-sectional view of the two-surface applying device taken along a line A–A' in FIG. 6.
Figure 8:
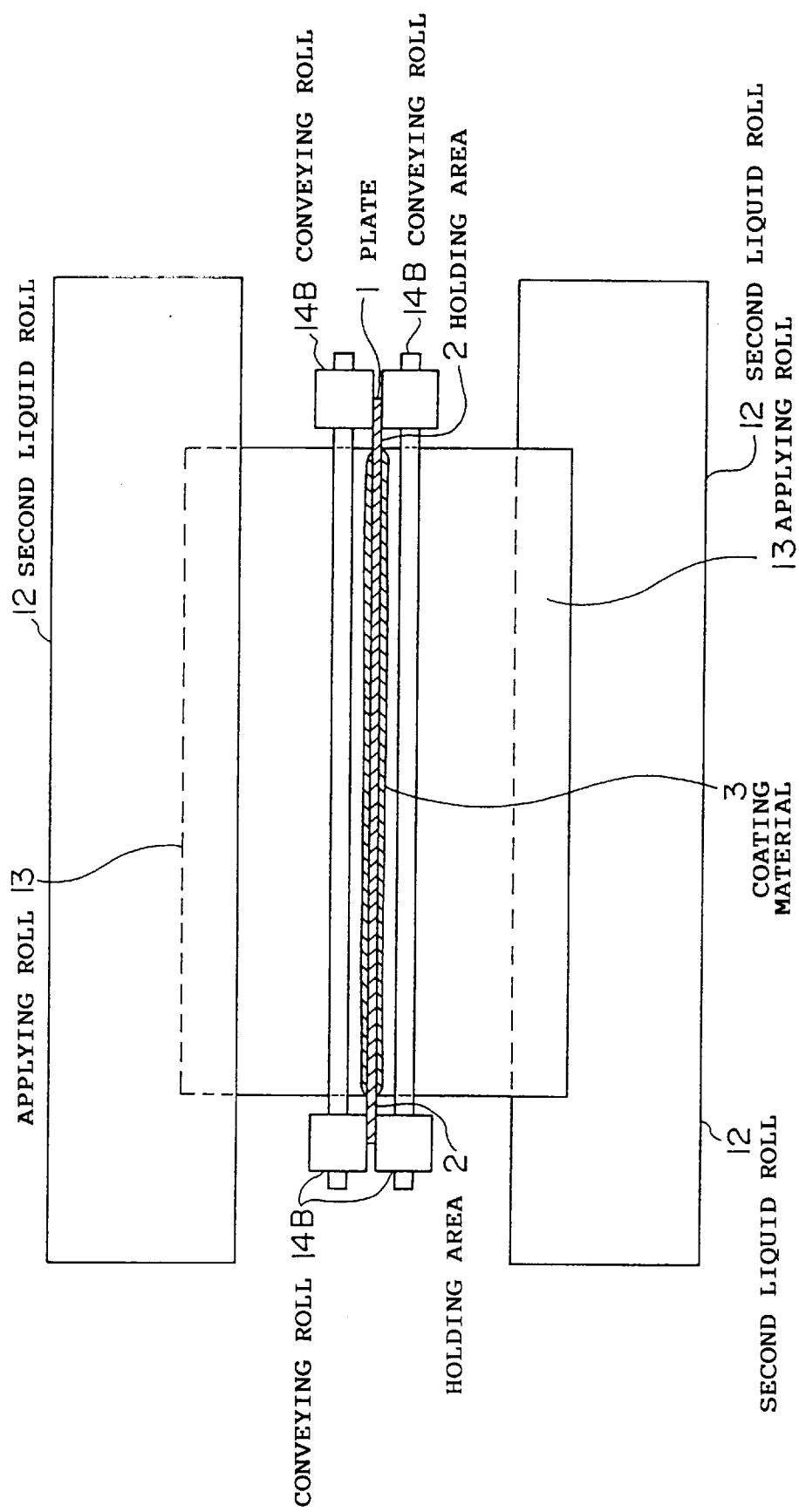
FIG. 8 is a cross-sectional view of the two-surface applying device taken along a line B–B' in FIG. 6.

FIG. 7 is a cross-sectional view of the two-surface applying device 10 taken along a line A–A' in FIG. 6. FIG. 8 is a cross-sectional view of the two-surface applying device 10 taken along a line B–B' in FIG. 6. Shapes of the conveying rolls 14A and 14B will be described with reference to FIG. 7 and FIG. 8.

As shown in FIG. 7, the conveying rolls 14A convey the plate. 1 on which the coating material 3 is not yet applied, so that they can contact the entire surfaces of the plate 1 when conveying it. On the other hand, as shown in FIG. 8, the conveying rolls 14B convey the plate 1 on which the coating material 3 has been already applied, so that they convey the plate 1 by holding only the holding area 2 provided in proximity of the side edges of the plate 1.

In the first embodiment described above, the two sets of the first liquid roll 11, the second liquid roll 12, and the applying roll 13 constitute the applying means, and the conveying rolls 14B constitute the conveying means. The two-surface applying device 10 according to the first embodiment uses the applying rolls 13 having a width narrower than that of the plate 1 so as to apply the coating material 3 to the plate 1 while leaving the holding area 2 in proximity of the side edges of the plate 1 without the coating material 3. Further, the two-surface applying device 10 uses the conveying rolls 14B for holding the holding area 2 so as to convey the plate 1 without touching the coating material 3. Thus, the coated surfaces for which the coating material 3 is applied to both surfaces at the same time are obtained in a good condition. Also, an automation of the manufacturing line can be achieved to enhance the productivity.

Figure 9:
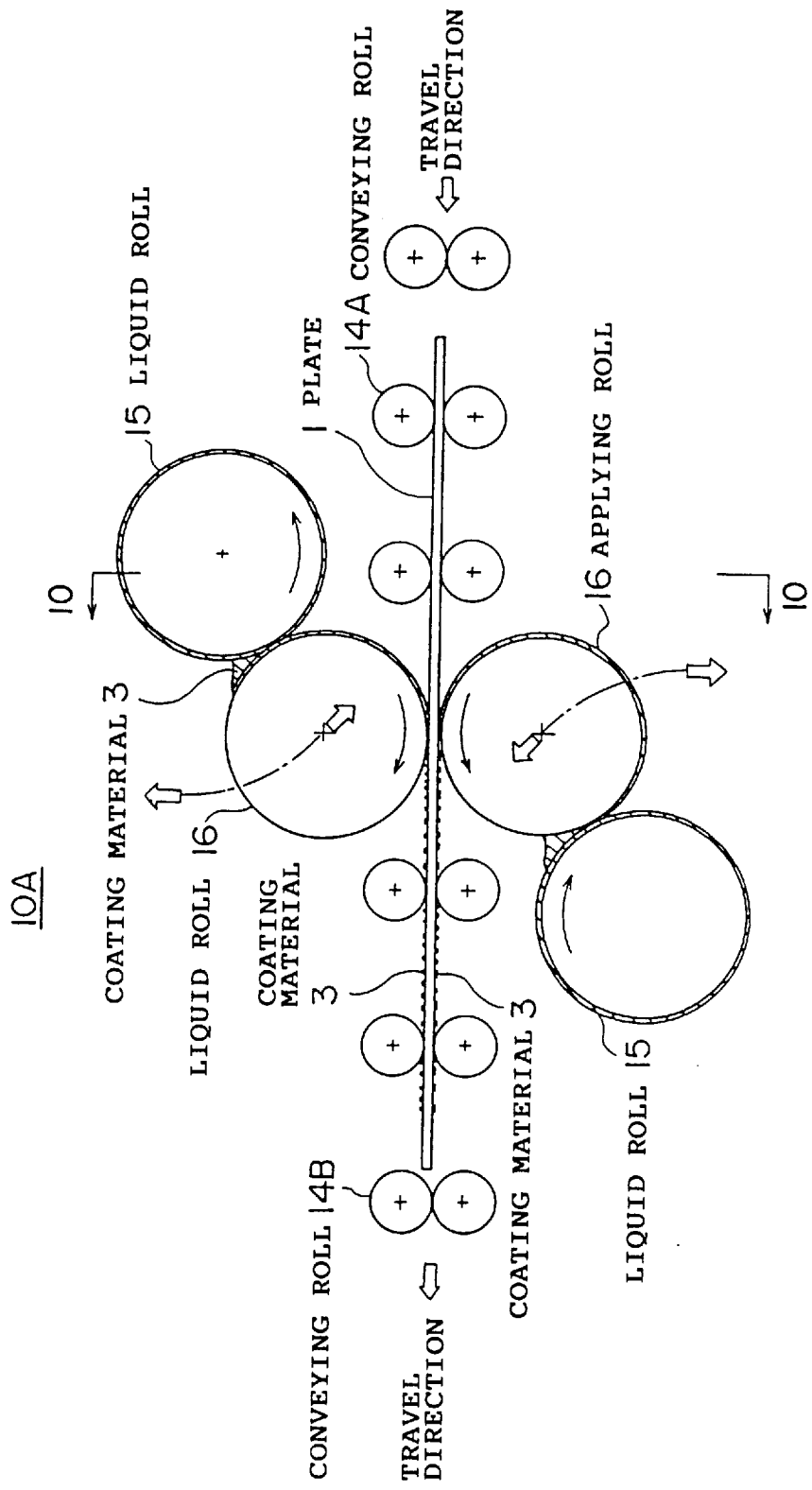
FIG. 9 is a cross-sectional view of a two-surface applying device of a second embodiment according to the first principle.
Figure 10:
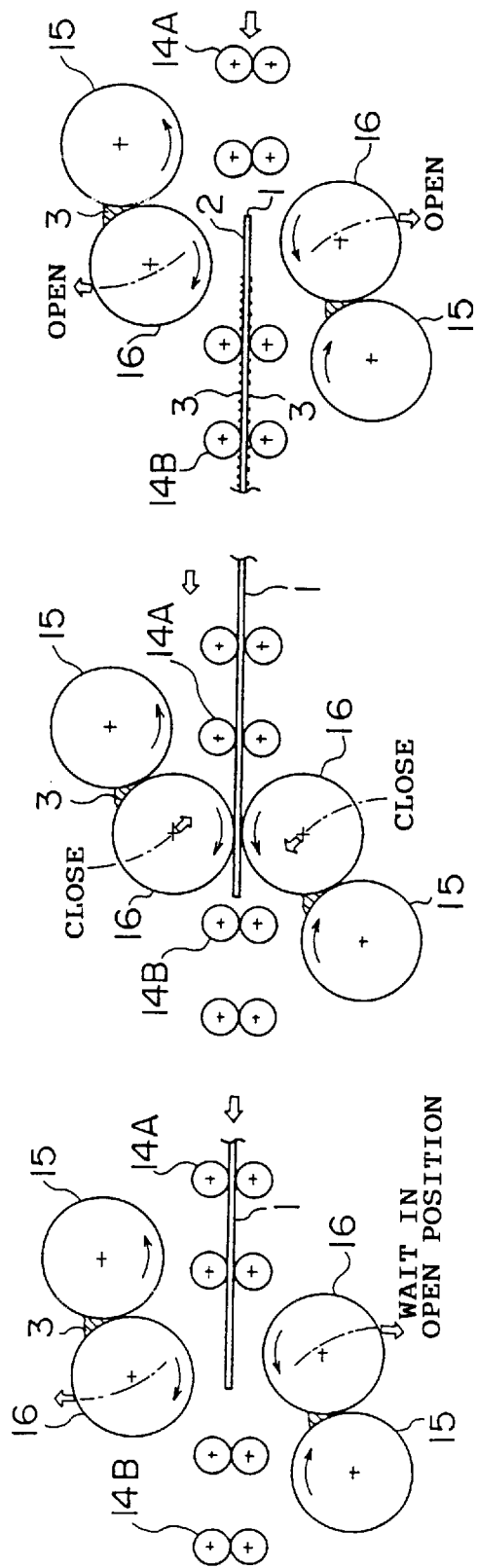
FIGS. 10A, 10B and 10C are illustrative drawings for explaining a mechanism by which applying rolls of the two-surface applying device of FIG. 9 move up and down according to the travel of a plate.

FIG. 9 and FIG. 10 are illustrative drawings showing a second embodiment of a device for applying the coating material 3 to both surfaces of the plate 1 according to the first principle of the present invention.

FIG. 9 is a cross-sectional view of a two-surface applying device 10A. In FIG. 9, the two-surface applying device 10A includes liquid rolls 15, applying rolls 16, and the conveying rolls 14A and 14B for conveying the plate 1. A set of the liquid roll 15 and the applying roll 16 is provided over and under the plate 1, respectively. The coating material 3 is pasted on the entire surface of the applying roll 16 by the liquid roll 15. The applying roll 16 has a width about the same as that of the plate 1. Thus, when the two applying rolls 16 are rotated on the two surfaces of the plate 1 provided therebetween, the coating material 3 provided between the liquid roll 15 and the applying roll 16 is applied to the entire surfaces of the plate 1.

The conveying rolls 14A provided on a side of inserting the plate 1 have a width about the same as that of the plate 1, so that they hold the plate 1 by contacting the entire surfaces thereof. On the other hand, the conveying rolls 14B provided on a side of ejecting the plate 1 have a shape such that they hold the plate 1 only at proximity of side edges thereof with respect to a travel direction of the plate 1. In this case, the conveying rolls 14B contact the coating material 3 applied to the surfaces of the plate 1. However, this is not a problem as long as the contacted portion of the plate 1 is not used at a later stage. When it is preferable that the contact with the coating material 3 is avoided, the V-shape fixture of the related art may be used.

In the second embodiment, the applying rolls 16 are not in a constant contact with the plate 1, but are controlled with respect to the contact with the plate 1 according to a travel of the plate 1.

FIGS. 10A through 10C are illustrative drawings for explaining a mechanism by which the applying rolls 16 of the two-surface applying device 10A move up and down according to the travel of the plate 1. As shown in FIG. 10A, when a front edge of the plate 1 is inserted, the applying rolls 16 are in an open position. As shown in FIG. 10B, after the front edge of the plate 1 passes by, the applying rolls 16 are closed to clamp the plate 1 so as to apply the coating material 3 to both surfaces of the plate 1. Then, as shown in FIG. 10C, when a rear end of the plate 1 comes close to the applying rolls 16, the applying rolls 16 are opened again so as to form the holding area 2 at the rear end of the plate 1.

In order to control the contact of the applying rolls 16 with the plate 1 according to the travel of the plate 1, it is necessary to detect the travel of the plate 1. Methods for achieving this include use of a photosensor, measurement of a static-charge capacity, or detection of the plate 1 by using the conveying rolls, all of which are well within a range of ordinary skills in the art.

In the second embodiment described above, the two sets of the liquid roll 15 and the applying roll 16 constitute the applying means. In the two-surface applying device 10A according to the second embodiment, the contact of the applying rolls 16 with the plate 1 is controlled according to the travel of the plate 1, so that the holding area 2 is formed at the front end and the rear end of the plate 1. Thus, both surfaces of the plate 1 are coated simultaneously in a good condition, and an automation of the manufacturing line can be achieved to boost the productivity.

Figure 11:
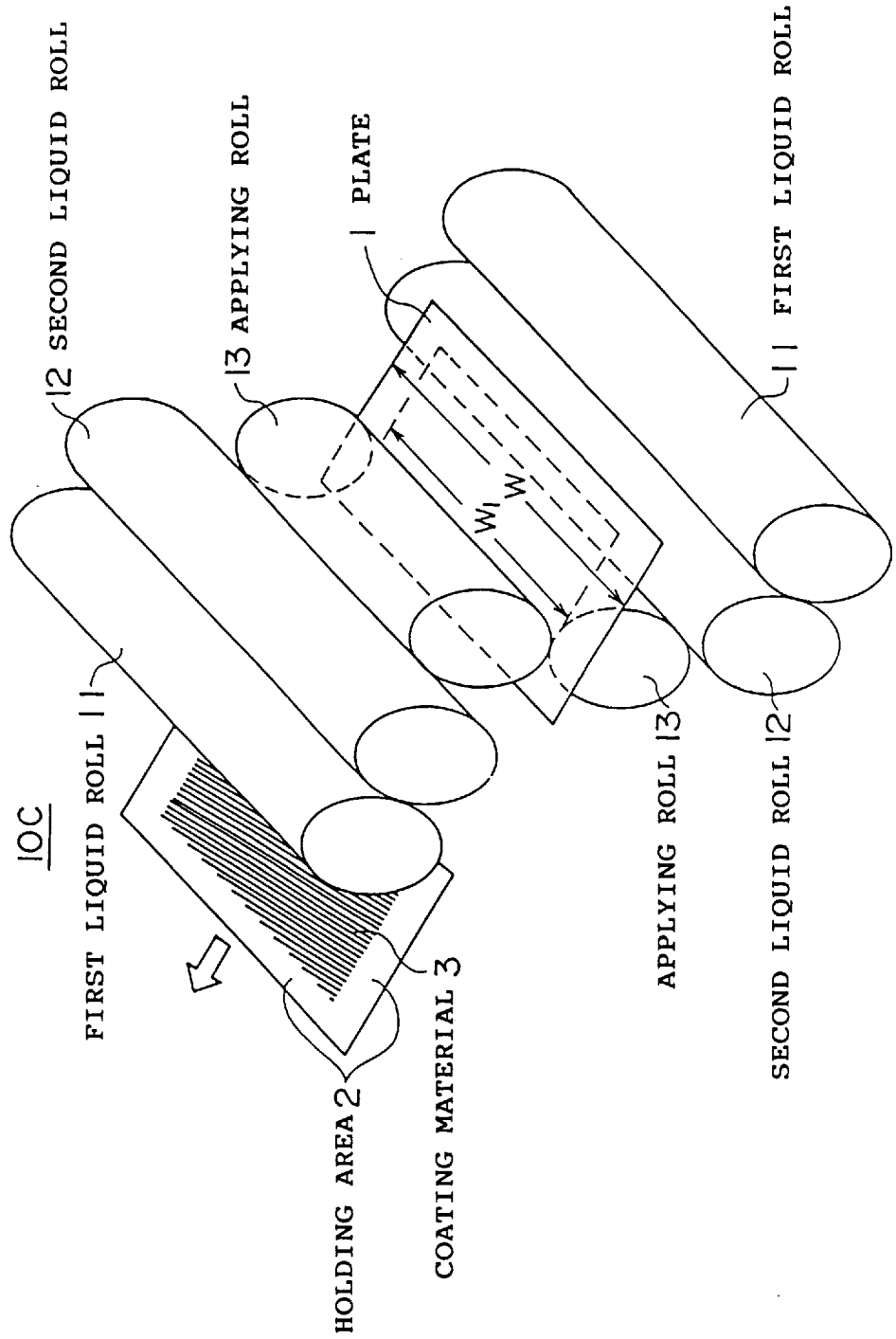
FIG. 11 is an isometric view of a two-surface applying device according to a third embodiment of the first principle.

FIG. 11 and FIG. 12 are illustrative drawings showing a third embodiment of a device for applying the coating material 3 to both surfaces of the plate 1 according to the first principle of the present invention.

FIG. 11 is an isometric view of a two-surface applying device 10C. In FIG. 11, the two-surface applying device 10C includes the first liquid rolls 11, the second liquid rolls 12, and the applying rolls 13. A set of the first liquid roll 11, the second liquid roll 12, and the applying roll 13 is provided over and under the plate 1, respectively. The coating material 3 provided between the first liquid roll 11 and the second liquid roll 12 is pasted on the entire surface of the applying roll 13 through rotation of each of the rolls 11 to 13. The applying roll 13 has a width W1 which is narrower than a width W of the plate 1. Thus, when the applying rolls 13 provided over and under the plate 1 are rotated on the two surfaces of the plate 1, the coating material 3 is applied to the two surfaces of the plate 1 while leaving the holding area 2 in proximity of the side edges of the plate 1 with respect to a travel direction thereof without the coating material 3. In this manner, the holding area 2 is formed on side ends of the plate 1.

In the third embodiment, the holding area 2 is formed not only in proximity of the side edges, but also at the front end and the rear end of the plate 1. In order to form the holding area 2 at the front and rear ends in the third embodiment, the applying rolls 13 are not in a constant contact with the plate 1. Instead, the contact of the applying rolls 13 with the plate 1 is controlled according to the travel of the plate 1.

FIGS. 12A through 12D are illustrative drawings for explaining a mechanism by which the applying rolls 13 of the two-surface applying device 10C move up and down according to the travel of the plate 1. As in the first embodiment, the conveying rolls 14A on a side of inserting the plate 1 have a width about the same as that of the plate 1, and hold the plate 1 by contacting the entire surfaces thereof. On the other hand, the conveying rolls 14B on a side of ejecting the plate 1 have a shape such that they hold only the holding area 2 of the plate 1.

As shown in FIG. 12A, when a front edge of the plate 1 is inserted, the applying rolls 13 are in an open position. As shown in FIG. 12B, after the front edge of the plate 1 passes by, the applying rolls 13 are closed to clamp the plate 1 so as to apply the coating material 3 to both surfaces of the plate 1. Then, as shown in FIG. 10C, while the plate 1 travels between the applying rolls 13, the applying rolls 13 are in a closed position to continuously apply the coating material 3. As shown in FIG. 12D, when a rear end of the plate 1 comes close to the applying rolls 13, the applying rolls 13 are opened again so as to form the holding area 2 at the rear end of the plate 1.

In the third embodiment described above, the two sets of the first liquid roll 11, the second liquid roll 12, and the applying roll 13 constitute the applying means, and the conveying rolls 14B constitute the conveying means. In the two-surface applying device 10C according to the third embodiment, the applying rolls 13 having a width narrower than that of the plate 1 are used, and the contact of the applying rolls 13 with the plate 1 is controlled according to the travel of the plate 1. Thus, the holding area 2 is formed in proximity of the perimeter of the plate 1. Also, the two-surface applying device 10C can convey the plate 1 by using the conveying rolls 14B for holding the holding area 2 without touching the coating material 3. Thus, both surfaces of the plate 1 are coated simultaneously in a good condition, and an automation of the manufacturing line can be achieved to boost the productivity.

FIGS. 13A and 13B and FIGS. 14A through 14C are illustrative drawings showing a fourth embodiment of a device for applying the coating material 3 to both surfaces of the plate 1 according to the first principle of the present invention. In the fourth embodiment, the applying rolls 13 or 16 used in the first through third embodiments can be easily removed from the. two-surface applying device.

Figure 13A:
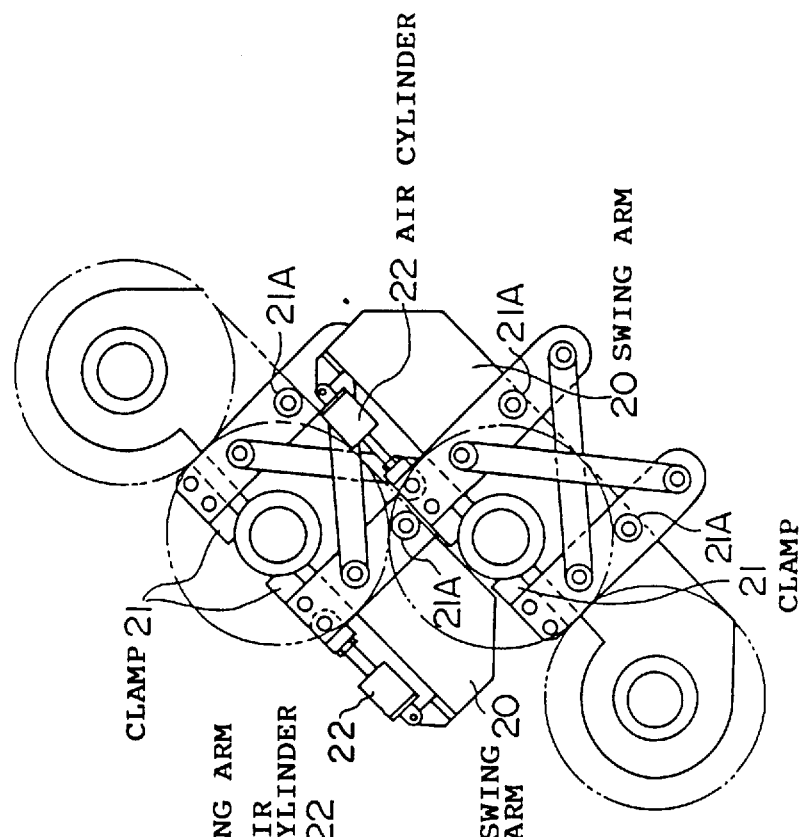
FIGS. 13A and 13B are illustrative drawings showing part of a two-surface applying device according to a fourth embodiment of the first principle.
Figure 13B:
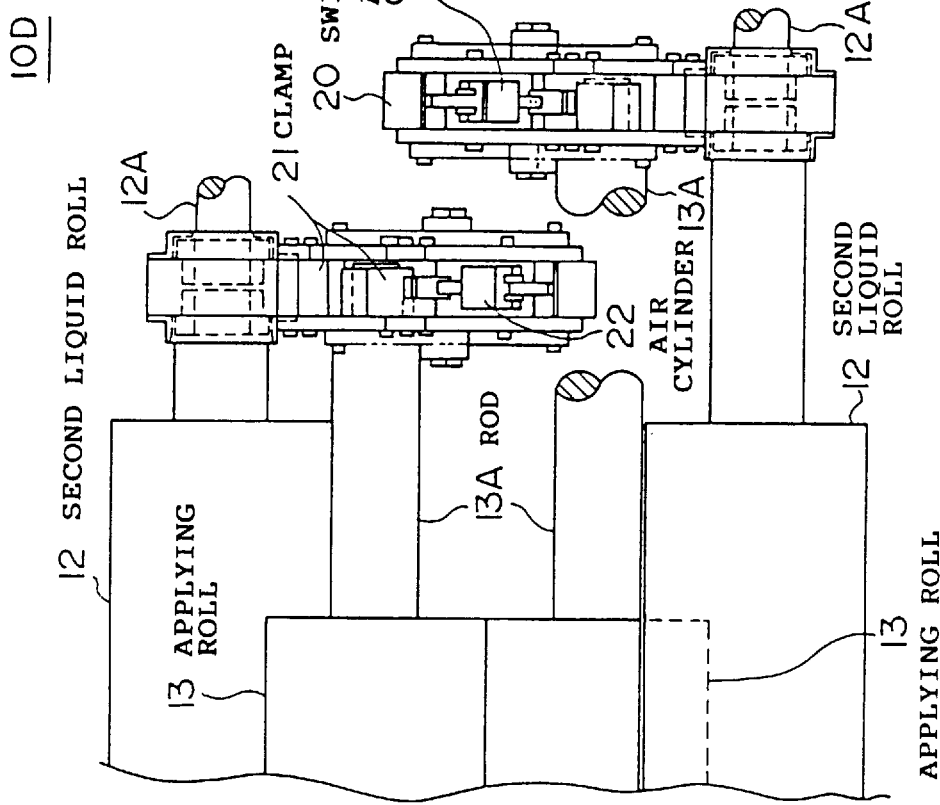

FIGS. 13A and 13B are illustrative drawings showing part of the two-surface applying device 10D according to the fourth embodiment. The two-surface applying device 10D is the same as the two-surface applying devices of the first through third embodiments except for the part shown in FIGS. 13A and 13B, and a description thereof will be omitted.

As shown in FIGS. 13A and 13B, in the fourth embodiment, the second liquid roll 12 (or the liquid roll 15) along with the applying roll 13 (or the applying roll 16) is attached to a swing arm 20. The swing arm 20 fixes a rod 12A of the second liquid roll 12 such that the second liquid roll 12 is rotatable. A rod 13A of the applying roll 13 is fixed by the swing arm 20 and clamps 21 such that the applying roll 13 is rotatable. The clamps 21 are fixed to the swing arm 20 such that the clamps 21 are rotatable about fixed points 21A. One arm of the clamp 21 is fixedly attached to one end of the air cylinder 22, and the other end of the air cylinder 22 is rotatably attached to the swing arm 20.

As shown in FIG. 14A, while the two-surface applying device 10D is applying the coating material 3 to the plate 1, the upper and lower swing arms 20 are closed. As shown in FIG. 14B, when the swing arms 20 are opened, they are in a horizontal position. As shown in FIG. 14C, the applying rolls 13 can be removed by opening the clamps 21 while the swing arms 20 are in the horizontal position. Since the swing arms 20 are in the horizontal position, the applying roll 13 will not fall off from the swing arms 20 by accident even when the clamps 21 are opened. Here, the fact that the swing arms 20 are in an open position is not a necessary condition for removing the applying roll 13.

In the fourth embodiment of the two-surface applying device 10D, the clamps 21 which can be opened or closed fix the applying rolls 13 rotatably to the swing arms 20, and the applying rolls 13 can be removed from the two-surface applying device 10D by opening the clamps 21. Thus, it is easy to exchange the applying rolls 13 which are defective or worn. Also, an exchange to applying rolls having a different width allows different types of plates to be readily handled. Furthermore, there is no need to stop the two-surface applying device for a long time during the exchange, thus enhancing the productivity.

Figure 15:
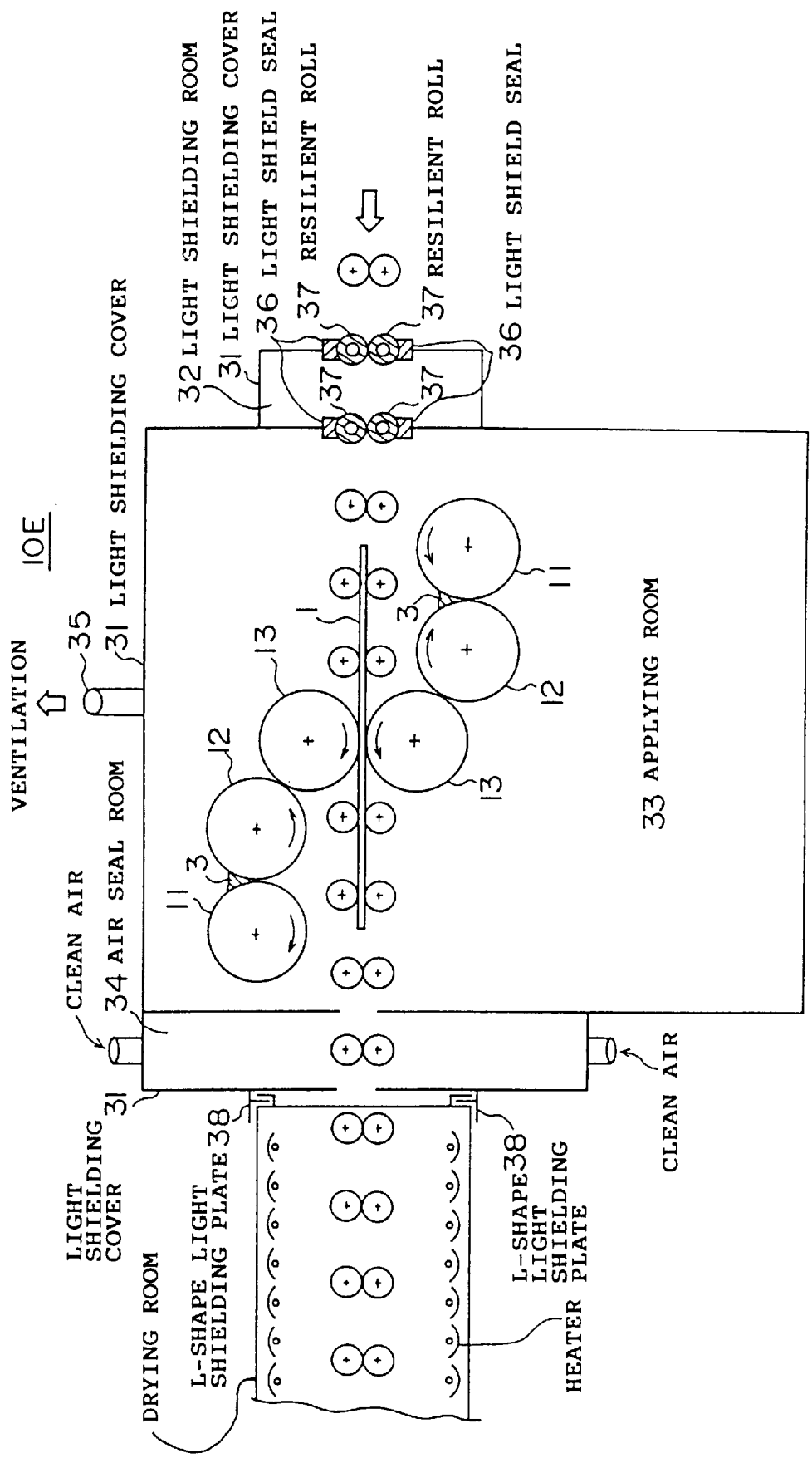
FIG. 15 is an illustrative drawing showing a fifth embodiment of a two-surface applying device according to the first principle for applying the coating material to both surfaces of a plate.

FIG. 15 is an illustrative drawing showing a fifth embodiment of a two-surface applying device for applying the coating material 3 to both surfaces of the plate 1. The two-surface applying device of the fifth embodiment differs from the two-surface applying devices of the first through fourth embodiments only in that a light shielding mechanism is provided. In FIG. 15, the same elements as those of the previous embodiments are referred to by the same numerals, and a description thereof will be omitted.

In FIG. 15, the two-surface applying device 10E includes a light shielding cover 31, a light shielding room 32, an applying room 33, an air seal room 34, a ventilation opening 35, light shield seals 36, resilient rolls 37, and L-shape light shielding plates 38. The light shielding cover 31 covers the two-surface applying device 10E in its entirety to prevent light from entering inside. The light shield seals 36 and the resilient rolls 37 are provided at an entrance opening and at an exit opening of the light shielding room 32, so that the plate 1 can travel without allowing light to enter inside the light shielding room 32. The resilient rolls 37 are made of a material having a high elasticity, and rotate by contacting the plate 1. Thus, the plate 1 enters the applying room 33 without generating a gap between the plate 1 and the resilient rolls 37. An air pressure inside the applying room 33 is lowered by taking air out through the ventilation opening 35 in order to ventilate inside the applying room 33. Clean air is supplied into the applying room 33 from the air seal room 34. The L-shape light shielding plates 38 are attached to an end of a drying room, so that the plate 1 is not exposed to light when entering the drying room.

In the two-surface applying device 10E of the fifth embodiment, the light shielding cover 31 shields light, and the resilient rolls 37 and the L-shape light shielding plates 38 enable the plate 1 to enter and exit from the device without being exposed to light. Thus, there is no need to turn the room for installing the two-surface applying device 10E into a darkroom. Therefore, installing the device requires less investment, and moving the device to another place is easier.

Figures 16A, 16B:
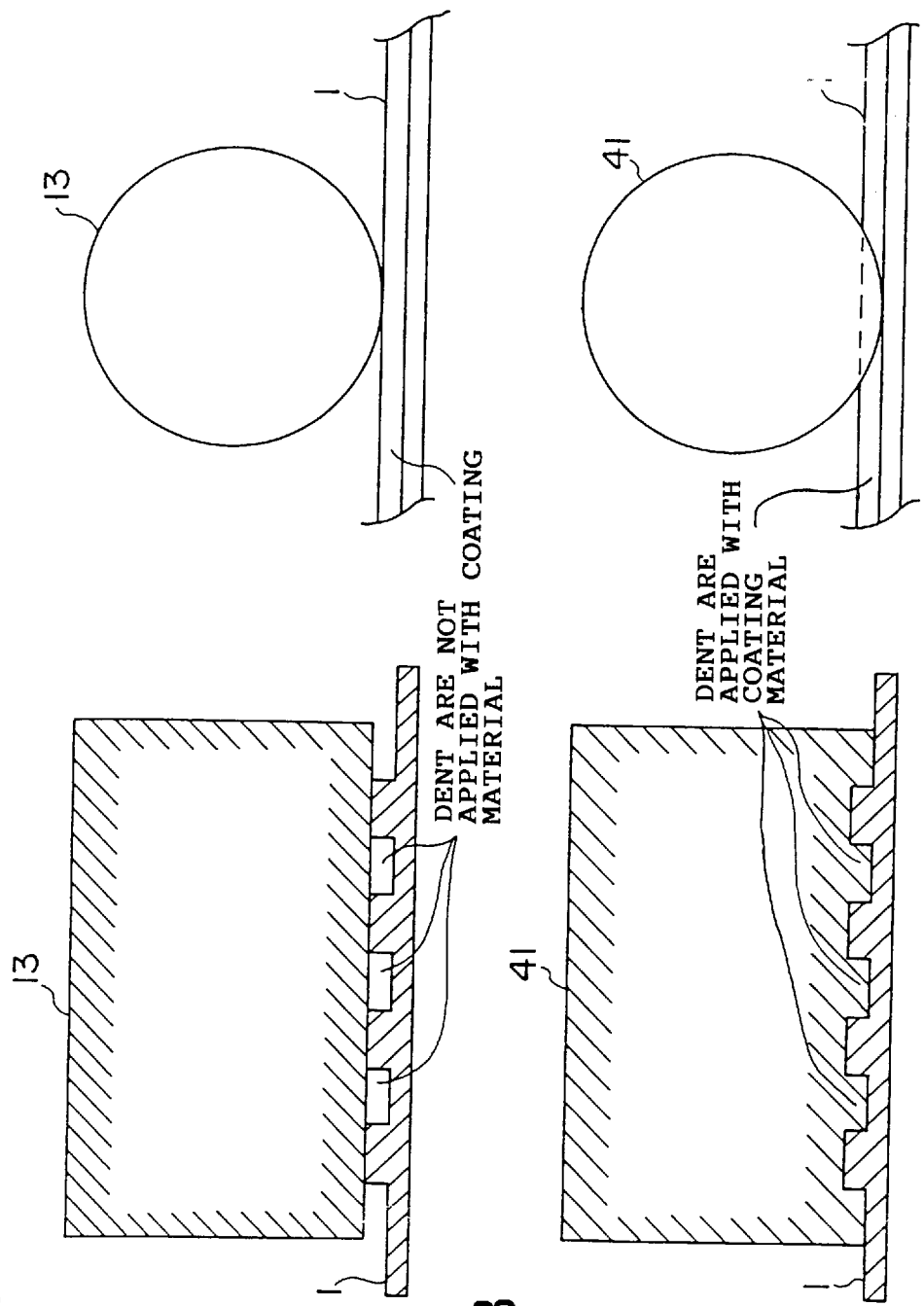
FIGS. 16A and 16B are illustrative drawings showing a sixth embodiment of a two-surface applying device for applying the coating material to both surfaces of a plate according to the first principle.

FIGS. 16A and 16B are illustrative drawings showing a sixth embodiment of a two-surface applying device for applying the coating material 3 to both surfaces of the plate 1. The two-surface applying device of the sixth embodiment differs from the two-surface applying devices of the first through fifth embodiments only in that the applying rolls are made of a soft material. In FIGS. 16A and 16B, the same elements as those of the previous embodiments are referred to by the same numerals, and a description thereof will be omitted.

FIG. 16A shows an example in which the applying roll 13 made of a hard material contacts the plate 1 having peaks and valleys on a surface thereof. As shown in FIG. 16A, a surface of the applying roll 13 is kept flat despite the peaks and the valleys of the surface of the plate 1. Thus, when a large amount of a coating material is pasted on the applying roll 13, the valleys of the surface of the plate 1 are covered with thick coating material while the peaks of the surface are covered with thin coating material. When a small amount of the coating material is pasted on the applying roll 13, the peaks of the surface of the plate 1 are covered by the coating material but the valleys are not coated at all. In either case, the coating material is not uniformly coated on the surface of the plate 1.

FIG. 16B shows an example in which an applying roll 41 made of a soft material contacts the plate 1 having peaks and valleys on a surface thereof. Silicon rubber or the like is used as a roll material for the applying roll 41. It is preferable that the roll material has a dense texture on the surface so that a coating material does not permeate into the inside of the applying roll 41. As shown in FIG. 16B, the surface of the applying roll 41 made of a soft material can be distorted according to the peaks and the valleys of the plate 1, so as to touch the valleys as much the same manner as touch the peaks. Thus, the coating material is uniformly applied to the surface of the plate 1 having peaks and valleys.

In the two-surface applying device of the sixth embodiment, the applying roll 41 is made of a soft material, so that a surface thereof can adapt to peaks and valleys of a surface of the plate 1. Thus, a coating material is uniformly applied to the surface of the plate 1 having the peaks and the valleys. Therefore, a coating material can be applied to a printed-circuit board on which a circuit has already been formed.

FIG. 17 and FIGS. 18A and 18B are illustrative drawings showing a seventh embodiment of a two-surface applying device for applying the coating material 3 to both surfaces of the plate 1. A two-surface applying device 10F of the seventh embodiment differs from the two-surface applying devices of the first through sixth embodiments only in that the applying rolls are made of a porous material.

In FIG. 17, an applying roll 51 is made of a porous material through which the coating material 3 can permeate. Here, sponge, polyurethane foam, etc., can be used as the porous material. In FIG. 17, a coating material pump 52 takes out the coating material 3 from a coating material tank 53, and injects it into the applying roll 51. A valve 54 is provided between the coating material pump 52 and the coating material tank 53, and a coating-material-amount adjusting valve 55 is provided between the coating material pump 52 and a rotatable joint 56. The rotatable joint 56 serves as a joint to rotatably mount a hollow rod 51A of the applying roll 51 to a pipe.

As shown in FIGS. 18A and 18B, the applying roll 51 has a hollow inside structure, and a porous material 58 is wrapped around an applying-roll core 57. A number of through-holes 59 are formed through the body of the applying-roll core 57, so that the coating material 3 can be forced out through the through-holes 59 from the inside to the outside of the applying-roll core 57 when a pressure is applied to the coating material 3. The coating material 3 pushed out from the through-holes 59 permeates into the porous material 58 so as to be distributed over the entire surface of the applying roll 51.

In the two-surface applying device 10F of the seventh embodiment, the applying roll 51 includes the applying-roll core 57 having the hollow inside structure and the porous material 58 wrapped therearound. By applying a pressure to the coating material 3 through the coating material pump 52, the coating material 3 is forced out through the through-holes 59 from the inside of the applying-roll core 57, and, then, permeates into the porous material 58. Thus, an amount of the coating material 3 permeating into the porous material 58 can be controlled by the pressure applied by the coating material pump 52, so that a thickness of the coating material 3 applied to the plate 1 can be adjusted.

Figure 19:
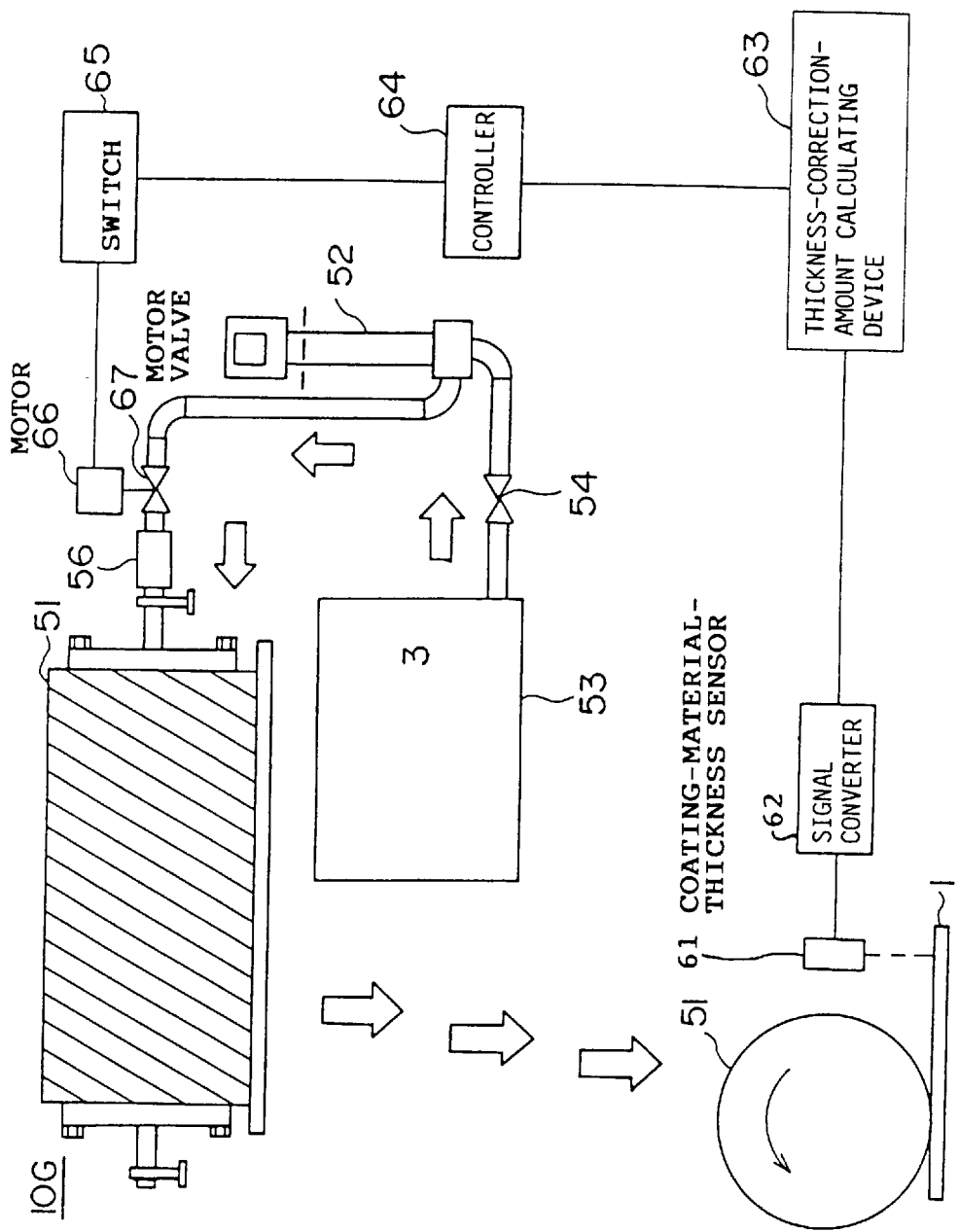
FIG. 19 is an illustrative drawing showing an eighth embodiment of a two-surface applying device for applying the coating material to both surfaces of a plate according to the first principle.
Figure 20:
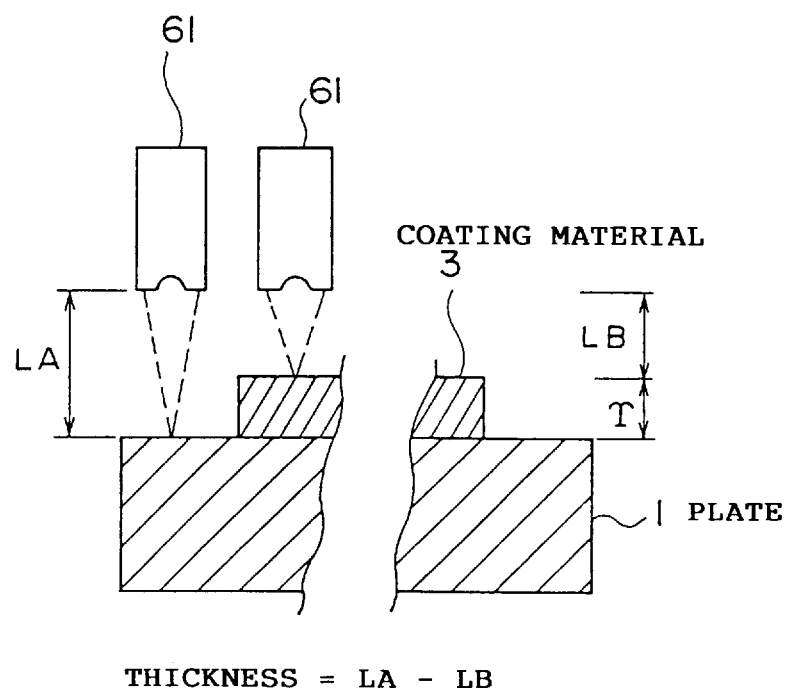
FIG. 20 is an illustrative drawings showing a coating-material-thickness sensor of the two-surface applying device of FIG. 19.

FIG. 19 and FIG. 20 are illustrative drawings showing an eighth embodiment of a two-surface applying device for applying the coating material 3 to both surfaces of the plate 1. A two-surface applying device 10G of the eighth embodiment differs from the two-surface applying devices of the seventh embodiment in that a thickness of the coating material 3 on the plate 1 can be automatically controlled in a continuous manner. In FIG. 19 and FIG. 20, the same elements as those of the previous embodiments are referred to by the same numerals, and a description thereof will be omitted.

In FIG. 19, the two-surface applying device 10G includes a coating-material-thickness sensor 61, a signal converter 62, a thickness-correction-amount calculating device 63, a controller 64, a switch 65, a motor 66, and a motor valve 67. The coating-material-thickness sensor 61 measures a thickness of the coating material 3 applied by the applying roll 51 in a noncontacting manner at a point where the plate 1 is ejected from the applying roll 51.

FIG. 20 shows an example of the coating-material-thickness sensor 61. As shown in FIG. 20, the coating-material-thickness sensor 61 measures a distance of an opposing plane by emitting laser light and receiving reflected light. A distance LA of a reference plane and a distance LB of a surface of the coating material 3 are measured, and a difference between these two is a thickness of the coating material 3. A method of measuring the thickness in a noncontacting manner as in this example, including a method of measuring a change in the static-charge capacity affected by a change in the thickness, is well known to those in the art and well within ordinary skills in the art.

In FIG. 19, a signal generated by the coating-material-thickness sensor 61 is converted by the signal converter 62 into a digital signal which is applicable to the thickness-correction-amount calculating device 63. The thickness-correction-amount calculating device 63 calculates the thickness, and obtains a correction amount (difference between a desired thickness and the measured thickness) corresponding to the calculated thickness. A signal corresponding to the correction amount is sent to the controller 64, which controls the switch 65. The motor 66 is controlled by on or off of the switch 65 so as to adjust the motor valve 67 according to the correction amount. When the correction amount is positive (i.e., the measured thickness is smaller than the desired thickness), the motor valve 67 is further opened by an amount corresponding to the correction amount. On the other hand, when the correction amount is negative (i.e., the measured thickness is larger than the desired thickness), the motor valve 67 is opened less by an amount corresponding to the correction amount. In this manner, the amount of the coating material 3 injected into the applying roll 51 is controlled so that the thickness of the coating material 3 on the plate 1 is adjusted.

In the two-surface applying device 10G of the eighth embodiment, the thickness of the coating material 3 is measured by the coating-material-thickness sensor 61, the correction amount is calculated based on the measured thickness, and the motor valve 67 is controlled based on the correction amount. Thus, the thickness of the coating material 3 on the plate 1 is automatically controlled in a continuous manner, so that a desired thickness is stably obtained. The continuous and automatic control can enhance the productivity, and can provide a stable sensitivity for the photosensitizer.

Figure 21:
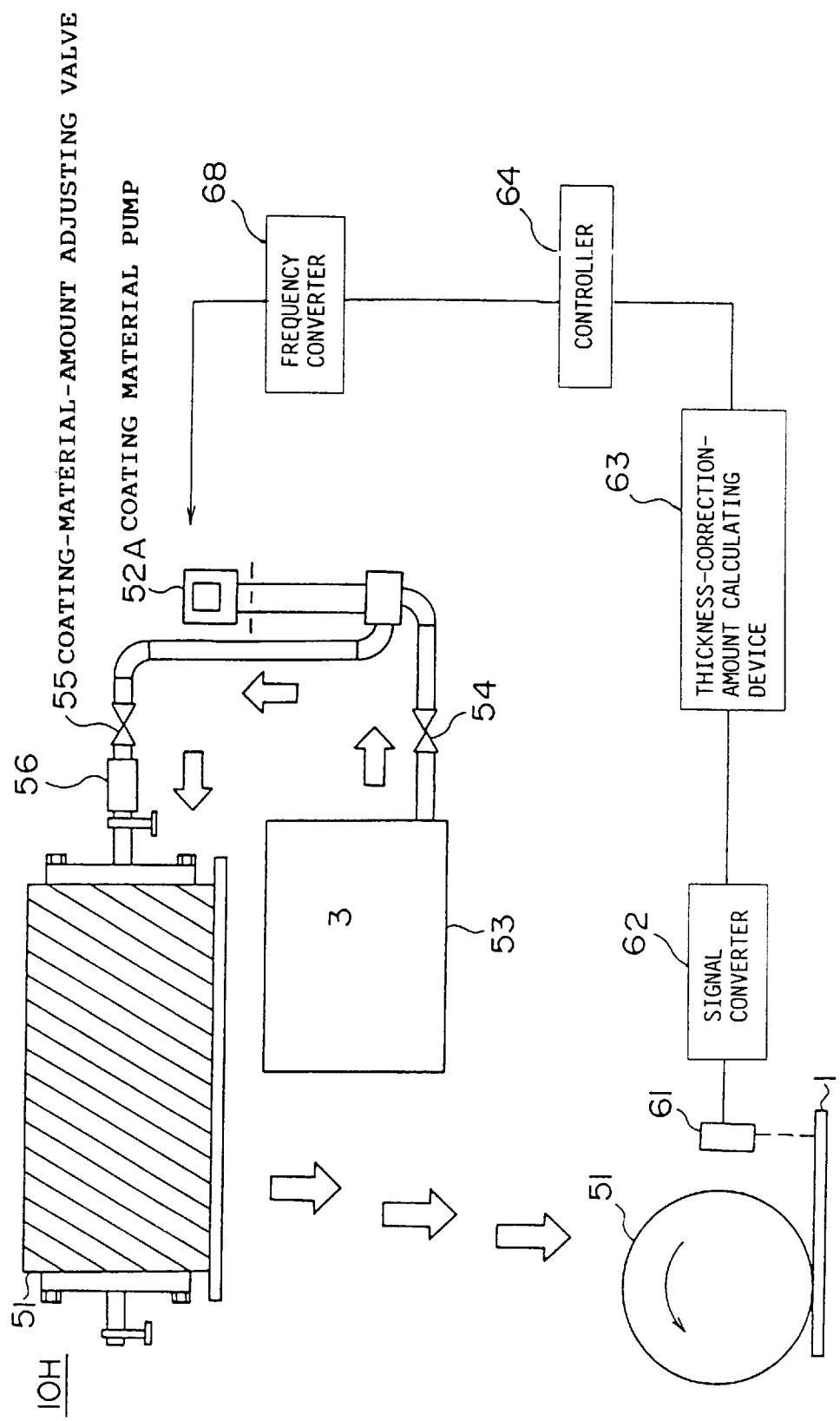
FIG. 21 is an illustrative drawing showing a ninth embodiment of a two-surface applying device for applying the coating material to both surfaces of a plate according to the first principle.

FIG. 21 is an illustrative drawing showing a ninth embodiment of a two-surface applying device for applying the coating material 3 to both surfaces of the plate 1. A two-surface applying device 10H of the ninth embodiment differs from the two-surface applying device of the eighth embodiment only in a method of controlling the thickness of the coating material 3. In FIG. 21, the same elements as those of FIG. 19 are referred to by the same numerals, and a description thereof will be omitted.

In FIG. 21, the two-surface applying device 10H includes a frequency converter 68 replacing the switch 65 of FIG. 19, and includes the coating-material-amount adjusting valve 55 replacing the motor valve 67. In order to achieve a desired thickness, the controller 64 controls the frequency converter 68 to adjust based on the correction amount the amount of the coating material 3 pumped by the coating material pump 52A. When the correction amount is positive, a frequency is increased by an amount corresponding to the correction amount. When the correction amount is negative, a frequency is decreased by an amount corresponding to the correction amount. In this manner, the amount of the coating material 3 injected into the applying roll 51 is controlled so that the thickness of the coating material 3 on the plate 1 is adjusted.

In the two-surface applying device 10H of the ninth embodiment, the thickness of the coating material 3 is measured by the coating-material-thickness sensor 61, the correction amount is calculated based on the measured thickness, and the coating material pump 52A is controlled based on the correction amount. Thus, the thickness of the coating material 3 on the plate 1 is automatically controlled in a continuous manner, so that a desired thickness is stably obtained. The continuous and automatic control can enhance the productivity, and can provide a stable sensitivity for the photosensitizer.

FIG. 22 through FIG. 26 are illustrative drawings showing a tenth embodiment of a two-surface applying device for applying the coating material 3 to both surfaces of the plate 1. A two-surface applying device 10I of the tenth embodiment automatically controls the thickness in a continuous manner by adjusting a pressure applied by the applying roll to the plate 1. In FIG. 22 through FIG. 26, the same elements as those of the previous embodiments are referred to by the same numerals, and a description thereof will be omitted.

Figure 22:
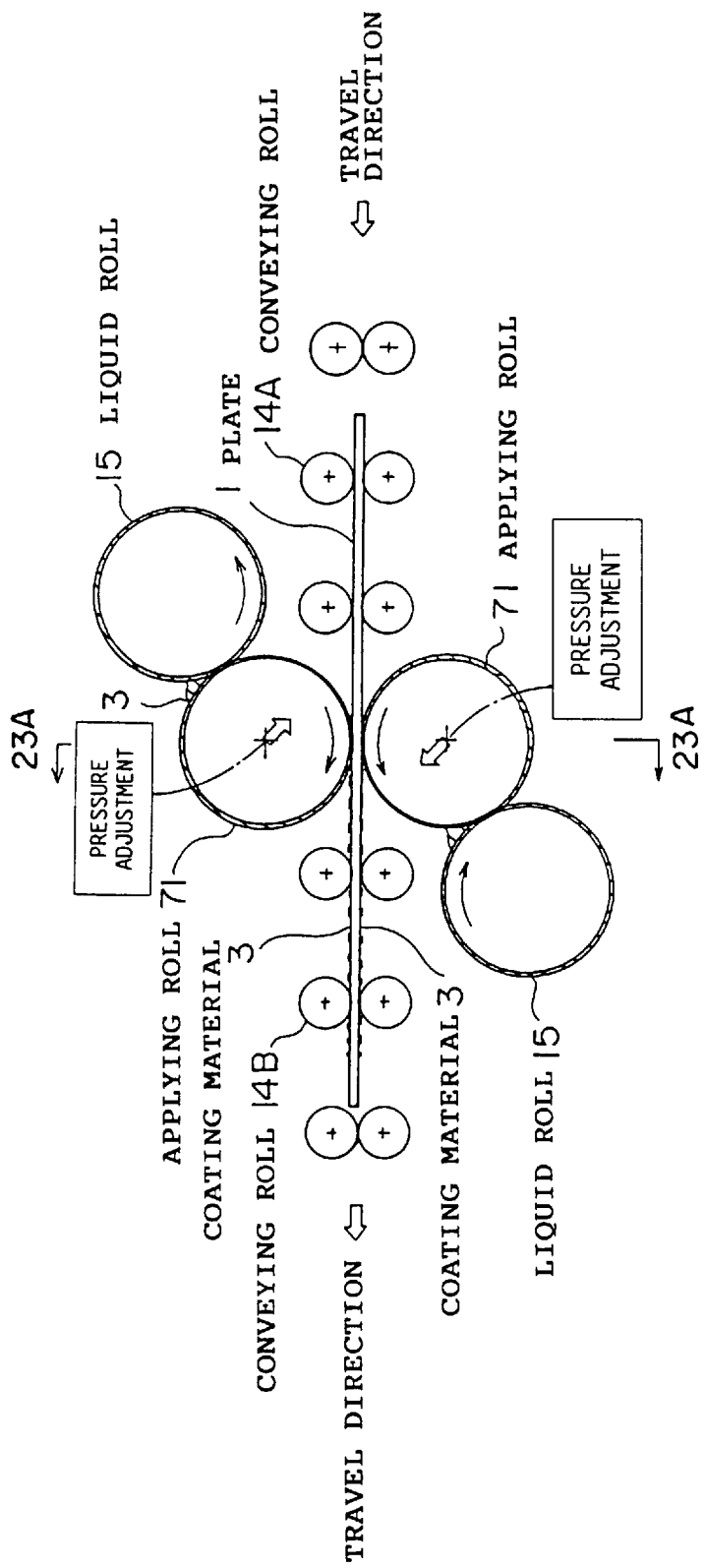
FIG. 22 is an illustrative drawing showing an adjustment of a pressure applied by an applying roll to a plate in a two-surface applying device according to a tenth embodiment of the first principle.

FIG. 22 is an illustrative drawing showing an adjustment of the pressure applied by the applying roll 71 to the plate 1. As shown in FIG. 22, the pressure applied by the applying roll 71 to the plate 1 can be adjusted by controlling a force applied to the applying roll 71 in a direction shown by arrows. As can be seen in FIG. 22, the method of supplying the coating material 3 is the same as in the first and second embodiments, i.e., the coating material 3 is provided between the rolls.

FIGS. 23A and 23B are partially enlarged cross-sectional views of the applying roll 71 and the plate 1 taken along a line A–A' of FIG. 22, and show a surface of the applying roll 71 pushed against the plate 1. As shown in FIGS. 23A and 23B, the surface of the applying roll 71 is made of the same soft material as that of the sixth embodiment, and has a number of fine grooves 72 formed thereon in a rotation direction of the applying roll 71. As shown in FIG. 23A, when a pressure applied by the applying roll 71 to the plate 1 is strong, ridges 73 between the grooves 72 are crushed so that the grooves 72 becomes shallow. In this case, the amount of the coating material 3 applied to the plate 1 is small. On the other hand, as shown in FIG. 23B, when a pressure applied by the applying roll 71 to the plate 1 is weak, the ridges 73 between the grooves 72 keep their original shape so that the grooves 72 are deep. In this case, the amount of the coating material 3 applied to the plate 1 is large. Here, chunks of the coating material 3 corresponding to each of the grooves 72 are connected with each other by surface tension. In this manner, the use of the applying roll 71 having the grooves 72 enables the pressure applied by the applying roll 71 to be reflected in the thickness of the coating material 3.

Figure 25:
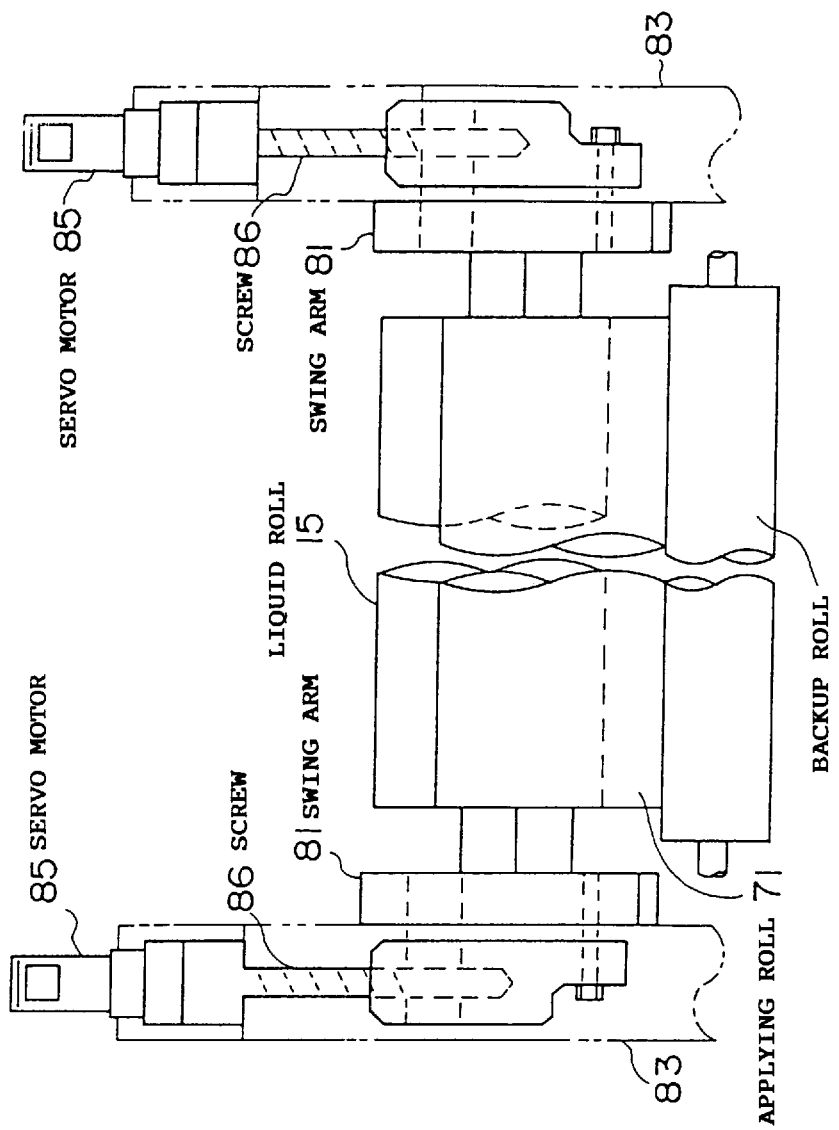
FIG. 25 is an illustrative drawing showing a mechanism of holding the applying roll which can adjust the pressure applied by the applying roll.

FIG. 24 and FIG. 25 are illustrative drawings showing a mechanism of holding the applying roll which can adjust the pressure applied by the applying roll 71. In FIG. 24 and FIG. 25, one end of a swing arm 81 is mounted on a body 83 so as to be rotatable about a fixed point 82. The other end of the swing arm 81 has a connecting point 84 to which a connecting part 88 is rotatably attached. A servo motor 85 is fixed to the body 83, and a screw 86 is fixedly attached to a rotating rod of the servo motor 85. The screw 86 is fitted into a tapped hole 87 formed in the connecting part 88, so that rotation of the screw 86 makes the connecting part 88 move in a direction A shown in FIG. 24. Thus, rotation of the servo motor 85 moves the swing arm 81 in a direction B.

Figure 26:
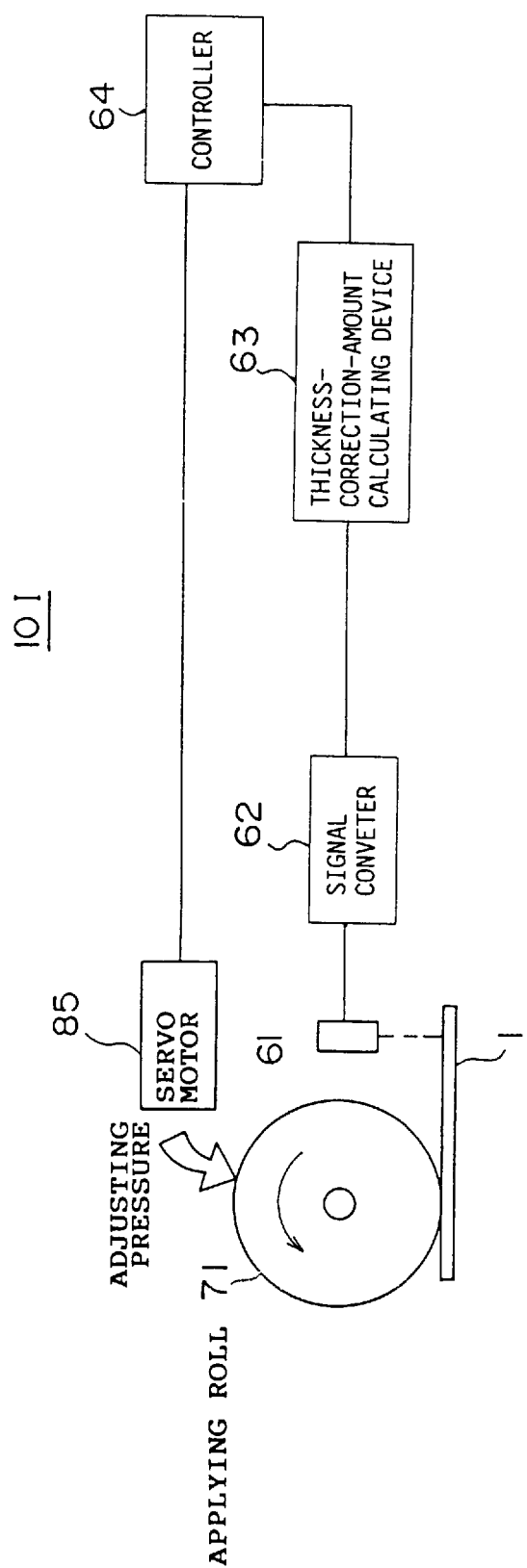
FIG. 26 is an illustrative drawing showing a control system for automatically controlling in a continuous manner the pressure applied by the applying roll.

FIG. 26 is an illustrative drawing showing a control system for automatically controlling in a continuous manner the pressure applied by the applying roll 71. The control system of FIG. 26 is almost identical to the control systems shown in FIG. 19 and FIG. 21, and a description of the same elements will be omitted. In order to achieve a desired thickness, the controller 64 controls the servo motor 85 to adjust the pressure applied by the applying roll 71. When the correction amount is positive (the measured thickness is smaller than the desired thickness), the pressure is decreased by an amount corresponding to the correction amount. When the correction amount is negative (the measured thickness is greater than the desired thickness), the pressure is increased by an amount corresponding to the correction amount. In this manner, the thickness of the coating material 3 on the plate 1 is adjusted.

In the two-surface applying device 10I of the tenth embodiment, the thickness of the coating material 3 is measured by the coating-material-thickness sensor 61, the correction amount is calculated based on the measured thickness, and the pressure applied by the applying roll 71 is controlled based on the correction amount. Thus, the thickness of the coating material 3 on the plate 1 is automatically controlled in a continuous manner, so that a desired thickness is stably obtained. The continuous and automatic control can enhance the productivity, and can provide a stable sensitivity for the photosensitizer.

FIGS. 27A and 27B through FIGS. 29A and 29B are illustrative drawings showing a second principle of a method and a device for drying a coating material on both surfaces of the plate.

Figure 27A:
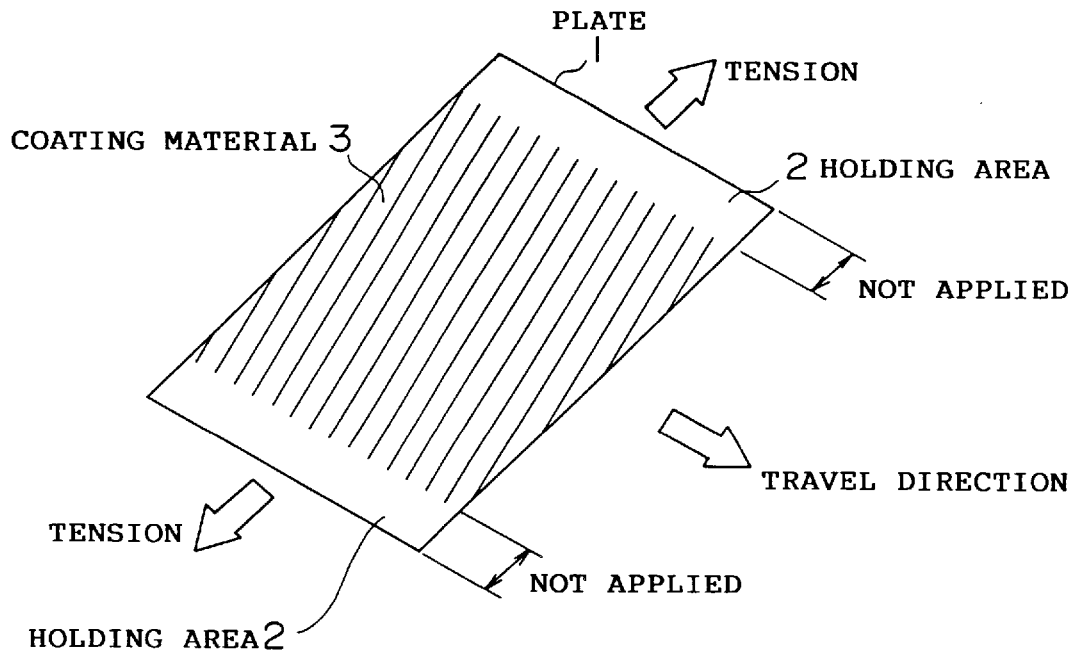
FIGS. 27A and 27B are illustrative drawings showing a second principle of a method and device for drying a coating material on both surfaces of a plate.
Figure 27B:
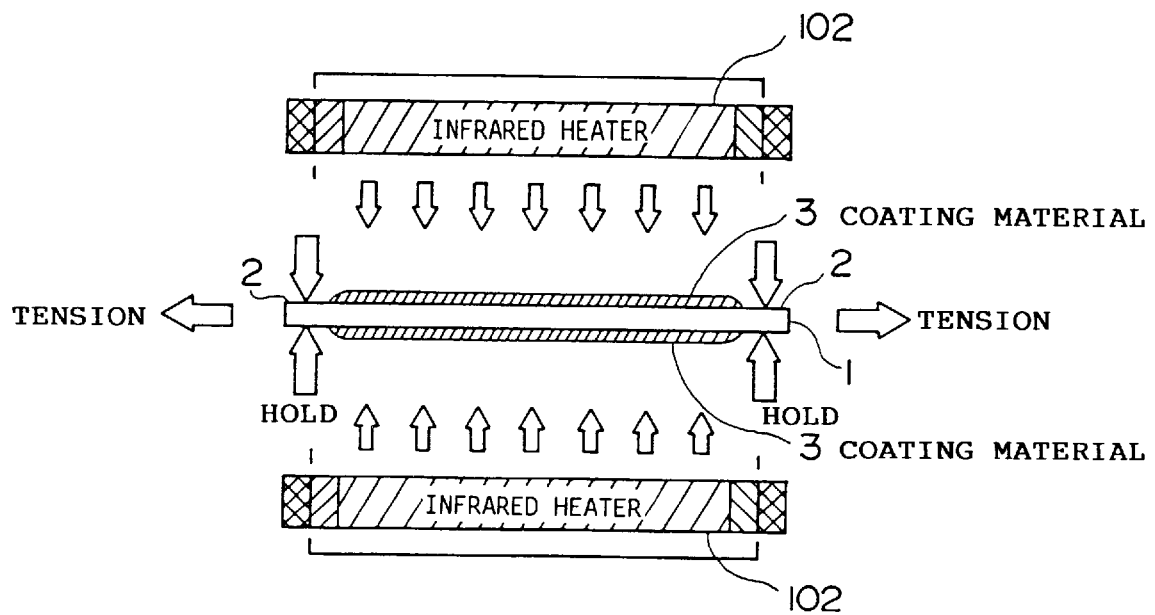

As shown in FIG. 27A, the holding area 2 provided in proximity of the side edges of the plate 1 with respect to the travel direction thereof is held, and the plate 1 is conveyed while being stretched in a direction perpendicular to the travel direction. A two-surface drying device including conveying means for conveying the plate 1 in this manner dries the coating material 3 from both surfaces of the plate 1 by using drying means 102, as shown in FIG. 27B.

Figure 28A:
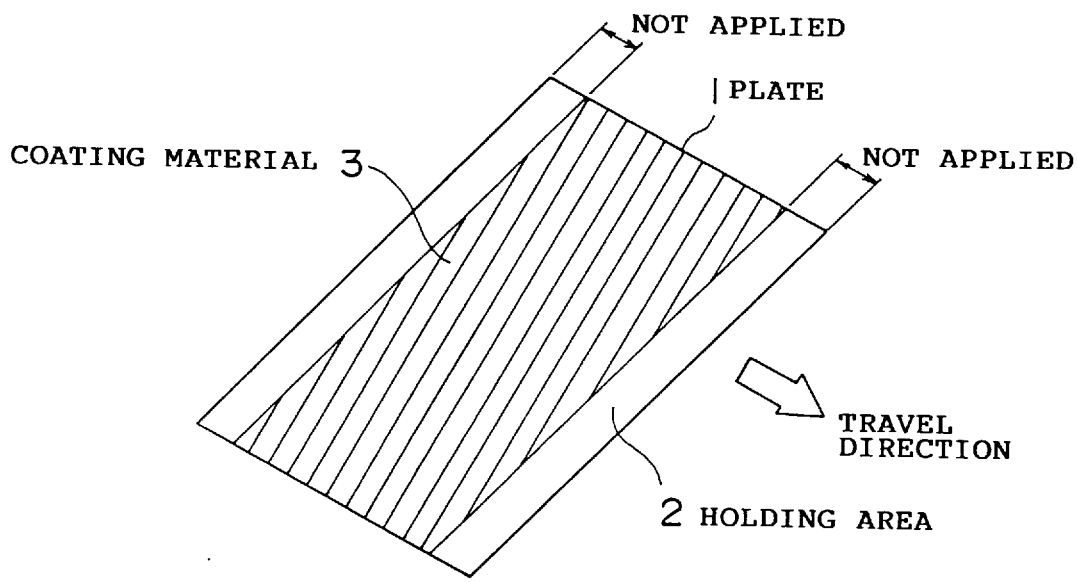
FIGS. 28A, 28B and 28C are illustrative drawings showing the second principle of the present invention.
Figure 28B:
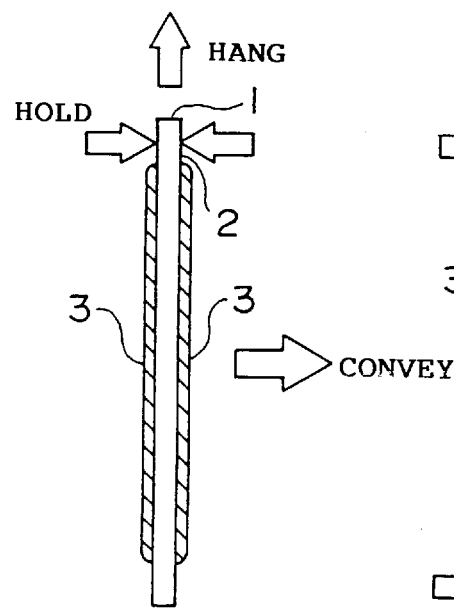
Figure 28C:
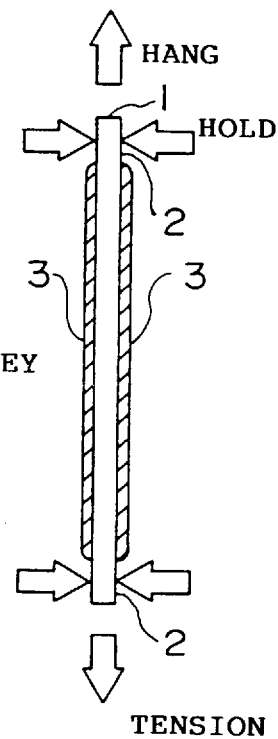

In another configuration of FIG. 28A, the holding area 2 is provided at the front and rear ends of the plate 1 with respect to the travel direction thereof. As shown in FIG. 28B, conveying means hangs the plate 1 by holding an end of the holding area 2. While the plate 1 is hanging, a two-surface drying device dries the coating material 3 from both surfaces of the plate 1 by using the drying means 102. Or as shown in FIG. 28C, conveying means holds both ends of the holding areas 2, and applies a tension in a vertical direction to the plate 1. While the plate 1 is stretched, a two-surface drying device dries the coating material 3 from both surfaces of the plate 1 by using the drying means 102.

As shown in yet another configuration of FIG. 29A, the holding area 2 provided in proximity of the perimeter of the plate 1 is held at the side ends with respect of the travel direction, and the plate 1 is conveyed while being stretched in a direction perpendicular to the travel direction. A two-surface drying device including conveying means for conveying the plate 1 in this manner dries the coating material 3 from both surfaces of the plate 1 by using the drying means 102, as shown in FIG. 29B. Or as shown in FIG. 29C, conveying means hangs the plate 1 by holding one end of the holding area 2. While the plate 1 is hanging, a two-surface drying device dries the coating material 3 from both surfaces of the plate 1 by using the drying means 102. Or as shown in FIG. 29D, conveying means holds both ends of the holding areas 2, and applies a tension in a vertical direction to the plate 1. While the plate 1 is stretched, a two-surface drying device dries the coating material 3 from both surfaces of the plate 1 by using the drying means 102.

According to the second principle described above, the plate 1 with coating material 3 applied to both surfaces thereof is stretched from opposite ends thereof, or is stretched by gravity while being hung from one end thereof. These tensions prevent the plate 1 from being bent by a difference in the thermal expansion coefficients between the plate 1 and the coating material 3 when the coating material 3 is dried from both surfaces of the plate 1.

Figure 30A:
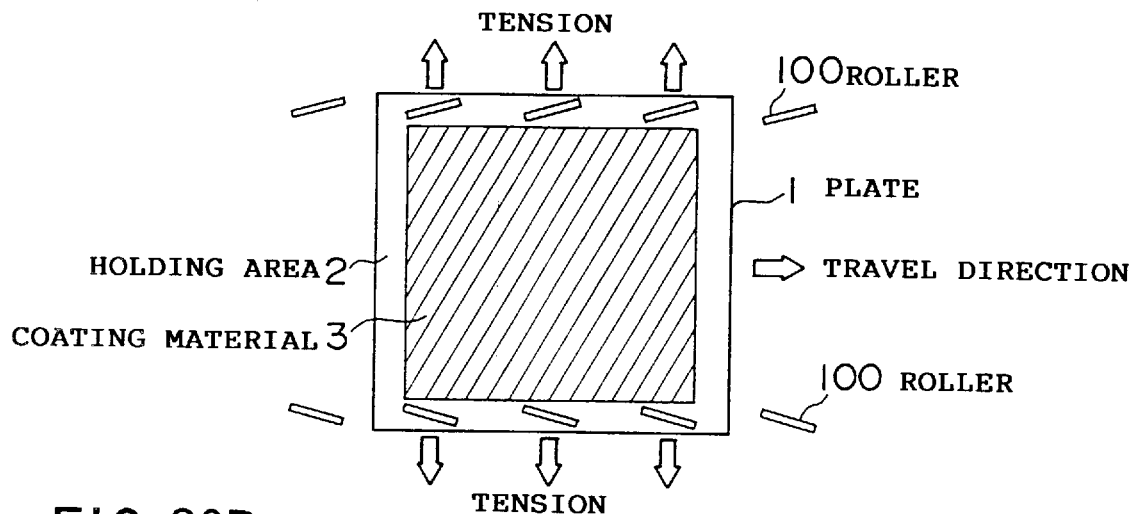
FIGS. 30A, 30B and 30C are illustrative drawings showing a first embodiment of a two-surface drying device for drying the coating material applied on both surfaces of a plate according to the second principle.
Figure 30B:
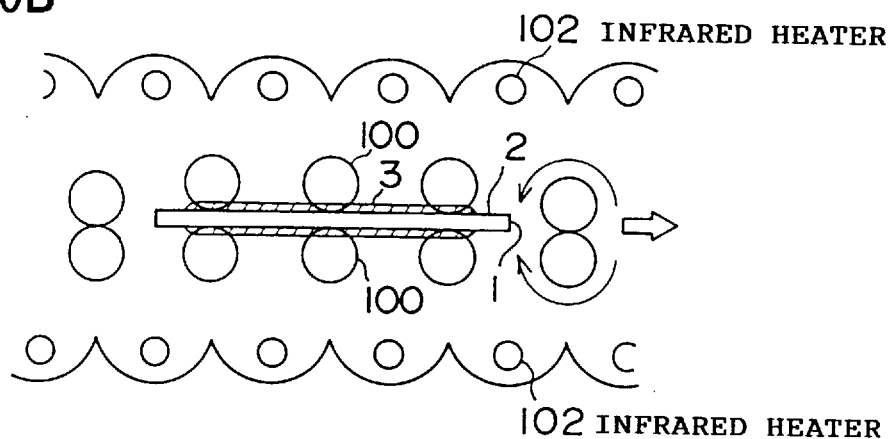
Figure 30C:
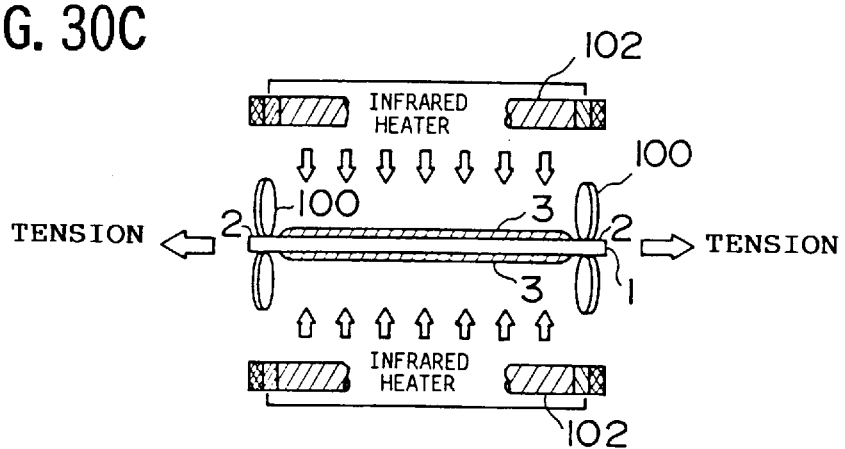

FIGS. 30A through 30C are illustrative drawings showing a first embodiment of a two-surface drying device for drying the coating material 3 applied on both surfaces of the plate 1 according to the second principle of the present invention. In the first embodiment of the second principle, the plate 1 is held in a horizontal position, and a tension is applied in a direction perpendicular to the travel direction.

As shown in a plan view of FIG. 30A, the plate 1 is positioned in a horizontal direction, and the holding area 2 thereof is held by the rollers 100 at the side ends of the plate 1. The rollers 100 rotate as shown in FIG. 30B to convey the plate 1 in a direction shown by an arrow. As shown in FIG. 30A, the rollers 100 are arranged at an angle with the travel direction of the plate 1. Accordingly, rotation of the rollers 100 not only apply a force for conveying the plate 1 in the travel direction, but also apply a tension in a direction perpendicular to the travel direction. While the tension is applied to the plate 1 in this manner, as shown in FIG. 30C, infrared heaters (drying means) 102 provided over and under the plate 1 illuminate infrared light onto both surfaces of the plate 1. This infrared light dries the coating material 3 applied to both surfaces of the plate 1.

In the first embodiment of the second principle, the plate 1 is conveyed in the travel direction, and, also, is stretched in the direction perpendicular to the travel direction by the rollers 100 provided at an angle. Thus, when infrared light from the infrared heaters 102 dries the coating material 3, the plate 1 is free of bending caused by a difference in the thermal expansion coefficients.

Figure 31A:
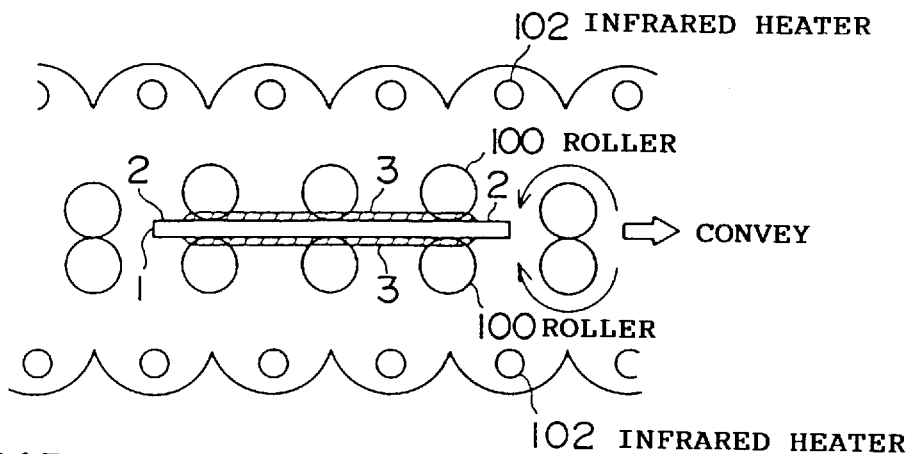
FIGS. 31A, 31B and 31C are illustrative drawings showing a second embodiment of a two-surface drying device for drying the coating material applied on both surfaces of a plate according to the second principle.
Figure 31B:
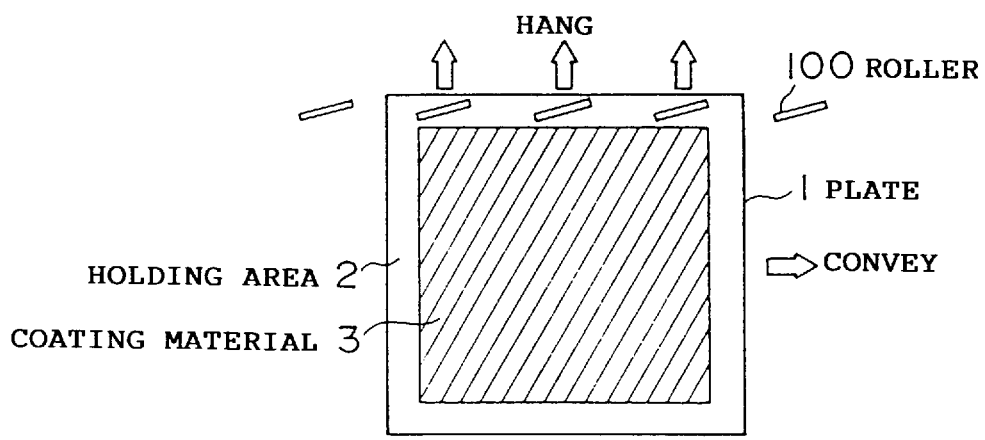
Figure 31C:
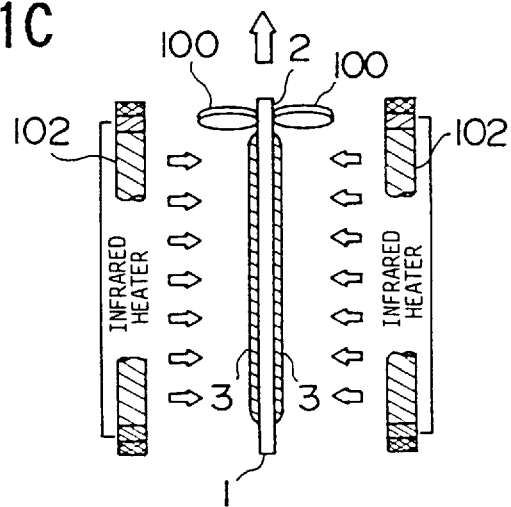

FIGS. 31A through 31C are illustrative drawings showing a second embodiment of a two-surface drying device for drying the coating material 3 applied on both surfaces of the plate 1 according to the second principle of the present invention. In the second embodiment of the second principle, the plate 1 is held in a vertical position, and a tension is applied by gravity in a direction perpendicular to the travel direction.

As shown in a plan view of FIG. 31B, the plate 1 is positioned in a vertical direction, and the holding area 2 thereof is held by the rollers 100 at a top end of the plate 1. The rollers 100 rotate as shown in FIG. 31A to convey the plate 1 in a direction shown by an arrow. As shown in FIG. 31B, the rollers 100 are arranged at an angle with the travel direction of the plate 1. Accordingly, rotation of the rollers 100 not only apply a force for conveying the plate 1 in the travel direction, but also apply a force for pulling up the plate 1 against gravity. While the plate 1 is in this positioning, as shown in FIG. 31C, the infrared heaters (drying means) 102 provided on the right and the left of the plate 1 illuminate infrared light onto both surfaces of the plate 1. This infrared light dries the coating material 3 applied to both surfaces of the plate 1.

In the second embodiment of the second principle, the plate 1 is conveyed in the travel direction, and, also, is pulled up so as not to fall, by the rollers 100 provided at an angle. In this configuration, a tension is applied to the plate 1 by gravity. Thus, when infrared light from the infrared heaters 102 dries the coating material 3, the plate 1 is free of bending caused by a difference in the thermal expansion coefficients.

Figure 32A:
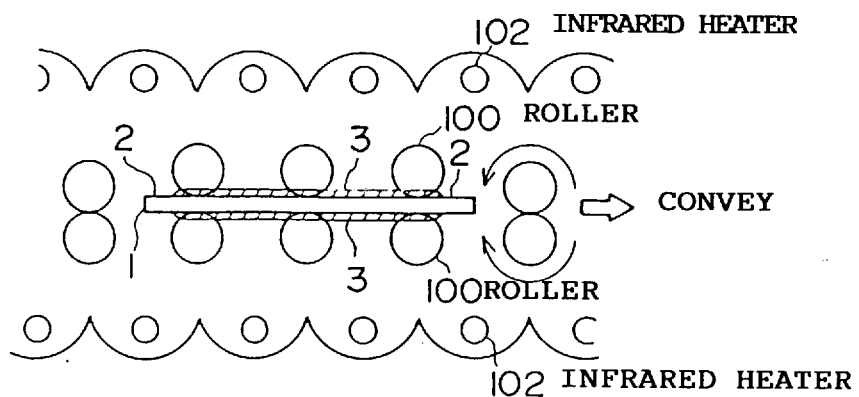
FIGS. 32A, 32B and 32C are illustrative drawings showing a third embodiment of a two-surface drying device for drying the coating material applied on both surfaces of a plate according to the second principle.
Figure 32B:
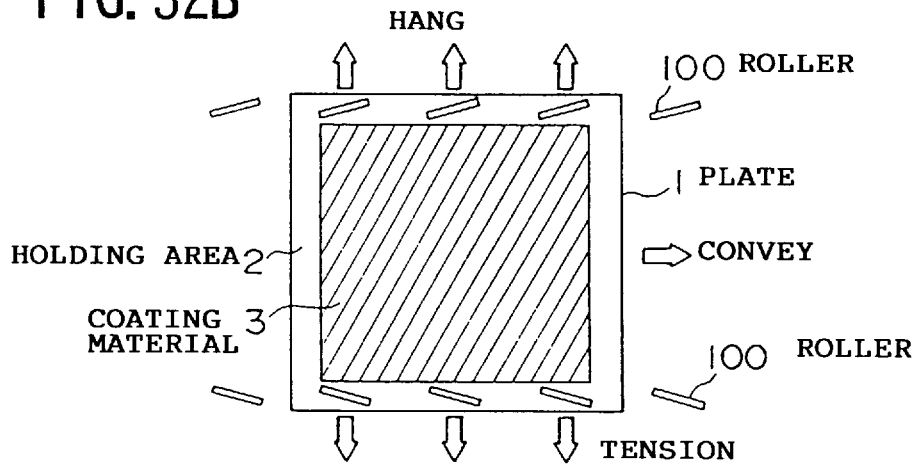
Figure 32C:
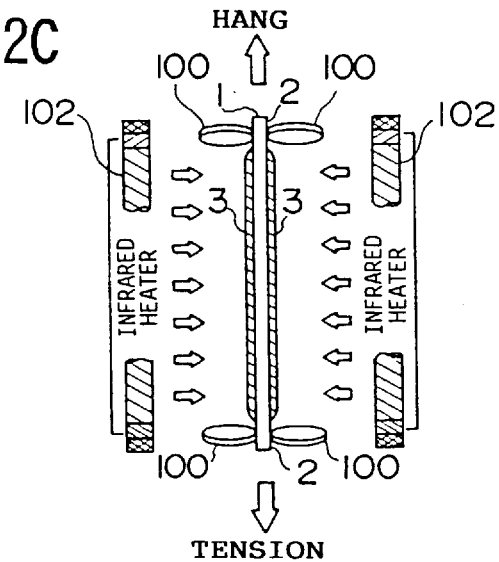

FIGS. 32A through 32C are illustrative drawings showing a third embodiment of a two-surface drying device for drying the coating material 3 applied on both surfaces of the plate 1 according to the second principle of the present invention. In the third embodiment of the second principle, the plate 1 is held in a vertical position, and a tension is applied in a direction perpendicular to the travel direction.

As shown in a plan view of FIG. 32B, the plate 1 is positioned in a vertical direction, and the holding area 2 thereof is held by the rollers 100 at upper and lower ends of the plate 1. The rollers 100 rotate as shown in FIG. 32A to convey the plate 1 in a direction shown by an arrow. As shown in FIG. 32B, the rollers 100 are arranged at an angle with the travel direction of the plate 1. Accordingly, rotation of the rollers 100 not only apply a force for conveying the plate 1 in the travel direction, but also apply a tension in a direction perpendicular to the travel direction. While the tension is applied to the plate 1 in this manner, as shown in FIG. 32C, infrared heaters (drying means) 102 provided on the right and left of the plate 1 illuminate infrared light onto both surfaces of the plate 1. This infrared light dries the coating material 3 applied to both surfaces of the plate 1.

In the third embodiment of the second principle, the plate 1 is conveyed in the travel direction, and, also, is stretched in the direction perpendicular to the travel direction by the rollers 100 provided at an angle. Thus, when infrared light from the infrared heaters 102 dries the coating material 3, the plate 1 is free of bending caused by a difference in the thermal expansion coefficients.

Figure 33:
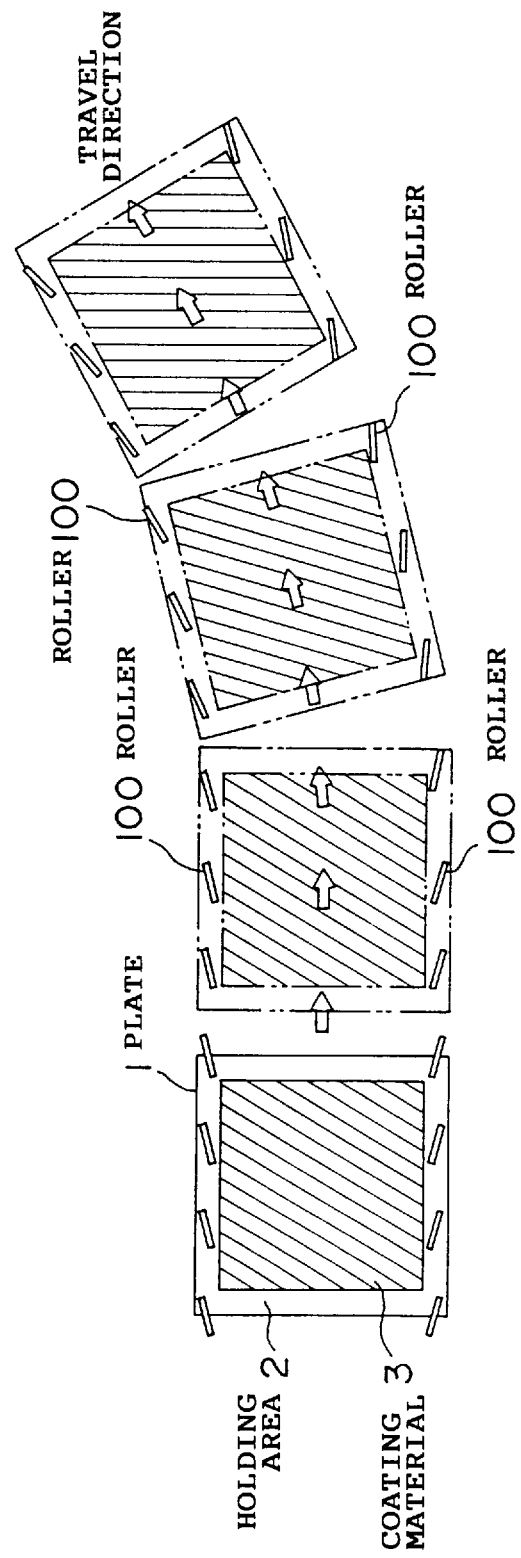
FIG. 33 is an illustrative drawing showing a fourth embodiment of a two-surface drying device for drying the coating material applied on both surfaces of a plate according to the second principle.

FIG. 33 is an illustrative drawing showing a fourth embodiment of a two-surface drying device for drying the coating material 3 applied on both surfaces of the plate 1 according to the second principle of the present invention. In the fourth embodiment of the second principle, the plate 1 can be conveyed in a desired direction when the coating material 3 is dried.

In the fourth embodiment shown in FIG. 33, the rollers 100 form pairs, wherein each one of the pairs is comprised of two rollers 100 located on the side ends of the plate 1 in a line perpendicular to the travel direction of the plate 1. Each of the pairs of the rollers 100 is arranged in a radial direction of a circle encompassing a given center point. Thus, the plate 1 is conveyed along a circumference encompassing the center point. In this configuration, the rollers 100 arranged outside the circumference are rotated at a faster rate than the rollers 100 arranged inside the circumference.

In the fourth embodiment of the second principle, a direction and a rotation rate of the rollers 100 are changed so as to convey the plate 1 in a desired direction when the coating material 3 is dried.

Figure 34A:
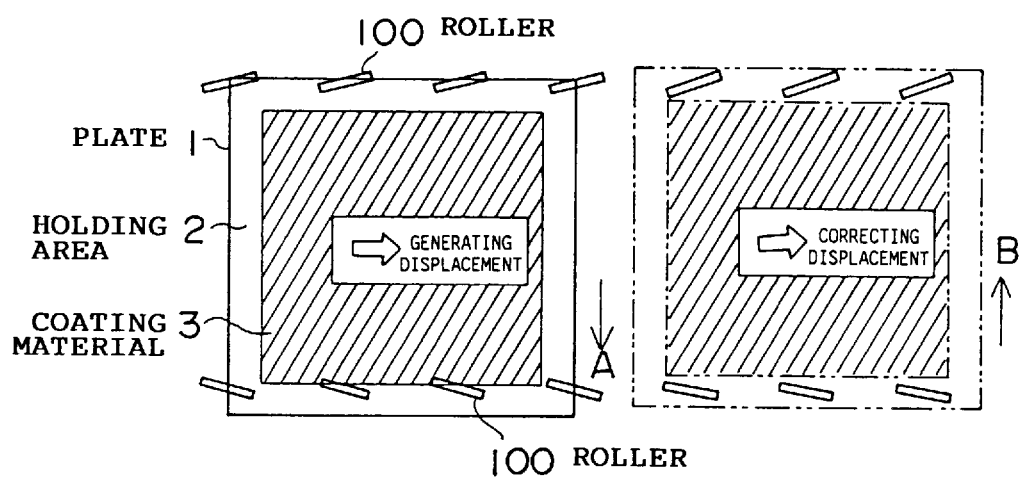
FIGS. 34A and 34B are illustrative drawings showing a fifth embodiment of a two-surface drying device for drying the coating material applied on both surfaces of a plate according to the second principle.
Figure 34B:
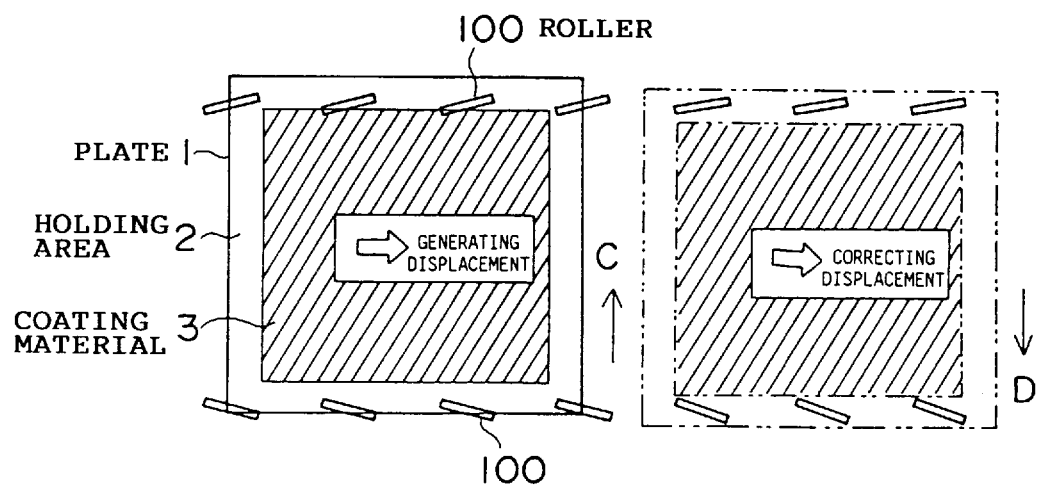

FIGS. 34A and 34B are illustrative drawings showing a fifth embodiment of a two-surface drying device for drying the coating material 3 applied on both surfaces of the plate 1 according to the second principle of the present invention. In the fifth embodiment of the second principle, a positional displacement of the plate 1 is corrected when the coating material 3 is dried.

As shown in FIG. 34A, errors in positions, angles, rotation rates, etc. of the rollers 100 cause a positional displacement of the plate 1 in a direction perpendicular to the travel direction. In FIG. 34A, the plate 1 on the left is displaced in a direction A. If the displacement exacerbates furthermore, the coating material 3 may touch the rollers 100. In order to avoid this, as shown in FIG. 34 on the right, angles of the rollers 100 are changed. In the figure, the rollers 100 arranged on a side opposite the direction A are diverted outside, so that a force for pulling the plate 1 in a direction B opposite the direction A is applied to the plate 1. Here, in order to assure that the diverted rollers 100 apply to the plate 1 the same amount of force as before in the travel direction, the rotation rate of the diverted rollers 100 must be increased.

As shown in FIG. 34B, when the plate 1 is displaced in a direction C, the rollers 100 arranged on a side opposite the direction C are diverted outside. Thus, a force for pulling the plate 1 in a direction D opposite the direction C is applied to the plate 1. In this manner, the positional displacement of the plate 1 is corrected. As in the same manner as in the example of FIG. 34A, the rotation rate of the diverted rollers 100 must be increased.

In the fifth embodiment of the second principle, an angle with respect to the travel direction and the rotation rate of the rollers 100 are changed to correct the positional displacement of the plate 1. Thus, when the plate 1 is conveyed before, during, or after the drying of the coating material 3, the rollers 100 can be prevented from touching and scraping the coating material 3 because of the positional displacement of the plate 1.

Figure 35A:
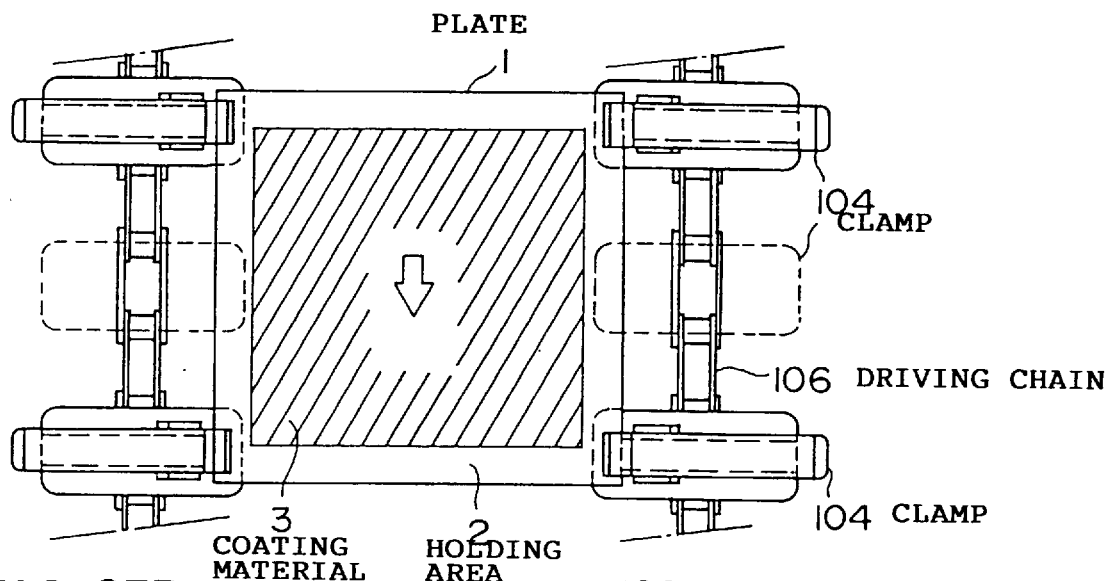
FIGS. 35A, 35B and 35C are illustrative drawings showing a sixth embodiment of a two-surface drying device for drying the coating material applied on both surfaces of a plate according to the second principle.
Figure 35B:
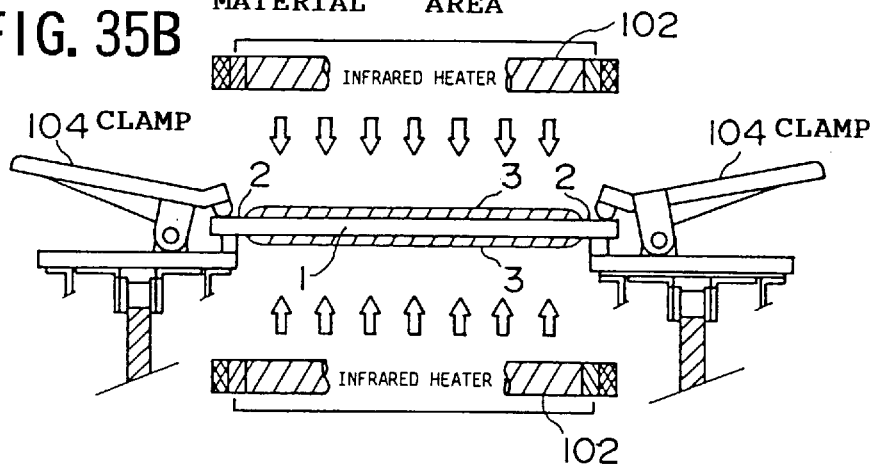
Figure 35C:
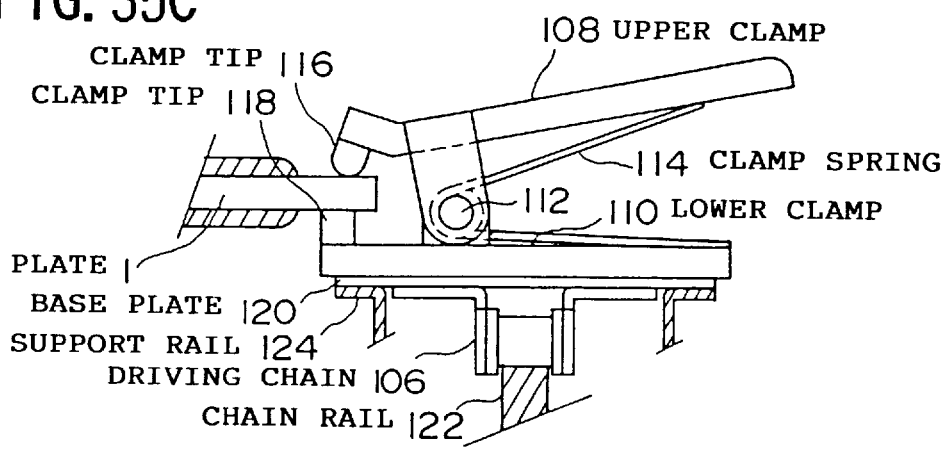

FIGS. 35A through 35C are illustrative drawings showing a sixth embodiment of a two-surface drying device for drying the coating material 3 applied on both surfaces of the plate 1 according to the second principle of the present invention. In the sixth embodiment of the second principle, the plate 1 is held in a horizontal direction by clamps, and is stretched in a direction perpendicular to the travel direction.

As shown in the plan view of FIG. 35A, clamps 104 provided on side ends of the plate 1 with respect to the travel direction hold the plate 1 by clamping the holding area 2 of the plate 1. The clamps 104 are attached to driving chains 106, which are driven to move the clamps 104 to convey the plate 1. In this configuration, as shown in FIG. 35B, the infrared heaters 102 provided over and under the plate 1 illuminate infrared light to dry the coating material 3.

FIG. 35C is an enlarged-side-elevation view of the clamp 104. As shown in the figure, the clamp 104 includes an upper clamp 108, a lower clamp 110, a clamp rod 112, and a clamp spring 114. The upper clamp 108 and the lower clamp 110 are rotatably attached with each other through the clamp rod 112. The clamp spring 114 is inserted between the upper clamp 108 and the lower clamp 110 by wrapping around the clamp rod 112, and applies outward forces to the upper clamp 108 and the lower clamp 110. By the force applied by the clamp spring 114, a clamp tip 116 of the upper clamp 108 and a clamp tip 118 of the lower clamp 110 clamp the plate 1 to hold it.

The lower clamp 110 is attached to the driving chain 106 via a base plate 120. The driving chain 106 fits to a chain rail 122 so as to move on the chain rail 122. In order to support the load of the plate 1 applied to the clamp 104, the base plate 120 attached to the lower clamp 110 is placed and moves on a support rail 124.

In the sixth embodiment of the second principle, the clamps 104 provided on side ends of the plate 1 with respect to the travel direction hold the plate 1 by clamping the holding area 2. In this configuration, a tension is applied to the plate 1 in a direction perpendicular to the travel direction by weight of the plate 1 itself. Thus, the plate 1 is stretched hard. Therefore, the plate 1 does not bend when the coating material 3 is dried by the infrared light from the infrared heaters 102. Also, the travel direction of the plate 1 can be freely changed by changing a driving direction of the driving chains 106, which is determined by an arrangement of the chain rail 122.

FIGS. 36A and 32B are illustrative drawings showing a seventh embodiment of a two-surface drying device for drying the coating material 3 applied on both surfaces of the plate 1 according to the second principle of the present invention. In the seventh embodiment of the second principle, the plate 1 is held in a vertical position by clamps, and a tension is applied in a direction perpendicular to the travel direction.

As shown in FIG. 36A, the clamps 104 provided on upper and lower sides of the plate 1 hold the plate 1 at the upper and lower ends of the plate 1. As shown in FIGS. 36A and 36B, the clamps 104 on the upper side are attached to hanger plates 130, which are in turn attached to a driving chain 132. The clamps 104 on the lower side are attached to tension plates 134, which are in turn attached to a guide chain 136. The driving chain 132 is movably fitted to and moves on a trolley rail 138. The guide chain 136 is movably fitted to and moves on a guide rail 140. In this configuration, the plate 1 is stretched in a vertical direction, and the infrared heaters 102 provided on both sides of the plate 1 dry the coating material 3.

In the seventh embodiment of the second principle, the clamps 104 provided on the upper and lower ends of the plate 1 clamp the holding area 2 of the plate 1 so as to hold the plate 1 with a tension being applied thereon in a vertical direction. While the plate 1 is stretched in the vertical direction, infrared light from the infrared heaters 102 dry the coating material 3, so that the plate 1 is free of bending. Also, the travel direction of the plate 1 can be freely changed by changing driving directions of the driving chain 132 and the guide chain 136, which are determined by arrangements of the trolley rail 138 and the guide rail 140.

FIGS. 37A through 37E are illustrative drawings showing an eighth embodiment of a two-surface drying device for drying the coating material 3 applied on both surfaces of the plate 1 according to the second principle of the present invention. The two-surface drying device of the eighth embodiment differs from those of the sixth and seventh embodiments in that the opening and closing operations of the clamps 104 are automatically controlled to clamp and release the plate 1 automatically. In FIGS. 37A through 37E, a mechanism of automatic clamping and releasing will be described by using the example of the sixth embodiment shown in FIG. 35. However, the same mechanism of automatic clamping and releasing can be used for the seventh embodiment of FIG. 36.

Figures 37A, 37B, 37C, 37D, 37E:
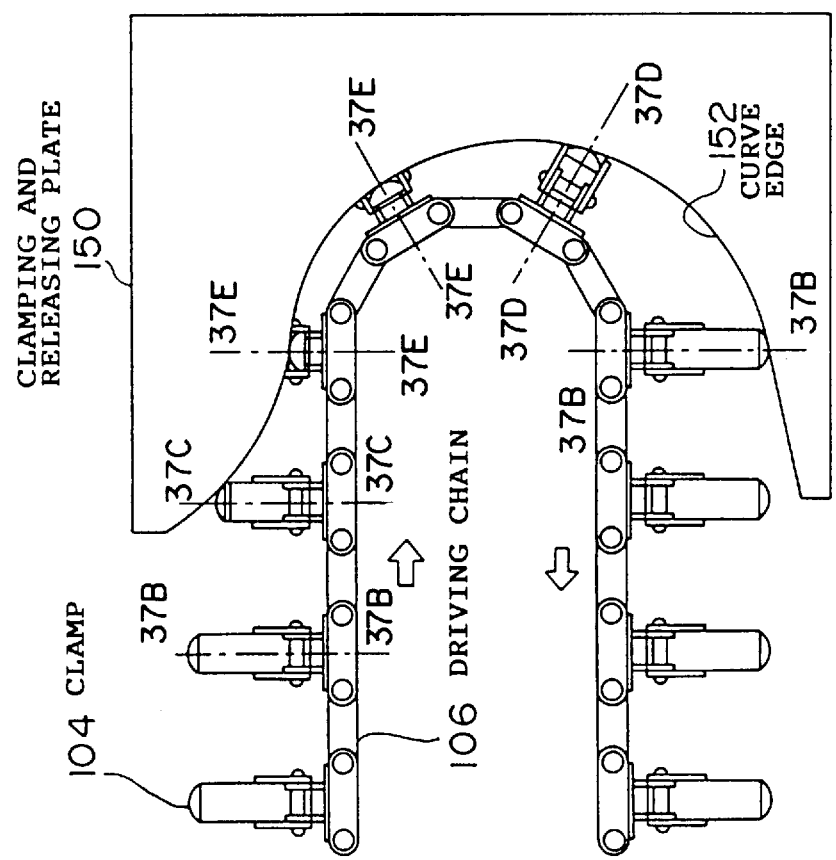
FIGS. 37A, 37B, 37C, 37D and 37E are illustrative drawings showing an eighth embodiment of a two-surface drying device for drying the coating material applied on both surfaces of a plate according to the second principle.

As shown in FIG. 37A, the clamps 104 are attached to the driving chain 106. FIG. 37A is a side elevated view, in which the driving chains 106 form a closed loop in a vertical plane, and are driven in a direction shown by arrows. A clamping and releasing plate 150 is provided at an end of the closed loop. The clamping and releasing plate 150 has a curve edge 152 as shown in the figure. When the driving chain 106 is driven in the direction shown by the arrows, the clamps 104 come in contact with the curve edge 152 so as to be pushed down.

FIGS. 37B through 37E are illustrative drawings showing the clamps 104 at locations shown by lines A–A' through D–D' in FIG. 37A. At a location of the line A–A' in FIG. 37A, the clamps 104 are completely closed as shown in FIG. 37B. When the clamps 104 driven by the driving chain 106 come to a location of the line C–C', the clamps 104 are pushed down by the curve edge 152 to be half closed as shown in FIG. 37D. Coming to a location of the line D–D', the clamps 104 are completely open as shown in FIG. 37E. Being driven by the driving chains 106, the clamps 104 come to a location of the line B–B', where the clamps 104 are gradually closed as shown in FIG. 37C.

In the eighth embodiment of the second principle, the clamps 104 touching the curve edge 152 of the clamping and releasing plate 150 are automatically opened or closed by the driving force of the driving chains 106. Thus, the automatic clamping and releasing of the plate 1 is achieved so as to enhance an efficiency in a process of drying the coating material 3.

FIGS. 38A through 38D are illustrative drawings showing a ninth embodiment of a two-surface drying device for drying the coating material 3 applied on both surfaces of the plate 1 according to the second principle of the present invention. The two-surface drying device of the ninth embodiment differs from those of the sixth and seventh embodiments in that the opening and closing operations of the clamps 104 are automatically controlled to clamp and release the plate 1 automatically. In FIGS. 38A through 38D, a mechanism of automatic clamping and releasing will be described by using the example of the sixth embodiment shown in FIG. 35. However, the same mechanism of automatic clamping and releasing can be used for the seventh embodiment of FIG. 36.

As shown in FIG. 38A, the clamps 104 are attached to the driving chain 106. FIG. 37A is a side elevated view, in which the driving chains 106 forms a closed loop in a vertical plane, and are driven in a direction shown by an arrow. A clamp opening and closing roller 154 is provided above an end of the closed loop. The clamp opening and closing roller 154 has a rotation axis 156 as shown in the figure. When the clamps 104 are driven by the driving chains 106 in the direction shown by the arrow to come in contact with the clamp opening and closing roller 154, the clamp opening and closing roller 154 rotates around the rotation axis 156 to push down the clamps 104.

FIGS. 38B through 38E are illustrative drawings showing the clamps 104 at locations shown by lines A–A' through C–C' in FIG. 38A. At a location of the line A–A' in FIG. 38A, the clamps 104 are completely closed as shown in FIG. 38B. When the clamps 104 driven by the driving chain 106 come to a location of the line C–C', the clamps 104 are pushed down by the clamp opening and closing roller 154 to be completely opened as shown in FIG. 38D. Coming to a location of the line B–B', the clamps 104 start closing to be half open as shown in FIG. 38C. Being driven by the driving chains 106 further, the clamps 104 are released from the clamp opening and closing roller 154 to be closed as in the original state.

In the ninth embodiment of the second principle, the clamps 104 touching the clamp opening and closing roller 154 are automatically opened or closed by the driving force of the driving chains 106. Since the clamp opening and closing roller 154 rotates around the rotation axis 156, the automatic clamping and releasing of the clamps 104 can be carried out by a relatively small force. Thus, the automatic clamping and releasing of the plate 1 are readily achieved so as to enhance an efficiency in a process of drying the coating material 3.

Figure 39A:
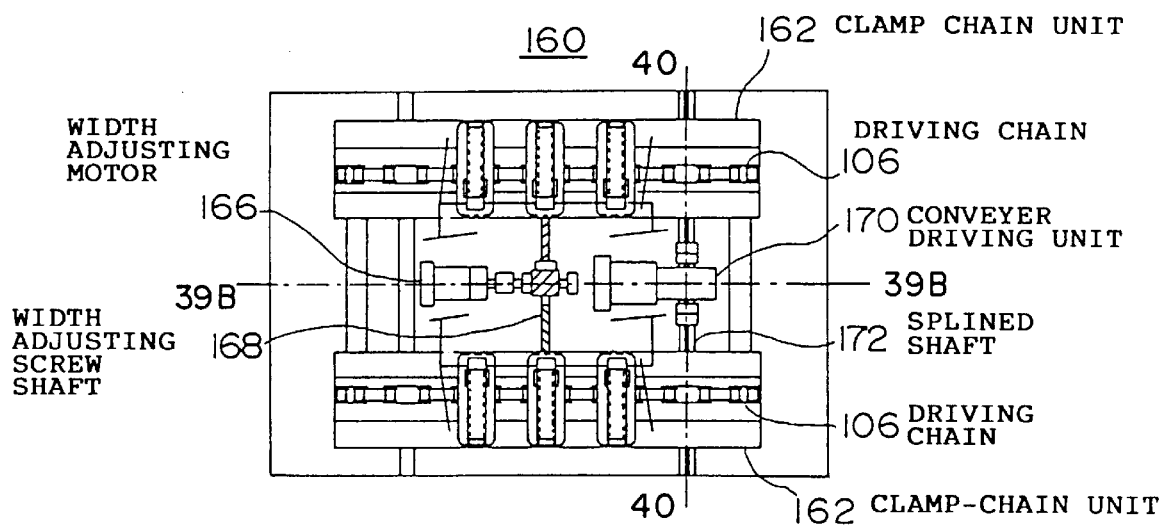
FIG. 39A is a plan view of a conveying unit of a two-surface drying device according to a tenth embodiment of the second principle.
Figure 39B:
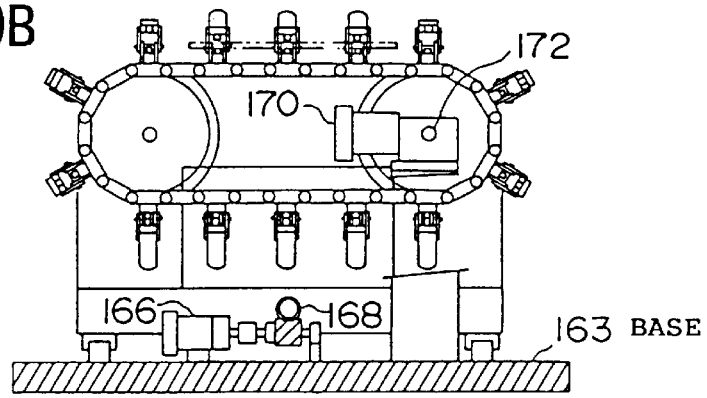
FIG. 39B is a cross-sectional view of the conveying unit taken along a line X–X' of FIG. 39A.
Figure 40:
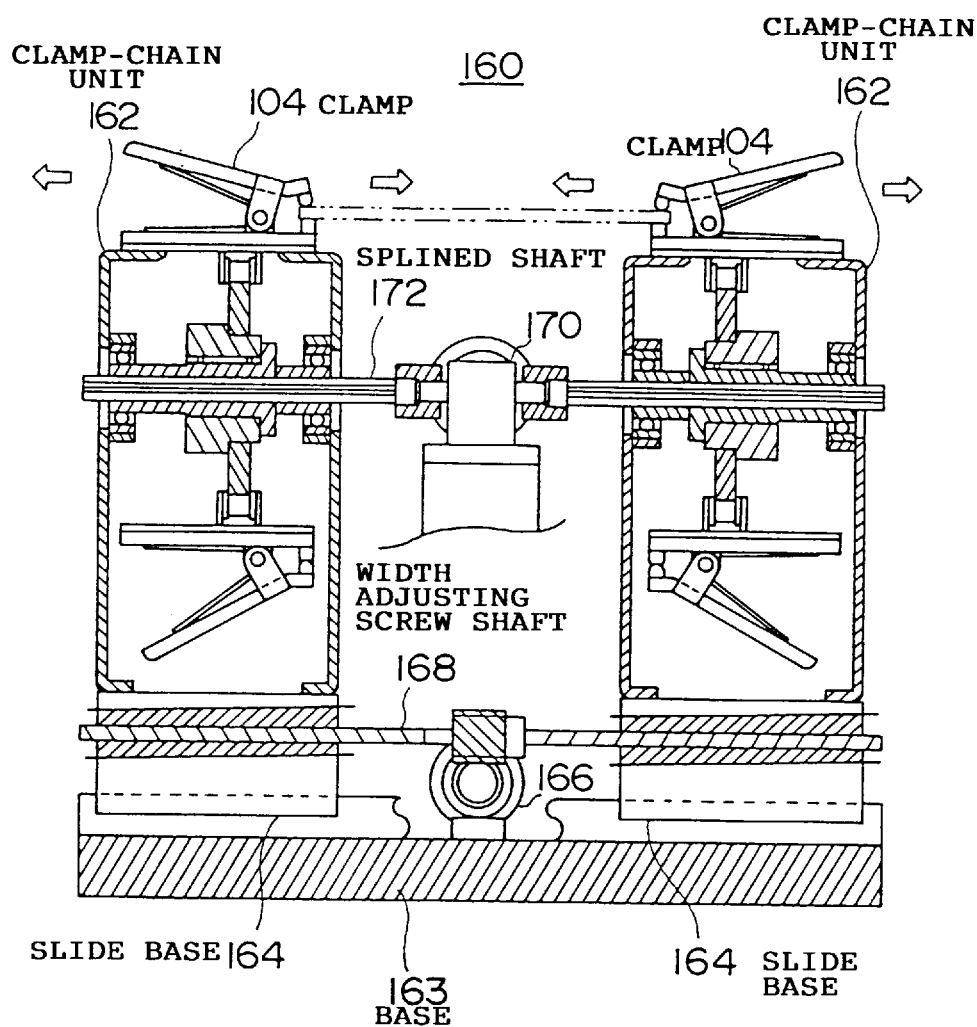
FIG. 40 is a cross-sectional view of the conveying unit taken along a line Y–Y' of FIG. 39A.

FIGS. 39A and 39B and FIG. 40 are illustrative drawings showing a tenth embodiment of a two-surface drying device for drying the coating material 3 applied on both surfaces of the plate 1 according to the second principle of the present invention. The tenth embodiment of the second principle differs from the sixth embodiment in that a distance between the two lines of the clamps 104 can be freely adjusted.

FIG. 39A is a plan view of a conveying unit 160 of a two-surface drying device according to the tenth embodiment of the second principle. FIG. 39B is a cross-sectional view of the conveying unit 160 taken along a line X–X' of FIG. 39A. FIG. 40 is a cross-sectional view of the conveying unit 160 taken along a line Y–Y' of FIG. 39A.

The conveying unit 160 includes two clamp-chain units 162, each of which is placed on a slide base 164 provided on a base 163. The conveying unit 160 further includes a width adjusting motor 166, a width adjusting screw shaft 168, a conveyer driving unit 170, and a splined shaft 172. The conveyer driving unit 170 rotates the splined shaft 172 so as to drive the driving chains 106 contained in the clamp-chain units 162.

The width adjusting motor 166 rotates the width adjusting screw shaft 168 so as to move the clamp-chain units 162 on the slide base 164. In this manner, a distance between the clamp-chain units 162 can be adjusted.

In the tenth embodiment of the second principle, the width adjusting screw shaft 168 is rotated to adjust the distance between the two clamp-chain units 162, so that the distance between the two lines of the clamps 104 can be adjusted. Thus, the conveying unit 160 can handle not only the plate 1 of a regular size but also the plate 1 of any size.

Figure 41A:
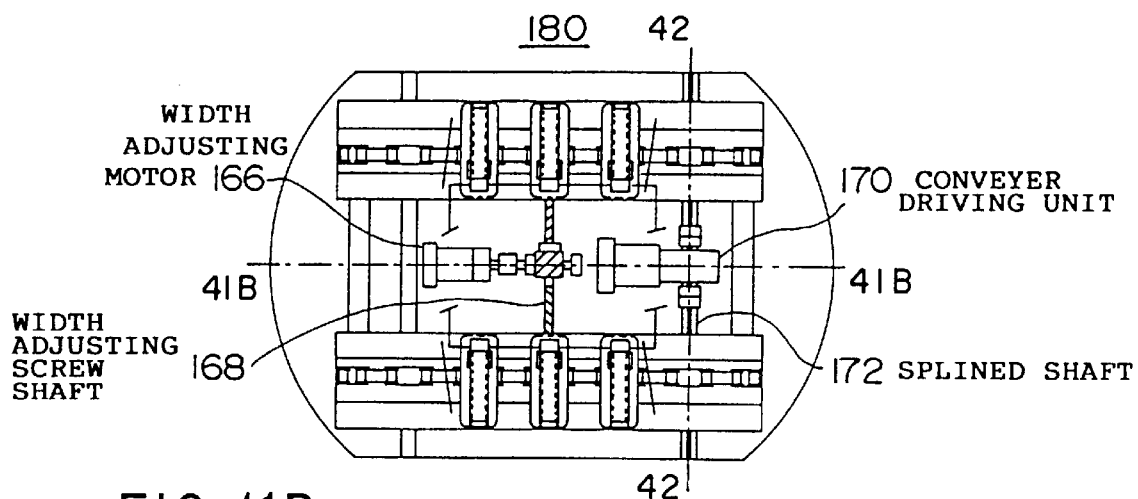
FIG. 41A is a plan view of a conveying unit of a two-surface drying device according to an eleventh embodiment of the second principle.
Figure 41B:
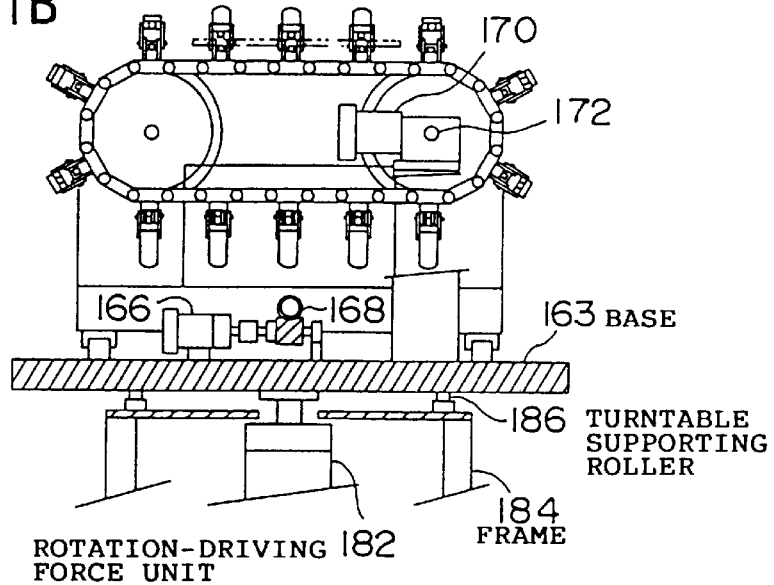
FIG. 41B is a cross-sectional view of the conveying unit taken along a line X–X' of FIG. 41A.
Figure 42:
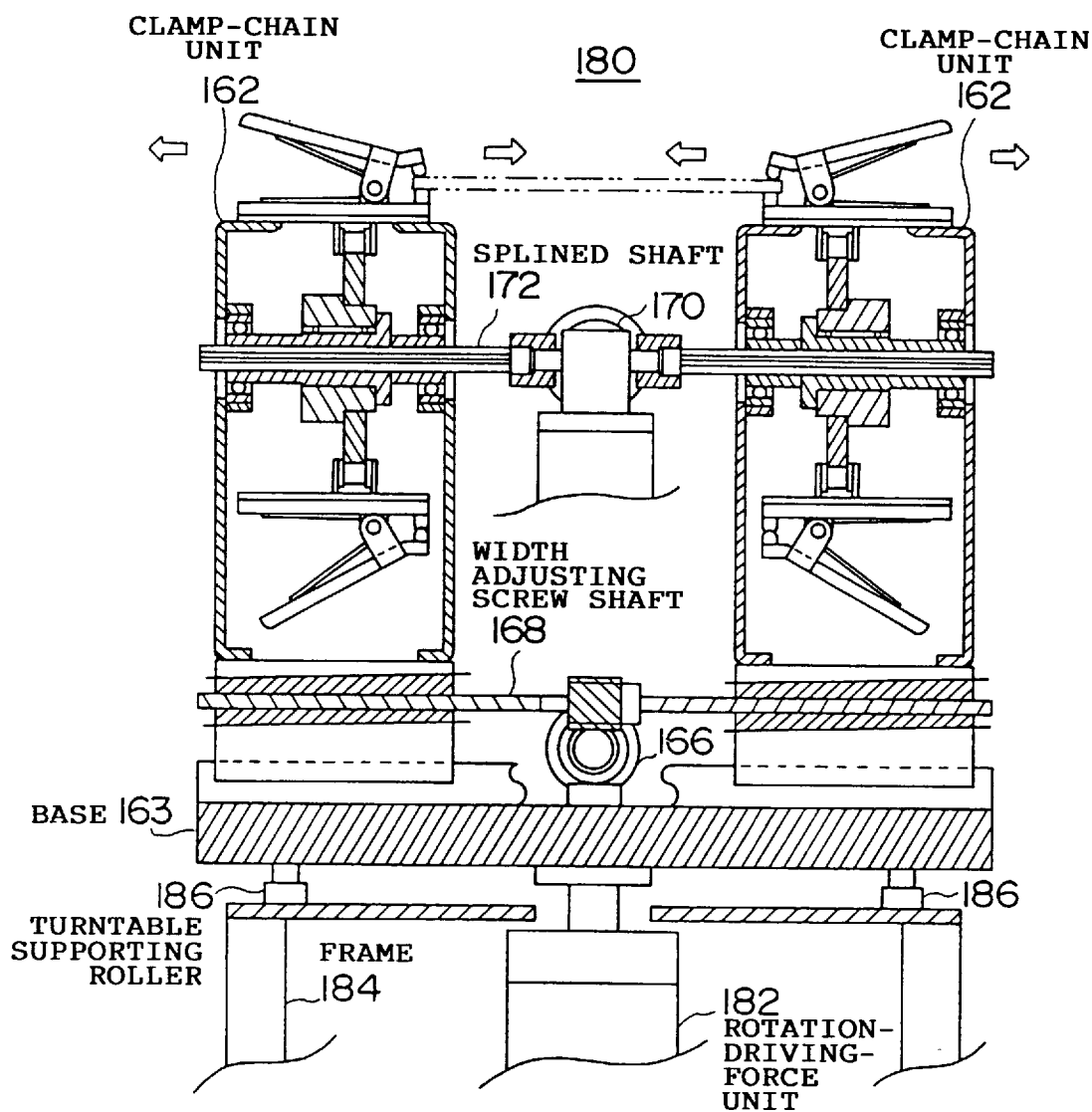
FIG. 42 is a cross-sectional view of the conveying unit taken along a line Y–Y' of FIG. 41A.

FIGS. 41A and 41B and FIG. 42 are illustrative drawings showing an eleventh embodiment of a two-surface drying device for drying the coating material 3 applied on both surfaces of the plate 1 according to the second principle of the present invention. In the eleventh embodiment of the second principle, the travel direction of the plate 1 in the tenth embodiment can be changed to a desired direction.

FIG. 41A is a plan view of a conveying unit 180 of a two-surface drying device according to the eleventh embodiment of the second principle. FIG. 41B is a cross-sectional view of the conveying unit 180 taken along a line X–X' of FIG. 41A. FIG. 42 is a cross-sectional view of the conveying unit 180 taken along a line Y–Y' of FIG. 41A.

The conveying unit 180 of the eleventh embodiment includes the conveying unit 160 of the tenth embodiment, a rotation-driving-force unit 182, a frame 184, and a turntable supporting roller 186. In order to assure that the device placed on the base 163 is supported steadily and is rotated smoothly, the turntable supporting roller 186 is provided between the frame 184 and the base 163.

In the eleventh embodiment of the second principle, not only can the distance between the two lines of the clamps 104 be changed by changing the distance between the two clamp-chain units 162, but also the travel direction of the plate 1 can be changed. Thus, the conveying unit 180 can handle the plate 1 of various sizes, and can cope with various installing and operating situations of the two-surface drying device.

Figure 43A:
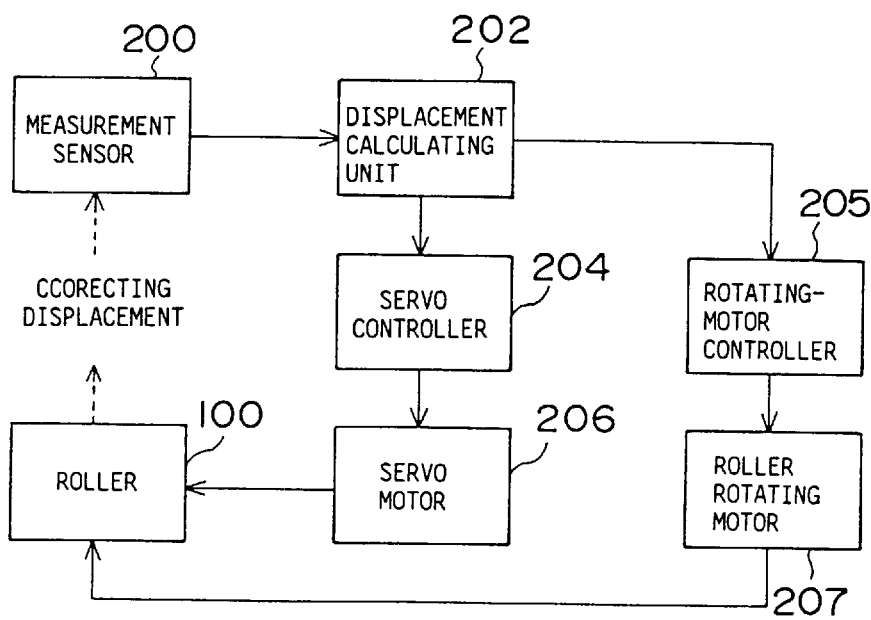
FIGS. 43A, 43B and 43C are illustrative drawings showing a twelfth embodiment of a two-surface drying device for drying the coating material applied on both surfaces of a plate according to the second principle.
Figure 43B:
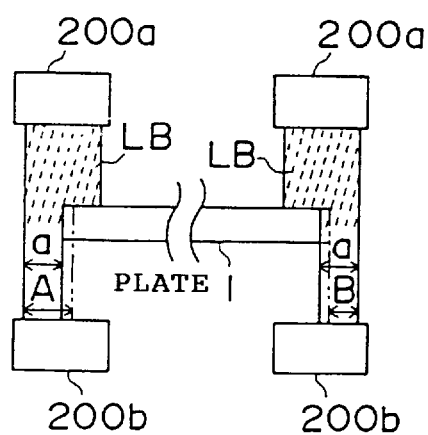
Figure 43C:
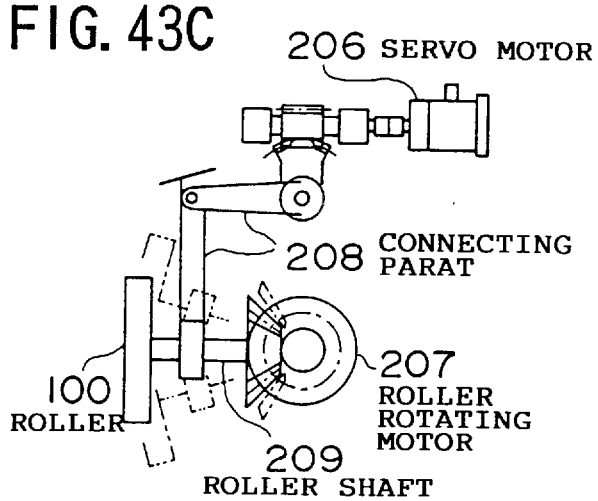

FIGS. 43A through 43C are illustrative drawings showing a twelfth embodiment of a two-surface drying device for drying the coating material 3 applied on both surfaces of the plate 1 according to the second principle of the present invention. The twelfth embodiment of the second principle differs from the fifth embodiment in that a controlling mechanism for correcting a positional displacement is provided.

FIG. 43A is a block diagram of the mechanism for correcting a positional displacement. As shown in the figure, the mechanism for correcting a positional displacement includes a measurement sensor 200, a displacement calculating unit 202, a servo controller 204, a rotating-motor controller 205, a servo motor 206, a roller rotating motor 207, and the rollers 100 (see FIG. 8).

FIG. 43B shows an example of the measurement sensor 200, wherein the measurement sensor 200 includes laser transmitters 200*a* and laser receivers 200*b*. Laser beams LB emitted from the laser transmitters 200*a* reach the laser receivers 200*b* while partially obstructed by the plate 1. A comparison of laser intensities received by each of the laser receivers 200*b* enables a determination on whether a position of the plate 1 is displaced. For example, assume that the measurement sensor 200 is set such that each of the laser receivers 200*b* receives a laser beam having a width a. When a position of the plate 1 is displaced, the two laser receivers 200*b* receive a laser beam having a width A and a laser beam having a width B. In this case, $$(A-B)/2 \tag{1}$$

is a displacement of the plate 1. Thus, provided that output intensities of the laser receivers 200*b* are proportional to the width of the received laser beam, it is easy to calculate the amount of a displacement of the plate 1 based on a difference in the output intensities of the laser receivers 200*b*. Even if the output intensities of the laser receivers 200*b* are not in proportion to the width of the received laser beam, the amount of the displacement can be determined based on a difference in the output intensities when a quantitative relation between the output intensity and the width of the received laser beam is known.

The displacement calculating unit 202 of FIG. 43A calculates the amount of a displacement based on the difference in the output intensities of the laser receivers 200*b*. Also, the displacement calculating unit 202 calculates an angle and a rotation rate of the rollers 100, which are required for correcting the displacement. Here, provided that the travel speed of the plate 1 is constant, the rotation rate of the rollers 100 has a one-to-one relationship with the angle of the rollers 100. Namely, an angle Θ of the rollers 100 with respect to the travel direction, a rotation rate r when the angle is zero, and a rotation rate r(Θ) when the angle is Θ are related as:

$$r(\Theta)=r/\cos\Theta. \tag{2}$$

The angle and the rotation rate which are required for correcting the displacement and calculated by the displacement calculating unit 202 are supplied to the servo controller 204 and the rotating-motor controller 205, respectively. Based on the supplied values, the servo controller 204 and the rotating-motor controller 205 control the servo motor 206 and the roller rotating motor 207, respectively, to set the angle and the rotation rate of the rollers 100.

FIG. 43C shows a mechanism through which the servo motor 206 changes the angle of the rollers 100. As shown in FIG. 43C, the servo motor 206 is connected to a roller shaft 209 via connecting parts 208. The servo motor 206 is controlled by the servo controller 204, and a driving force of the servo motor 206 is conveyed to the roller shaft 209 via the connecting parts 208. As shown in FIG. 43C, the roller shaft 209 is pivoted around the roller rotating motor 207 to change the angle of the rollers 100.

In the twelfth embodiment of the second principle, the displacement calculating unit 202 calculates the displacement of the plate 1 based on data provided from the measurement sensor 200, and the angle and the rotation rate of the rollers 100 are adjusted so as to correct the displacement. Thus, during a process of drying the coating material 3 or before or after the process, the rollers 100 are automatically prevented from touching the coating material 3 because of the displacement of the plate 1.

Figure 44:
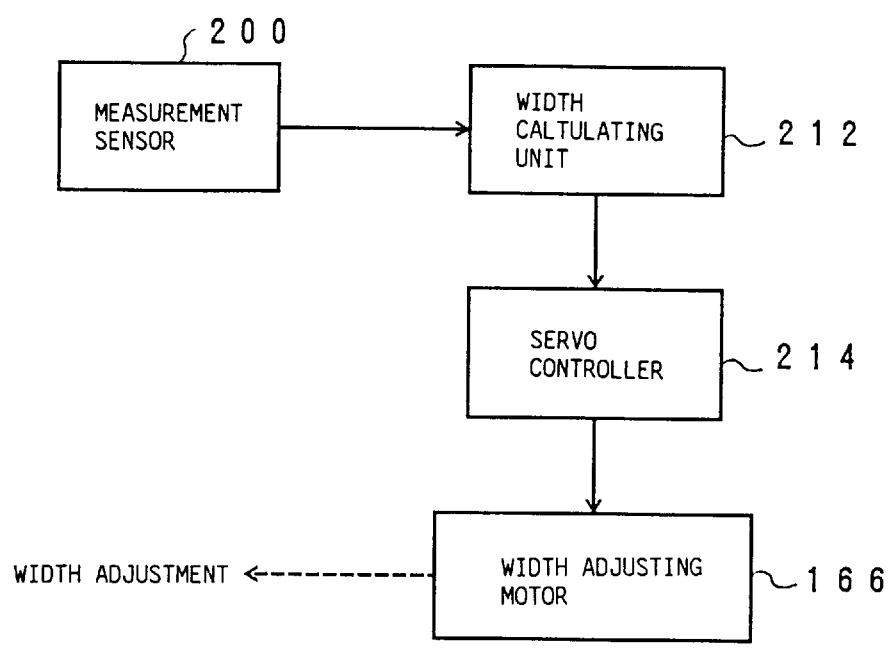
FIG. 44 is an illustrative drawing showing a thirteenth embodiment of a two-surface drying device for drying the coating material applied on both surfaces of a plate according to the second principle.

FIG. 44 is an illustrative drawing showing a thirteenth embodiment of a two-surface drying device for drying the coating material 3 applied on both surfaces of the plate 1 according to the second principle of the present invention. The thirteenth embodiment of the second principle differs from the tenth or eleventh embodiment in that a control mechanism is provided to automatically adjust a distance between the two lines of the clamps 104, based on a width of the plate 1 which is measured in advance.

FIG. 44 is a block diagram of the mechanism for adjusting a width. As shown in figure, the mechanism for adjusting a width includes the measurement sensor 200, a width calculating unit 212, a servo controller 214, and the width adjusting motor 166. In the thirteenth embodiment, the plate 1 to which the coating material 3 is not yet applied is set in the conveying unit 160 or 180 of the two-surface drying device, and a width of the plate 1 is measured by the measurement sensor 200.

The measurement sensor 200 is identical to that of FIG. 43B, and includes the two laser transmitters 200*a* and the two laser receivers 200*b*. The measurement sensor 200 supplies to the width calculating unit 212 the outputs of the laser receivers 200*b* obtained for the plate 1 which has been set in the device. The width calculating unit 212 calculates the width of the plate 1 based on the outputs, and, then, calculates a distance between the two clamp-chain units 162 which is appropriate for the width of the plate 1. A calculated distance between the two clamp-chain units 162 is supplied to the servo controller 214. Based on the calculated distance, the servo controller 214 controls the width adjusting motor 166 to set the distance between the two clamp-chain units 162 to an appropriate amount.

In the thirteenth embodiment of the second principle, the displacement calculating unit 202 calculates the width of the plate 1 based on data provided from the measurement sensor 200, and the distance between the two clamp-chain units 162 is set to an appropriate value. Thus, not only can the plate 1 of a regular size be handled, but also the plate 1 of various sizes can be automatically handled.

According to the present invention, the holding area is provided on the plate having two surfaces to which the coating material is applied, so that the plate can be conveyed by holding the holding area without touching the coating material. Thus, coated surfaces of a better condition are obtained, and, also, the plate can be automatically conveyed. Therefore, the automation of the manufacturing line is achieved to enhance the productivity.

Also, according to the present invention, the applying roll having a width narrower than the width of the plate is used for applying the coating material to the plate, so that the holding area is formed on both side ends of the plate. Then, the conveying rolls hold the holding area to carry the plate without touching the coating material. Thus, the coated surfaces of a better condition are obtained, and, also, the automation of the manufacturing line is achieved to enhance the productivity.

Also, according to the present invention, the contact of the applying roll with the plate is controlled according to the travel of the plate so as to form the holding area at the front and rear ends of the plate. Thus, the coated surfaces of a better condition are obtained, and, also, the automation of the manufacturing line is achieved to enhance the productivity.

Also, according to the present invention, the thickness of the applied coating material is measured by the thickness sensor, the correction amount is calculated based on the measured thickness, and the amount of the coating material applied to the plate is controlled based on the correction amount. Thus, the thickness of the coating material on the plate is automatically controlled in a continuous manner, so that a desired thickness is stably obtained. Also, the continuous and automatic control enhances the productivity, and provides a stable sensitivity for the photosensitizer.

Furthermore, according to the present invention, the plate is conveyed while being stretched in a direction perpendicular to the travel direction, and the coating material applied to both surfaces of the plate is dried from both sides. Thus, even if the plate is thin, the plate is free of bending in a process of drying the coating material.

Furthermore, according to the present invention, the holding area of the plate is held at side ends with respect to the travel direction thereof by the rollers outwardly diverted with respect to the travel direction, so that the plate is conveyed while being stretched in a direction perpendicular to the travel direction. Thus, even if the plate is thin, the plate is free of bending in a process of drying the coating material.

Furthermore, according to the present invention, the plate is hung by the rollers which are directed upward and hold the top end of the holding area, wherein rotation of the rollers conveys the plate. Since the rollers are directed upward, the plate does not fall off from the rollers. Also, a tension is applied to the plate by gravity, so that the plate does not bend when the coating material is dried.

Furthermore, according to the present invention, the plate is hung by the upwardly directed rollers holding the top end of the holding area, and is held by the downwardly directed rollers holding the bottom end of the holding area. Rotation of the rollers conveys the plate while applying a tension to the plate in a vertical direction. Thus, even if the plate is thin, the plate is free of bending in a process of drying the coating material.

Furthermore, according to the present invention, the holding area of the plate is clamped at side ends with respect to the travel direction by a clamping mechanism, which is moved by the conveyer to convey the plate while stretching the plate in a direction perpendicular to the travel direction. Thus, even if the plate is thin, the plate is free of bending in a process of drying the coating material.

Furthermore, according to the present invention, the holding area of the plate is clamped at the top end by a first clamping mechanism, and is clamped at the bottom end by a second clamping mechanism, which mechanisms are moved by the conveyer to convey the plate while stretching the plate in a vertical direction. Thus, even if the plate is thin, the plate is free of bending in a process of drying the coating material.

Further, the present invention is not limited to these embodiments, but various variations and modifications may be made without departing from the scope of the present invention.

What is claimed is:

1. A method of applying a coating material to two surfaces of a plate, said method comprising the steps of:

a) conveying said plate lying along a horizontal plane in a horizontal direction by rotating conveying rollers clamping side ends of said plate with respect to a travel direction of said plate, said conveying rollers being arranged along a travel path of said plate and said conveying rollers being outwardly directed to pull said plate from both sides thereof, thereby preventing said plate from bending from its own weight; and b) applying said coating material to said two surfaces simultaneously while in the horizontal plane such that holding areas having no coating material are provided on said two surfaces at said side ends of said plate, said coating material applied to said plate by using two applying rolls between which said plate is inserted, said applying rolls having a width narrower than a width of said plate.

2. The method as claimed in claim 1, further comprising the steps of:

c) continuously measuring, in a non-contacting manner, a thickness of said coating material applied to said plate; and d) adjusting an amount of said coating material applied to said plate according to said thickness.

3. The method as claimed in claim 2, wherein said step c) comprises a step of measuring said thickness of said coating material by using light.

* * * * *